United States Patent
Lee et al.

(10) Patent No.: US 8,134,195 B2
(45) Date of Patent: Mar. 13, 2012

(54) SEMICONDUCTOR DEVICE AND METHOD OF FABRICATING THE SAME

(75) Inventors: Kee-Jeung Lee, Icheon-si (KR); Jae-Sung Roh, Icheon-si (KR); Deok-Sin Kil, Icheon-si (KR); Young-Dae Kim, Icheon-si (KR); Jin-Hyock Kim, Icheon-si (KR); Kwan-Woo Do, Icheon-si (KR); Kyung-Woong Park, Icheon-si (KR); Jeong-Yeop Lee, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 460 days.

(21) Appl. No.: 12/346,522

(22) Filed: Dec. 30, 2008

(65) Prior Publication Data

US 2010/0012989 A1    Jan. 21, 2010

(30) Foreign Application Priority Data

Jul. 18, 2008    (KR) .................. 10-2008-0069924

(51) Int. Cl.
*H01L 27/108* (2006.01)
(52) U.S. Cl. .. 257/304; 257/305; 257/308; 257/E21.646
(58) Field of Classification Search .................. 257/296, 257/304, 305, 308, E21.646
See application file for complete search history.

(56) References Cited

U.S. PATENT DOCUMENTS

| | | | |
|---|---|---|---|
| 7,727,837 B2 * | 6/2010 | Gruening-von Schwerin et al. | 438/253 |
| 2005/0158949 A1 * | 7/2005 | Manning | 438/253 |
| 2006/0046382 A1 | 3/2006 | Yoon et al. | |

FOREIGN PATENT DOCUMENTS

| | | |
|---|---|---|
| CN | 1469457 | 1/2004 |
| CN | 101097852 | 1/2008 |
| KR | 10-2004-0072086 | 8/2004 |
| KR | 100457161 | 11/2004 |
| KR | 10-0532202 | 11/2005 |
| KR | 100532202 B1 * | 11/2005 |
| KR | 1020070076929 | 7/2007 |

OTHER PUBLICATIONS

Chinese Patent Certificate and Publication for Granted Chinese invention 101630661 dated Jul. 13, 2011.
Korean Office Action for application No. 10-2008-0069924, Sep. 3, 2010.

* cited by examiner

*Primary Examiner* — Evan Pert
*Assistant Examiner* — Scott R Wilson
(74) *Attorney, Agent, or Firm* — Lowe Hauptman Ham & Berner, LLP

(57) ABSTRACT

A semiconductor device, and a method of fabricating the semiconductor device, which is able to prevent a leaning phenomenon from occurring between the adjacent storage nodes. The method includes forming a plurality of multi-layered pillar type storage nodes each of which is buried in a plurality of mold layers, wherein the uppermost layers of the multi-layered pillar type storage nodes are fixed by a support layer, etching a portion of the support layer to form an opening, and supplying an etch solution through the opening to remove the multiple mold layers. A process of depositing and etching the mold layer by performing the process 2 or more times to form the multi-layered pillar type storage node. Thus, the desired capacitance is sufficiently secured and the leaning phenomenon is avoided between adjacent storage nodes.

36 Claims, 46 Drawing Sheets

SEMICONDUCTOR DEVICE AND METHOD OF FABRICATING THE SAME

CROSS-REFERENCE TO RELATED APPLICATIONS

The present application claims priority of Korean patent application number 10-2008-0069924, filed on Jul. 18, 2008, which is incorporated herein by reference in its entirety.

BACKGROUND

The present disclosure relates to a method of fabricating a semiconductor device, and more particularly, to a semiconductor device including a multi-layered, pillar type storage node and a method of fabricating the semiconductor device.

Recently, as memory devices have been highly integrated by a miniaturized semiconductor processing technology, which is rapidly developing, an area of a unit cell is significantly decreased and low voltage is used as an operating voltage. However, although the cell area has been decreasing, it is beneficial to keep the required charge capacitance in the operation of the memory device larger than 25 fF/cell to prevent the shortening of a refresh time and the generation of a soft error.

Under these circumstances, a metal insulator metal (MIM) type capacitor employing a high-k dielectric layer to secure charge capacitance required in the next generation DRAM devices is being developed. Such a capacitor uses TiN or Ru to form a storage node. Furthermore, in a semiconductor DRAM product line employing a metallization technology of less than 50 nm, an effective cell area is substantially reduced, a capacitor of the cell is formed with a storage node structure having a shape such as a circle, an ellipse or oval, or a pillar.

However, when increasing a height of the storage node having a pillar shape to obtain much higher charge capacitance, a leaning phenomenon occurs between adjacent storage nodes as illustrated in FIG. 1 and thus an electrical defect may occur.

FIG. 1 is an image showing a leaning phenomenon of a storage node in the prior art. Referring to FIG. 1, there is a bridge between adjacent storage nodes since storage nodes are leaned towards each other or even together such that they are touching.

SUMMARY

In one or more embodiments a semiconductor device is capable of preventing a leaning phenomenon from occurring between adjacent storage nodes, and one or more embodiments are a method of fabricating the semiconductor device.

Furthermore, in one or more embodiments, a semiconductor device including a pillar type storage node is capable of securing great charge capacitance even when a height of the pillar is increased, and one or more embodiments are a method of fabricating the semiconductor device.

One or more embodiments include a semiconductor device, which includes a plurality of multi-layered pillar type storage nodes, a support layer supporting each of the storage nodes and partially providing openings to regions between the storage nodes, wherein the support layer has an integral structure, a dielectric layer covering the storage nodes and the support layer; and a plate electrode formed over the dielectric layer.

In one or more embodiments, a method of fabricating a semiconductor device includes forming a plurality of multi-layered pillar type storage nodes each of which is buried in a plurality of mold layers, wherein the uppermost layers of the multi-layered pillar type storage nodes are fixed by a support layer, etching a portion of the support layer to form an opening; and supplying an etch solution through the opening to remove the multiple mold layers.

In one or more embodiments, a method of fabricating a semiconductor device includes forming a first mold layer over a substrate, etching the first mold layer to form a first open region, forming a first pillar type storage node buried in the first open region, forming a support layer including an opening over the first mold layer and the first pillar type storage node, wherein the opening acts as a path through which an etch solution infiltrates, forming a second mold layer over the support layer etching the second mold layer and the support layer to form a second open region exposing a top surface of the first pillar type storage node, forming a second pillar type storage node buried in the second open region; and supplying an etch solution to remove the first and the second mold layers.

BRIEF DESCRIPTION OF THE DRAWINGS

Various embodiments are illustrated by way of example, and not by limitation, in the figures of the accompanying drawings.

DESCRIPTION OF EMBODIMENTS

Figure 1:
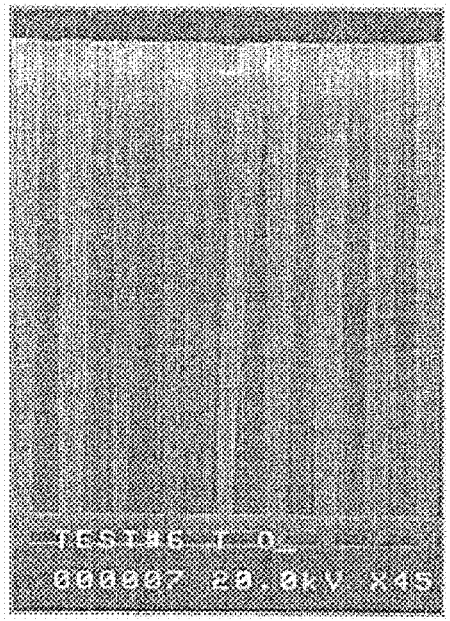
FIG. 1 is an image showing a leaning phenomenon of a storage node in the prior art.
Figure 1:
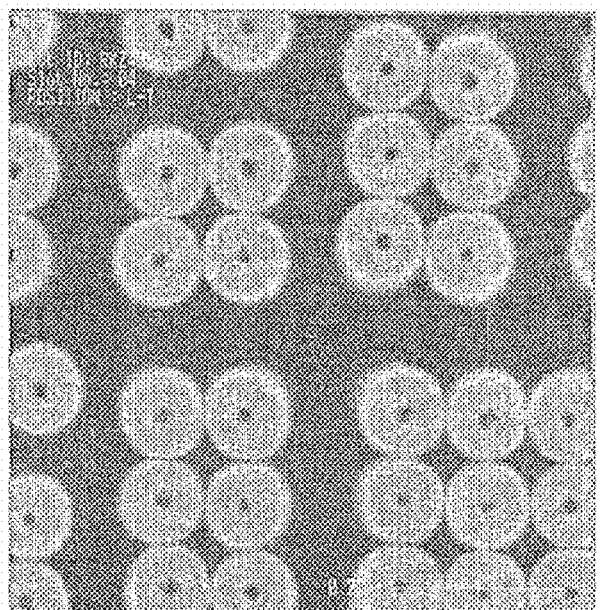

Other objects and advantages of one or more embodiments can be understood by the following description, and become apparent with reference to the one or more embodiments. In the figures, the dimensions of layers and regions are exaggerated for clarity of illustration. Similar to reference numerals referring to like elements, it will, also, be understood that when a layer, a film, a region, or a plate is referred to as being 'on' another one, it can be directly on the other one. Or, it can, also be on one or more intervening layers, films, and regions. But, plates may also be present.

One or more embodiments employ a support layer to prevent a storage node from being leaned in a wet dip out process. In one or more embodiments, the storage node has a pillar type structure and the pillar type storage node is stacked two or more times. In order to form the multi-layered, pillar type storage node, a process of depositing and etching a mold layer is repeatedly performed two or more times. By depositing and etching the mold layer more than twice, a defect such as 'not-open' that may occur from etching the molding layer all at once can be prevented. Moreover, by employing the pillar type storage node, it is possible to secure a sufficient interval between adjacent storage nodes compared to the cylinder or concave type storage nodes, which is advantageous for high integration.

In order to prevent the storage node from becoming leaned during the wet dip out process for the mold layer, a support layer is formed for supporting the uppermost storage nodes.

In a multi-layered, pillar type storage node structure, in order to make a top line width (top CD) of a lower storage node larger than a bottom line width (bottom CD) of an upper storage node, the misalignment in the process of forming the upper storage node is minimized.

In order to maximize an overlap margin between layers of storage nodes while increasing an effective area of the storage node, a process is controlled to not cause a short circuit between adjacent open regions in a process of widening the open regions by using wet chemicals. Furthermore, it is possible to secure a bottom CD of a storage node.

Multiple mold layers are formed by stacking materials having different wet etch rates.

Figure 2A:
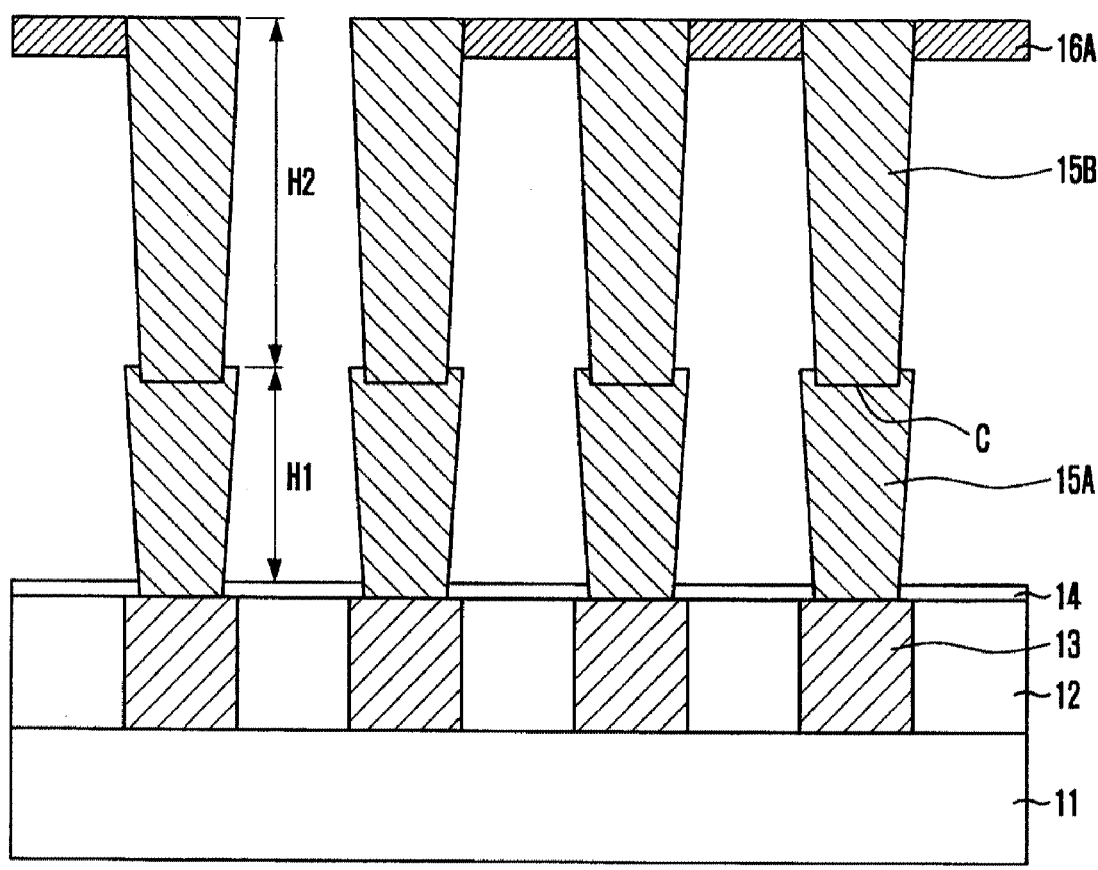
FIG. 2A is a cross-sectional view of a semiconductor device in accordance with one or more embodiments.
Figure 2B:
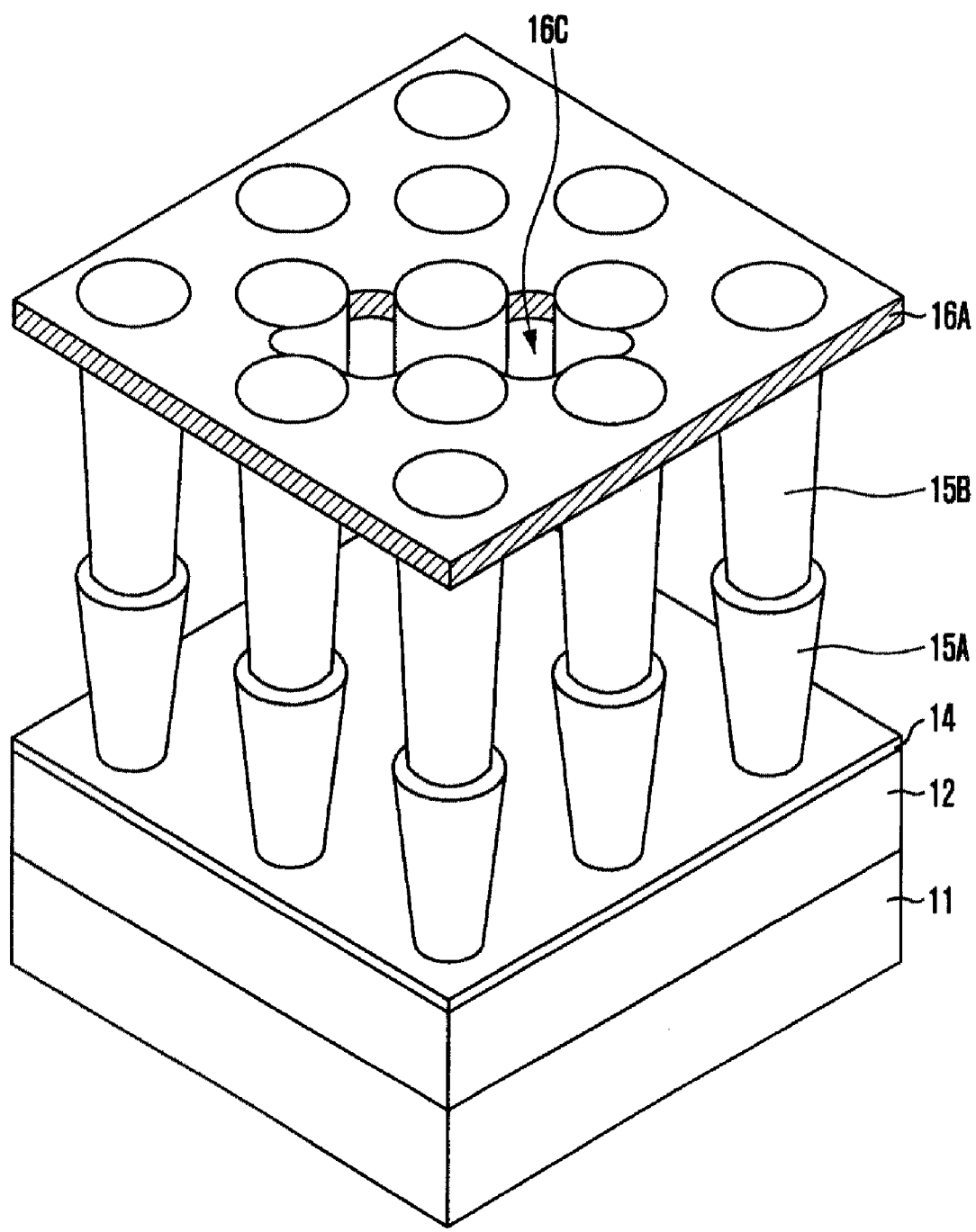
FIG. 2B is a perspective view of the semiconductor device in accordance with one or more embodiments.

FIG. 2A is a cross-sectional view of a semiconductor device in accordance with one or more embodiments. FIG. 2B illustrates a perspective view of the semiconductor device in accordance with one or more embodiments.

As illustrated in FIGS. 2A and 2B, an inter-insulation layer 12, where a storage node contact plug 13 is buried, is formed on a substrate 11. A plurality of two-layered pillar type storage nodes 15A and 15B connected to the storage node contact plugs 13 are formed over the inter-insulation layer 12. The uppermost pillar type storage nodes 15B are firmly fixed by a support layer 16A and the support layer 16A is partially opened. That is, the support layer 16A has an opening. FIG. 2B illustrates the opening 16C. The storage node contact plug 13 includes a polysilicon layer or a metallic conductive layer. The semiconductor device may further include a barrier metal such as Ti or Ti/TiN on the storage node contact plug 13. The pillar type storage nodes 15A and 15B include one of a metallic nitride layer, a metal layer, and a combination thereof. For instance, the pillar type storage nodes 15A and 15B include one of TiN, Ru, TaN, WN, Pt, Ir, and a combination thereof.

The pillar type storage nodes 15A and 15B form a two-layered stacked structure of the first pillar type storage node 15A and the second pillar type storage node 15B that are stacked. A lower portion of the first storage node 15A is supported by an etch stop layer 14 and a top CD of the first storage node 15A is larger than a bottom CD of the second storage node 15B. A groove C is formed in a top surface of the first storage node 15A. A lower portion of the second storage node 15B is disposed on the groove C, which may construct a further stabilized multi-layered pillar structure. A height H1 of the first storage node 15A may be smaller than a height H2 of the second storage node 15B. For example, a height of each pillar type storage node is in a range of 2,000 Å to 20,000 Å.

Figure 3A:
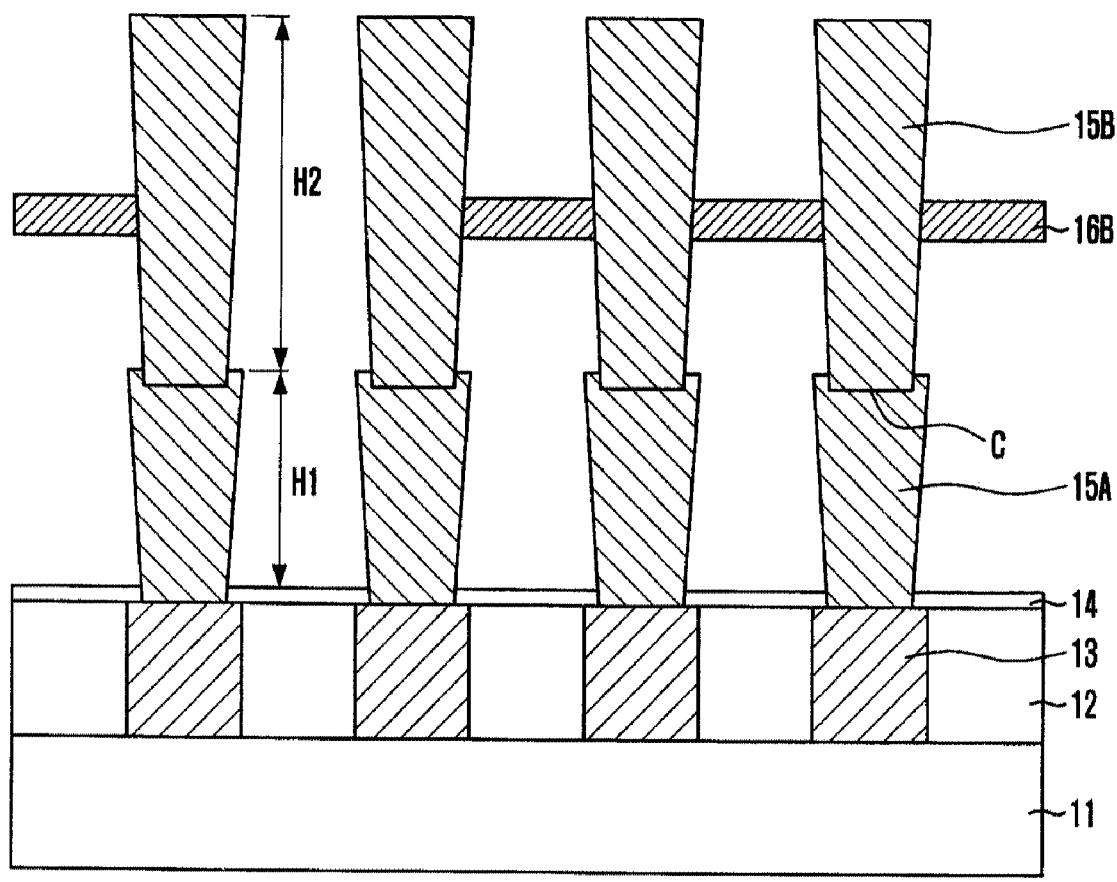
FIG. 3A is a cross-sectional view of a semiconductor device in accordance with one or more embodiments.
Figure 3B:
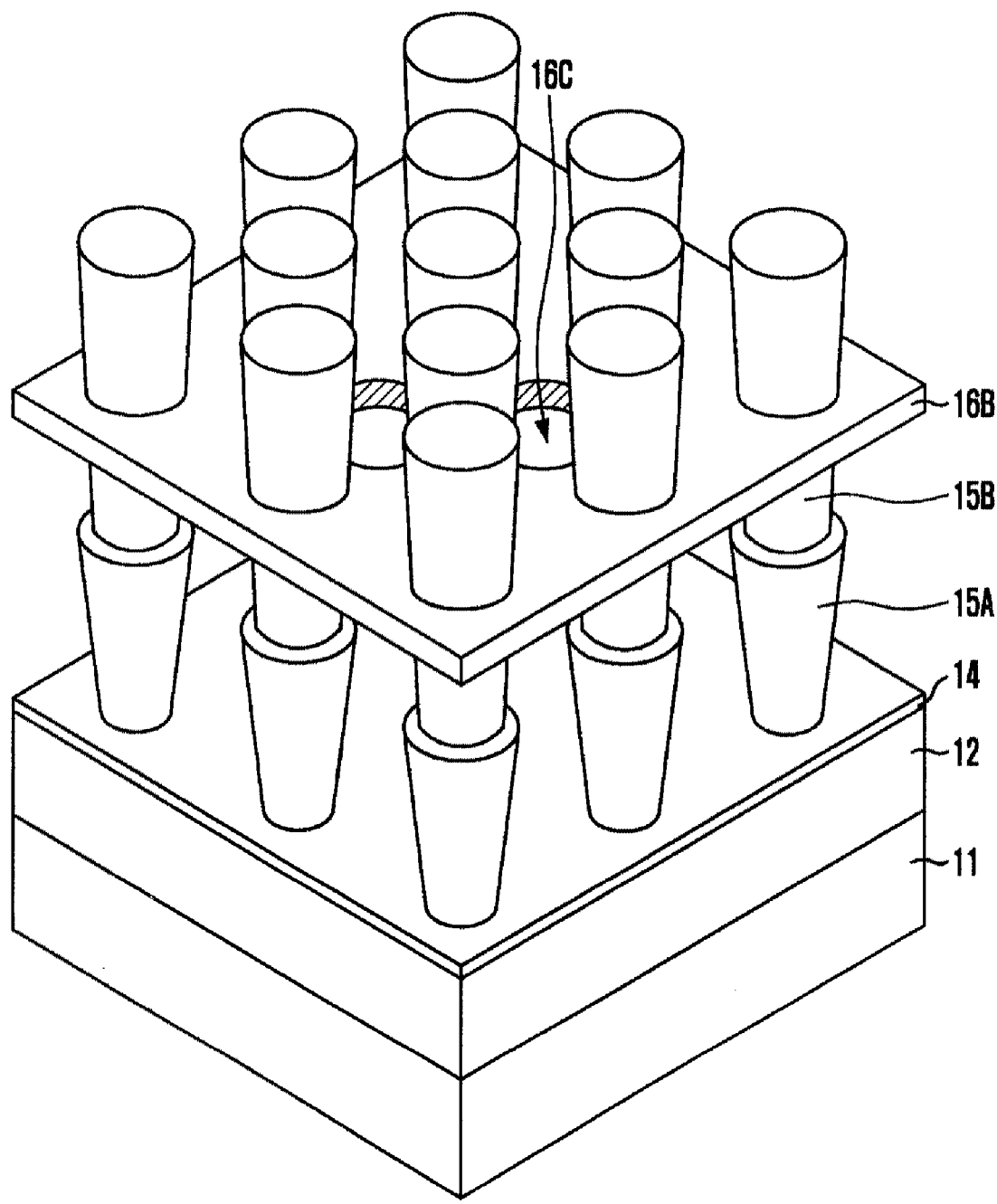
FIG. 3B is a perspective view of the semiconductor device in accordance with one or more embodiments.

FIG. 3A is a cross-sectional view of a semiconductor device in accordance with one or more embodiments. FIG. 3B is a perspective view of the semiconductor device in accordance with one or more embodiments.

As illustrated in FIGS. 3A and 3B, an inter-insulation layer 12, where a storage node contact plug 13 is buried, is formed on a substrate 11. A plurality of two-layered pillar type storage nodes 15A and 15B connected to the storage node contact plugs 13 are formed over the inter-insulation layer 12. The uppermost pillar type storage nodes 15B are firmly fixed by a support layer 16B and the support layer 16B is partially opened. That is, the support layer 16B has an opening. FIG. 3B illustrates the opening 16C. The storage node contact plug 13 includes a polysilicon layer or a metallic conductive layer. The semiconductor device may further include a barrier metal such as Ti or Ti/TiN on the storage node contact plug 13. The pillar type storage nodes 15A and 15B include one of a metallic nitride layer, a metal layer, and a combination thereof. For instance, the pillar type storage nodes 15A and 15B include one of TiN, Ru, TaN, WN, Pt, Ir, and a combination thereof.

The pillar type storage nodes 15A and 15B form a two-layered stacked structure of the first pillar type storage node 15A and the second pillar type storage node 15B. A lower portion of the first storage node 15A is supported by an etch stop layer 14 and a top CD of the first storage node 15A is larger than a bottom CD of the second storage node 15B. A groove C is formed in a top surface of the first storage node 15A. A lower portion of the second storage node 15B is disposed on the groove C, which may construct a further stabilized multi-layered pillar structure. A height H1 of the first storage node 15A may be smaller than a height H2 of the second storage node 15B. For example, a height of each pillar type storage node is in a range of 2,000 Å to 20,000 Å.

In one or more embodiments, the support layer 16A supports an upper portion of the second storage node 15B. Meanwhile, in one or more embodiments, the support layer 16B supports a middle portion of the second storage node 15B.

Figure 4A:
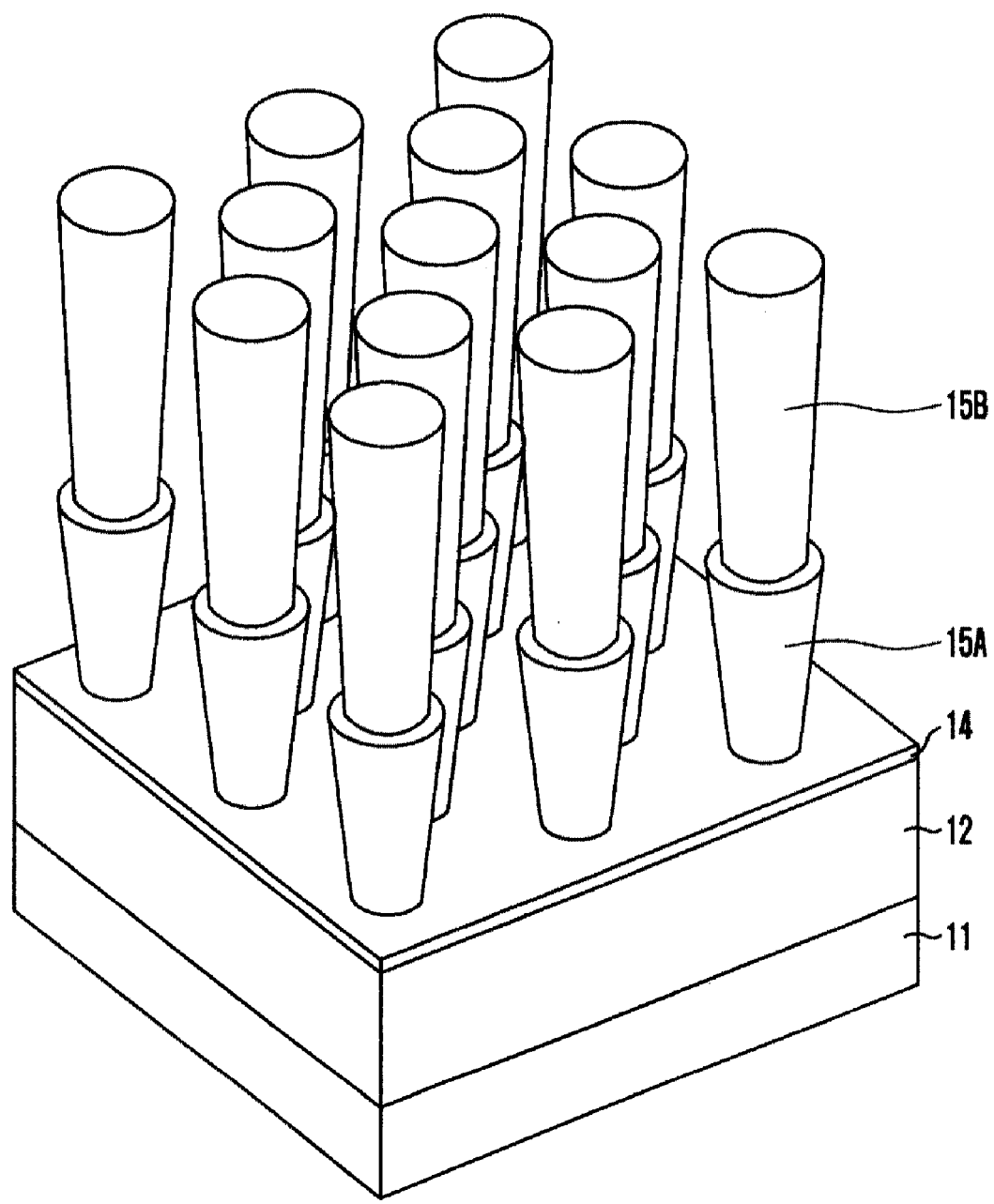
FIG. 4A is a perspective view showing a structure of a storage node employed in one or more embodiments.
Figure 4B:
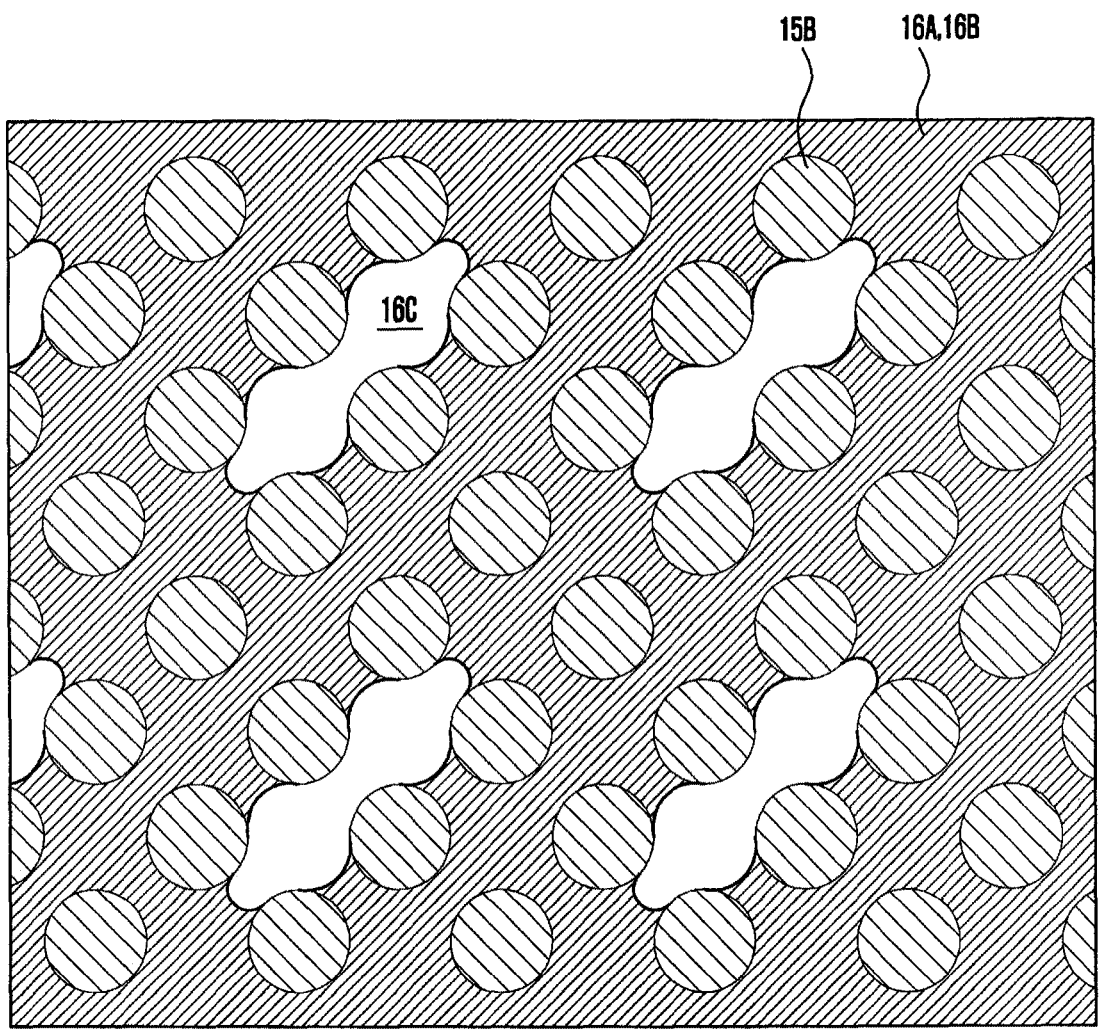
FIG. 4B is a plan view of a support layer employed in one or more embodiments.

FIG. 4A is a perspective view showing a structure of the storage nodes employed in one or more embodiments. FIG. 4B is a plan view of the support layer employed in one or more embodiments.

As illustrated in FIG. 4A, the first pillar type storage node 15A and the second pillar type storage node 15B form a two-layered stacked structure having a zigzag array.

Referring to FIG. 4B, the support layer 16A or 16B supporting the second storage node 15B, which is the uppermost layer of the two-layered stacked structure, is formed. The support layer 16A or 16B has the opening 16C in a certain region thereof. The opening 16C may be arranged regularly and repeatedly, and have a peanut shape. The opening 16C is employed to provide a diffusion path of a wet chemical in a subsequent wet dip out process. Referring to FIG. 4B, sidewalls of 6 adjacent second storage nodes are exposed by the opening 16C. In one or more embodiments, the number of second storage nodes exposed by the opening 16C may be equal to or larger than 6.

Since the support layer 16A or 16B has an integral structure of supporting second pillar type storage nodes 15B adjacent thereto, it is possible to support adjacent storage nodes very strongly and prevent the leaning between adjacent storage nodes. Meanwhile, the support layer 16A or 16B may have a mesh structure of supporting outer walls of second storage nodes. However, since the mesh structure may be inevitably lost in a subsequent process, a supporting force of the mesh structure becomes weaker than that of the integral structure. That is, the support layer 16A or 16B having the integral structure can support the second storage nodes 15B with a stronger supporting force than a support layer having the mesh structure.

The support layer 16A or 16B may include an insulation layer and the insulation layer may include a nitride layer or an undoped polysilicon layer. In general, the undoped polysilicon layer has an insulating property. The support layer 16A or 16B may have a thickness of 200 Å to 1,000 Å. The opening 16C formed in the support layer 16A or 16B has no limitation in size and number, but it has a minimum size and the minimum number capable of providing a path for a wet etch solution.

Figure 4C:
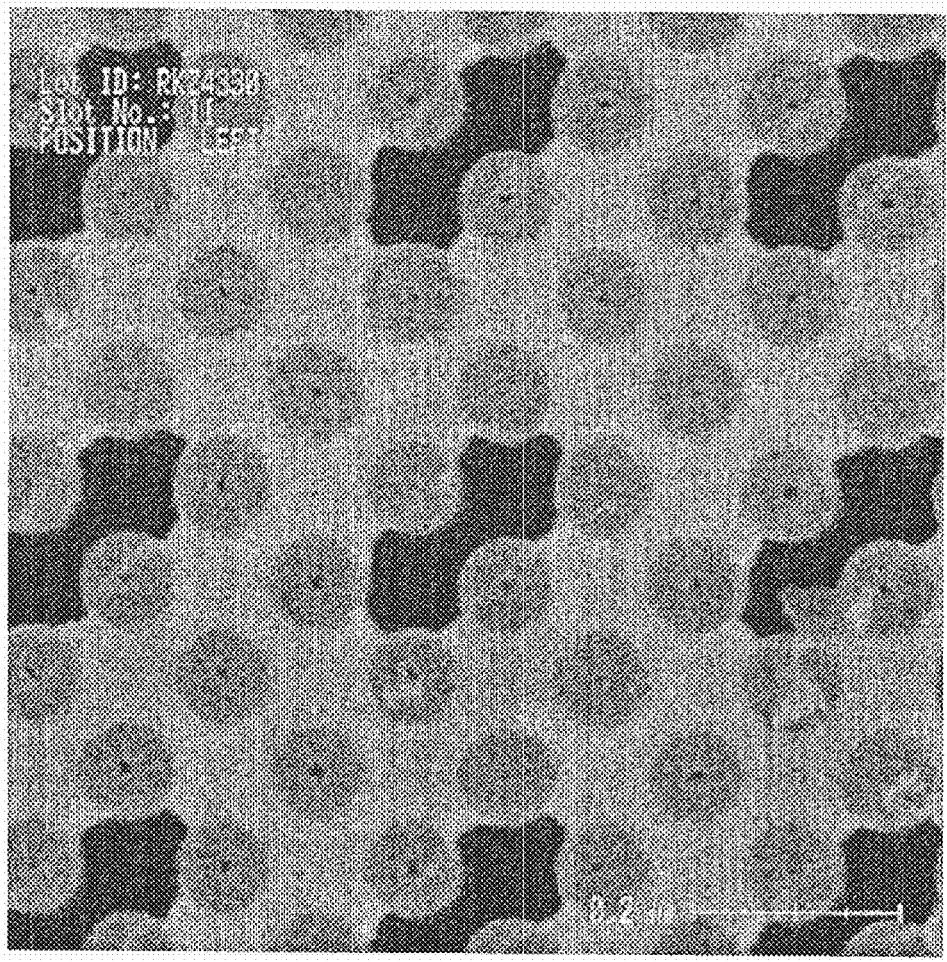
FIG. 4C is an image of a support layer employed in one or more embodiments.

FIG. 4C is an image of the support layer employed in one or more embodiments. Referring to FIG. 4C, the opening included in the support layer has a peanut shape. A plurality of openings is employed and they are repeatedly arranged.

Figure 5A:
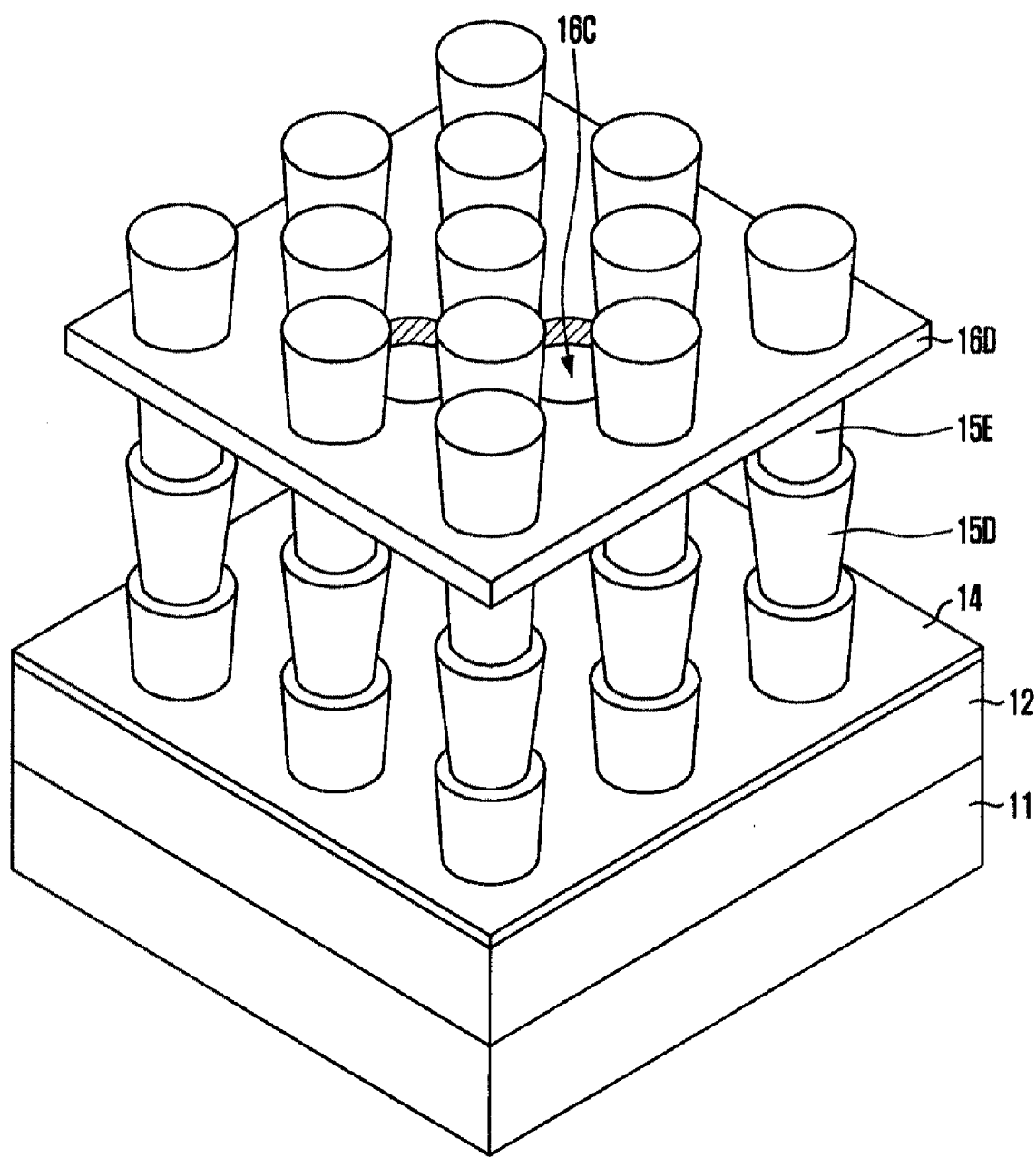
FIG. 5A is a perspective view of a semiconductor device in accordance with one or more embodiments.
Figure 5B:
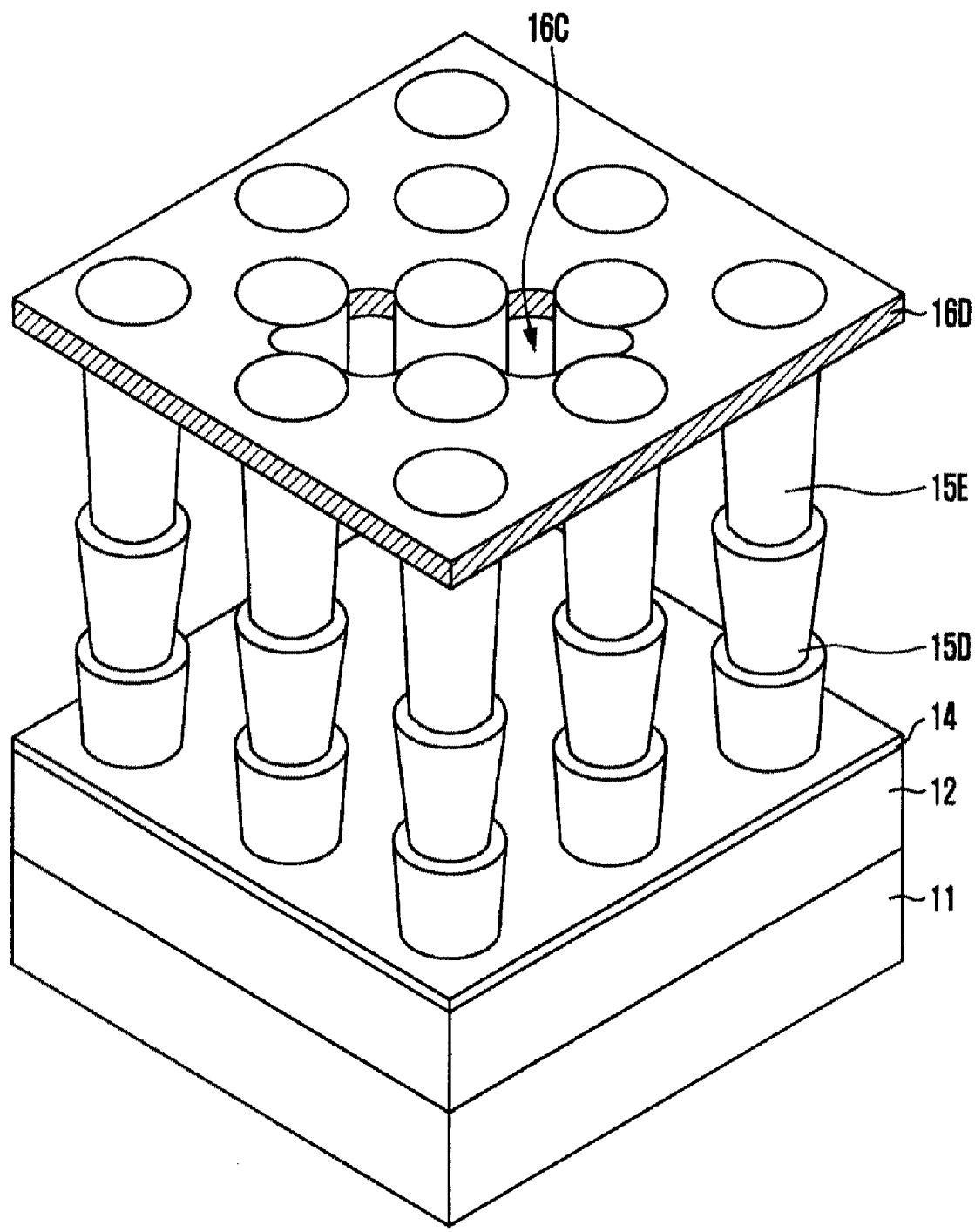
FIG. 5B is a perspective view of a semiconductor device in accordance with one or more embodiments.

FIG. 5A is a perspective view of a semiconductor device in accordance with one or more embodiments. FIG. 5B is a perspective view of a semiconductor device in accordance with one or more embodiments.

As illustrated in FIGS. 5A and 5B, an inter-insulation layer 12 is buried where a storage node contact plug (not shown) is formed on a substrate 11. A plurality of two-layered pillar type storage nodes 15D and 15E connected to the storage node contact plugs are formed over the inter-insulation layer 12. The uppermost pillar type storage nodes 15E are firmly fixed by a support layer 16D and the support layer 16D is partially opened. That is, the support layer 16D has an opening. FIGS. 4B, 5A, and 5B illustrate the opening 16C. The pillar type storage nodes 15D and 15E include one of a metallic nitride layer, a metal layer, and a combination thereof. For instance, the pillar type storage nodes 15D and 15E include one of TiN, Ru, TaN, WN, Pt, Ir, and a combination thereof.

The pillar type storage nodes 15D and 15E form a two-layered stacked structure of the first pillar type storage node 15D and the second pillar type storage node 15E. A lower portion of the first storage node 15D is supported by an etch stop layer 14 and a top CD of the first storage node 15D is larger than a bottom CD of the second storage node 15E. A groove is formed in a top surface of the first storage node 15D and a lower portion of the second storage node 15E is disposed on the groove, which may construct a further stabilized multi-layered pillar structure. A height of the first storage node 15D may be smaller than a height of the second storage node 15E. For example, a height of each pillar type storage node is in a range of 2,000 Å to 20,000 Å.

Since the support layer 16D has an integral structure of supporting the adjacent second pillar type storage nodes 15E, it is possible to support adjacent storage nodes very strongly and prevent the leaning between adjacent storage nodes.

In one or more embodiments, a shape of the first storage node 15D is different from that in one or more embodiments. That is, the first storage node 15D may have a step index structure and thus result in a stronger supporting force.

In one or more embodiments, the support layer 16D supports a middle portion of the second storage node 15E. Meanwhile, in one or more embodiments, the support layer 16D supports an upper portion of the second storage node 15E.

Figure 6:
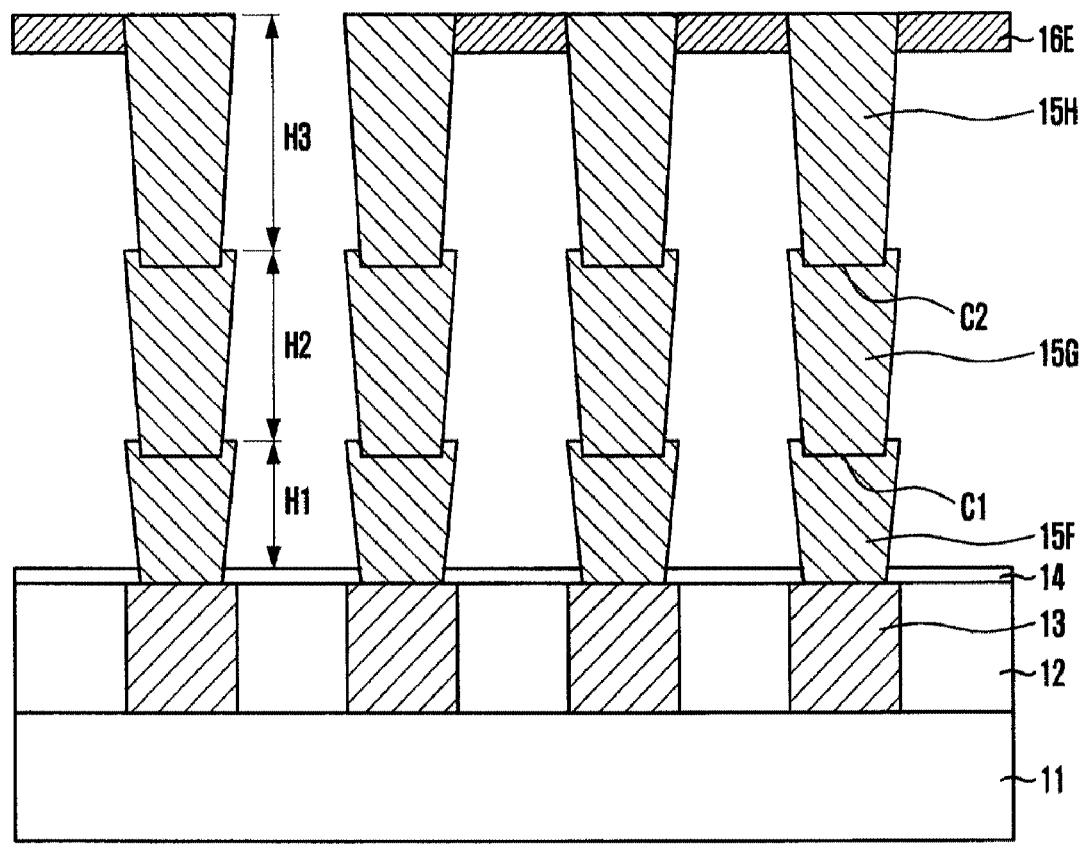
FIG. 6 is a cross-sectional view of a semiconductor device in accordance with one or more embodiments.

FIG. 6 is a cross-sectional view of a semiconductor device in accordance with one or more embodiments.

Referring to FIG. 6, an inter-insulation layer 12, where a storage node contact plug 13 is buried, is formed on a substrate 11. A plurality of three-layered pillar type storage nodes 15F, 15G, and 15H connected to the storage node contact plugs 13 is formed over the inter-insulation layer 12. The uppermost pillar type storage nodes 15H are firmly fixed by a support layer 16E and the support layer 16E is partially opened. That is, the support layer 16E includes an opening having the shape illustrated in FIG. 4B. The storage node contact plug 13 includes a polysilicon layer or a metallic conductive layer. The semiconductor device may further include a barrier metal such as Ti or Ti/TiN on the storage node contact plug 13. The pillar type storage nodes 15F, 15G, and 15H include one of a metallic nitride layer, a metal layer, and a combination thereof. For instance, the pillar type storage nodes 15F, 15G, and 15H include one of TiN, Ru, TaN, WN, Pt, Ir, and a combination thereof.

Referring to FIG. 6, the pillar type storage nodes 15F, 15G, and 15H form a three-layered stacked structure of the first pillar type storage node 15F, the second pillar type storage node 15G and the third pillar type storage node 15H. A lower portion of the first storage node 15F is supported by an etch stop layer 14 and a top CD of the first storage node 15F is larger than a bottom CD of the second storage node 15G. A top CD of the second storage node 15G is larger than a bottom CD of the third storage node 15H.

A groove C1 is formed in a top surface of the first storage node 15F and a lower portion of the second storage node 15G is disposed on the groove C1. Moreover, a groove C2 is formed in a top surface of the second storage node 15G and a lower portion of the third storage node 15H is disposed on the groove C2. Since the vertically stacked storage nodes are disposed on grooves, a further stabilized multi-layered pillar structure may be formed.

A height H1 of the first storage node 15F may be smaller than a height H2 of the second storage node 15G, and the height H2 of the second storage node 15G may be smaller than a height H3 of the third storage node 15H. For instance, a height of each pillar type storage node is in a range of 2,000 Å to 20,000 Å.

Since the support layer 16E has an integral structure of supporting, the adjacent, third pillar type storage nodes 15H, it is possible to support adjacent storage nodes very strongly and prevent leaning between adjacent storage nodes.

In one or more other embodiments, it is possible to form a 4 or more-layered pillar type storage node structure.

FIGS. 7A to 7J are cross-sectional views of a method of fabricating a semiconductor device in accordance with one or more embodiments.

Figure 7A:
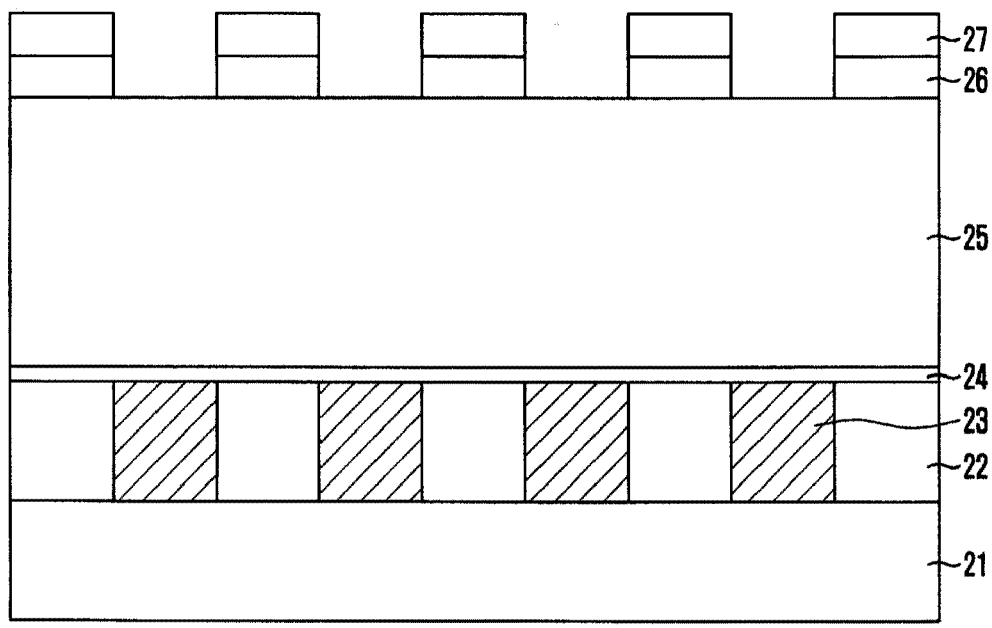
FIGS. 7A to 7J are cross-sectional views illustrating stages in a method of fabricating a semiconductor device in accordance with one or more embodiments.

Referring to FIG. 7A, after an inter-insulation layer 22 is formed over a substrate 21, a storage node contact hole penetrating the inter-insulation layer 22 is formed. Then, a storage node contact plug 23, buried in the storage node contact hole, is formed. Although it is not shown, in general, bit lines and transistors including word lines are already formed before forming the inter-insulation layer 22. The inter-insulation layer 22 is formed of an oxide layer. The storage node contact plug 23 is formed by depositing a polysilicon layer or a metallic conductive layer and then performing an etch-back process on the polysilicon layer or the metallic conductive layer. Although it is not shown, a barrier metal may be formed on the storage node contact plug 23 and the barrier metal includes Ti or Ti/TiN.

Subsequently, an etch stop layer 24 is formed on the inter-insulation layer 22 including the storage node contact plug 23. Herein, the etch stop layer 24 is used as an etch stop layer when etching a subsequent mold layer and may be formed of a silicon nitride ($Si_3N_4$) layer.

Then, a first mold layer 25 is formed on the etch stop layer 24. The first mold layer 25 is formed of an insulation layer.

Specially, the first mold layer 25 is formed by depositing an oxide layer to have a thickness capable of securing an area required to achieve a desired charge capacitance. The first mold layer 25 may include an oxide layer such as boro phosphorous silicate glass (BPSG), spin on dielectric (SOD), phosphorous silicate glass (PSG), low pressure tetra ethyl ortho silicate (LPTEOS), or plasma enhanced tetra ethyl ortho silicate (PETEOS). In one or more embodiments, the first mold layer 25 has a thickness of 2,000 Å to 20,000 Å.

After forming the first mold layer 25, a planarization process may be performed so that a subsequent photo process is more easily performed.

A first photoresist pattern 27 is formed by coating photoresist on the first mold layer 25 and patterning the photoresist through an exposure and development process. Herein, the first photoresist pattern 27 is a storage node mask where an open region is defined, wherein a storage node is formed in the open region. Prior to forming the first photoresist pattern 27, a first hard mask layer 26 may be formed of an amorphous carbon layer or a polysilicon layer and an anti-reflective coating layer (not shown) may be formed on the first hard mask layer 26.

Subsequently, the first hard mask layer 26 is etched by using the first photoresist pattern 27, as an etch barrier.

Figure 7B:
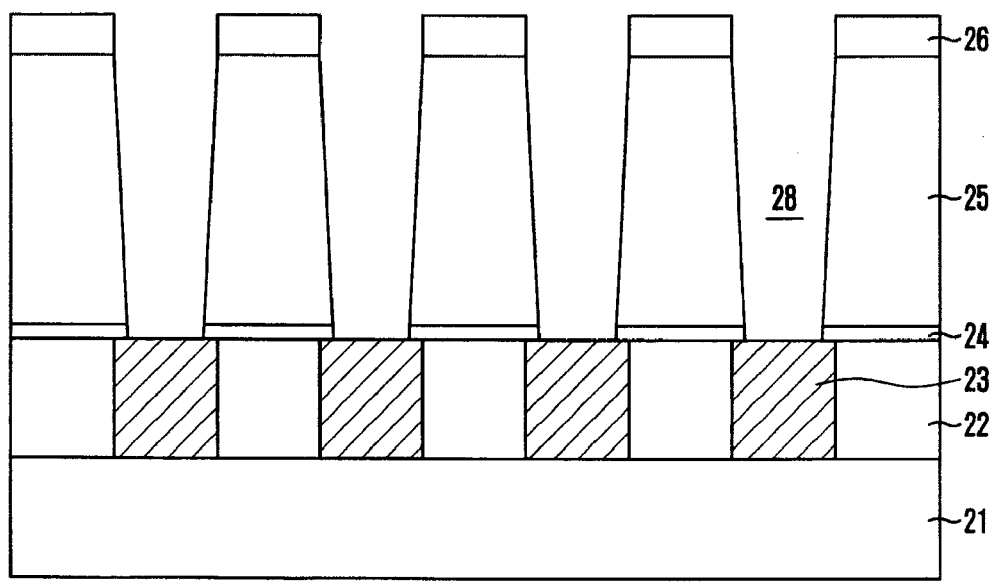

Referring to FIG. 7B, after removing the first photoresist pattern 27, the first mold layer 25 is etched using the first hard mask layer 26 as an etch barrier. As a result, a plurality of first open regions 28 are formed. Then, a top surface of the storage node contact plug 23 is exposed by etching the etch stop layer 24 below the first open regions 28.

The first open region 28 is a hole shaped region where a storage node is to be buried. Thus, it is referred to as a storage node hole. In case of dry-etching the first mold layer 25, a sidewall of the first open region 28 may have a slope of 89° to 89.9°. As a result, the first open region 28 has a bottom CD that is smaller than a top CD.

Figure 7C:
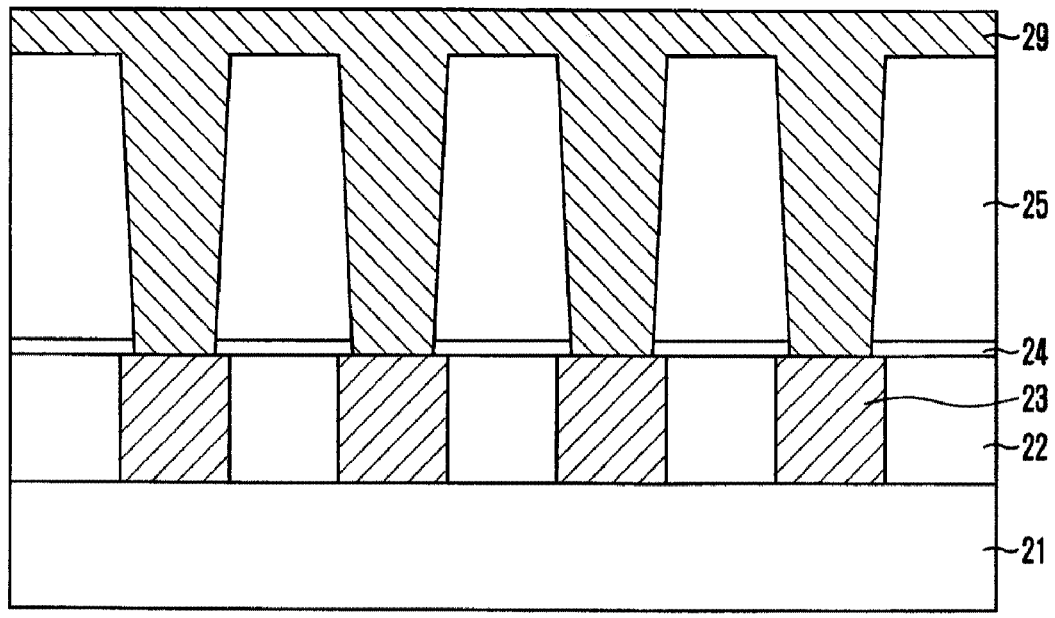

Referring to FIG. 7C, after removing the first hard mask layer 26, a first conductive layer 29 to be used as a storage node is deposited on the first mold layer 25 until the first open region 28 is filled. The first conductive layer 29 includes one metallic nitride layer, a metal layer, and a combination thereof. For instance, the first conductive layer 29 includes one of TiN, Ru, TaN, WN, Pt, Ir, and a combination thereof.

Preferably, the first conductive layer 29 is deposited using a chemical vapor deposition (CVD) method or an atomic layer deposition (ALD) method and has a thickness of 200 Å to 900 Å. The first conductive layer 29 fills up the first open region 28 without an empty space.

Figure 7D:
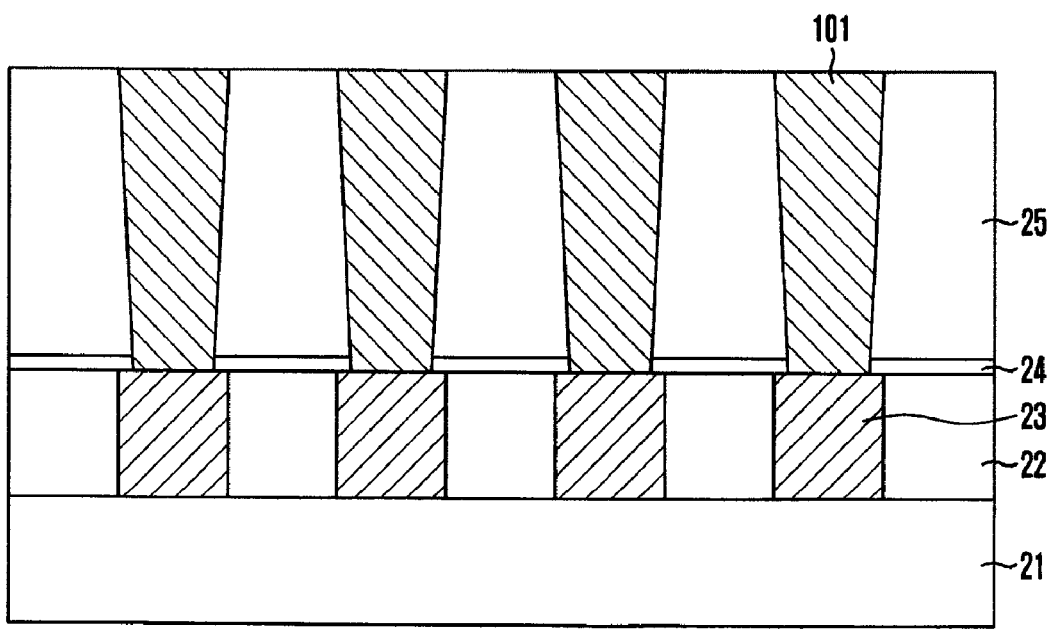

As described above, after depositing the first conductive layer 29, a first storage node isolation process is performed as illustrated in FIG. 7D.

Referring to FIG. 7D, in the first storage node isolation process, the first conductive layer 29 is etched using a dry etch-back or chemical mechanical polishing (CMP) process. The first storage node isolation process is performed until a top surface of the first mold layer 25 is exposed, so that a first storage node 101 is formed to have a pillar shape buried in the first open region 28. Through the CMP or dry etch-back process, first conductive layer 29 is removed from the first mold layer 25, which defines the first open region 28. Thus the first storage node 101 is formed to fill the inside of the first open region 28.

Since the first storage node 101 has a shape filling up the inside of the first open region 28, the first storage node 101 is formed as a pillar structure. First storage nodes adjacent to each other are insulated and isolated by the first mold layer 25.

Since the first open region 28 has a slope of a bottom CD being smaller than a top CD, the shape of the first open region 28 is transferred into the first storage node 101. Thus, the first storage node 101 has a shape of a bottom CD that is smaller than a top CD.

Figure 7E:
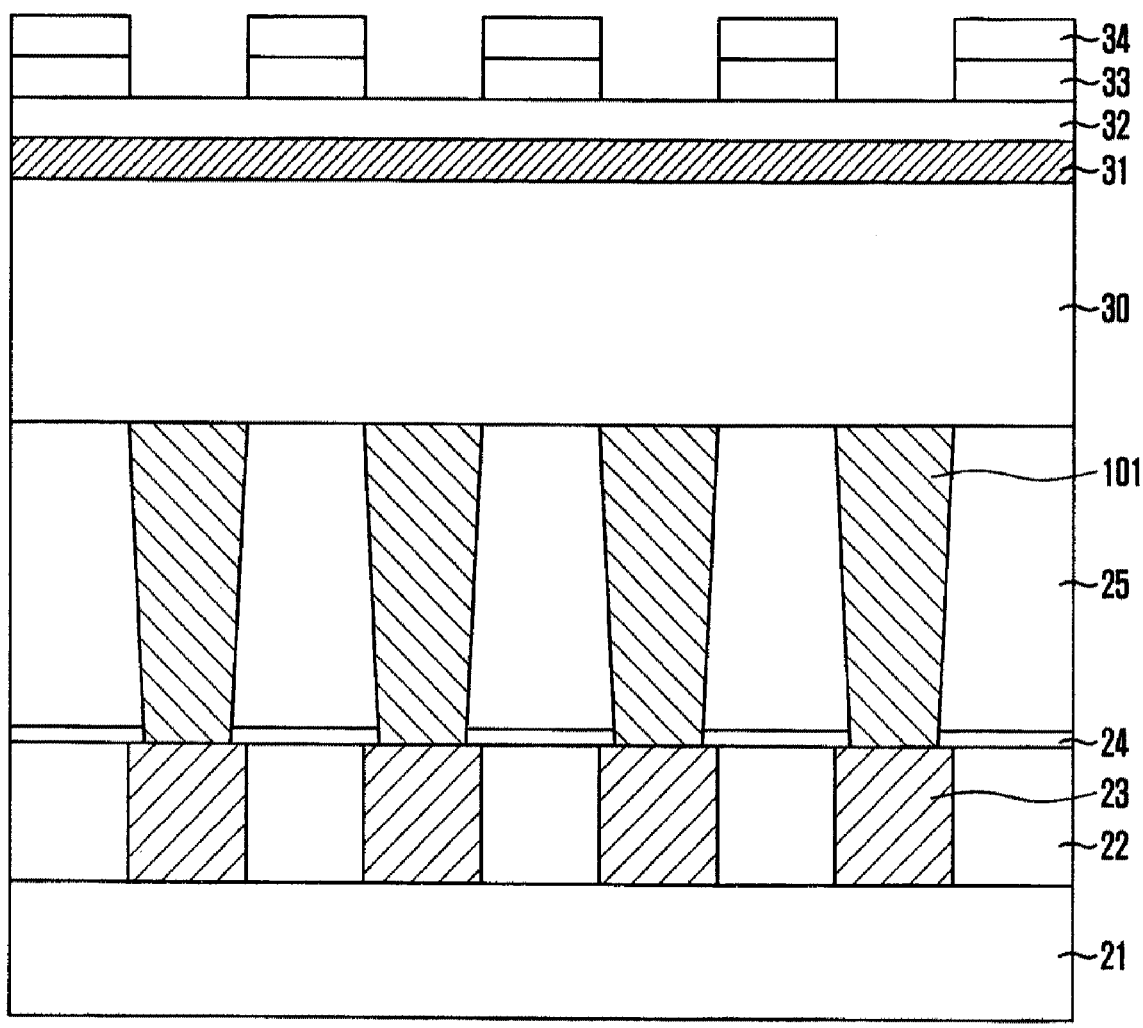

Referring to FIG. 7E, a second mold layer 30 is formed on the first mold layer 25 where the first storage node 101 is buried. The second mold layer 30 may include an insulation layer and, preferably, include an oxide layer. The second mold layer 30 may include an oxide layer such as BPSG, SOD, PSG, LPTEOS, or PETEOS. A thickness of the second mold layer 30 may be in a range of 2,000 Å to 20,000 Å. Herein, the second mold layer 30 may have a thickness that is substantially the same as that of the first mold layer 25, or larger than or smaller than that of the first mold layer 25.

Then, a support layer 31 is formed on the second mold layer 30. The support layer 31 is formed to prevent the storage node from being leaned in a subsequent wet dip out process and includes a nitride layer. The support layer 31 may have a thickness of 200 Å to 1,000 Å and may be formed with an undoped polysilicon layer.

A first sacrificial layer 32 is formed on the support layer 31. Herein, the first sacrificial layer 32 may include an oxide layer such as TEOS, BPSG, PSG, undoped silicate glass (USG), SOD, or high density plasma oxide (HDP). A thickness of the first sacrificial layer 32 may be in a range of 500 Å to 2,000 Å.

A second photoresist pattern 34 is formed by coating photoresist on the first sacrificial layer 32 and patterning the photoresist through an exposure and development process. Herein, the second photoresist pattern 34 defines an open region where a second storage node is to be formed. Prior to forming the second photoresist pattern 34, a second hard mask layer 33 may be formed of an amorphous carbon layer or a polysilicon layer on the first sacrificial layer 32 and an anti-reflective coating layer (not shown) may be formed on the second hard mask layer 33.

Subsequently, the second hard mask layer 33 is etched using the second photoresist pattern 34 as an etch barrier.

Figure 7F:
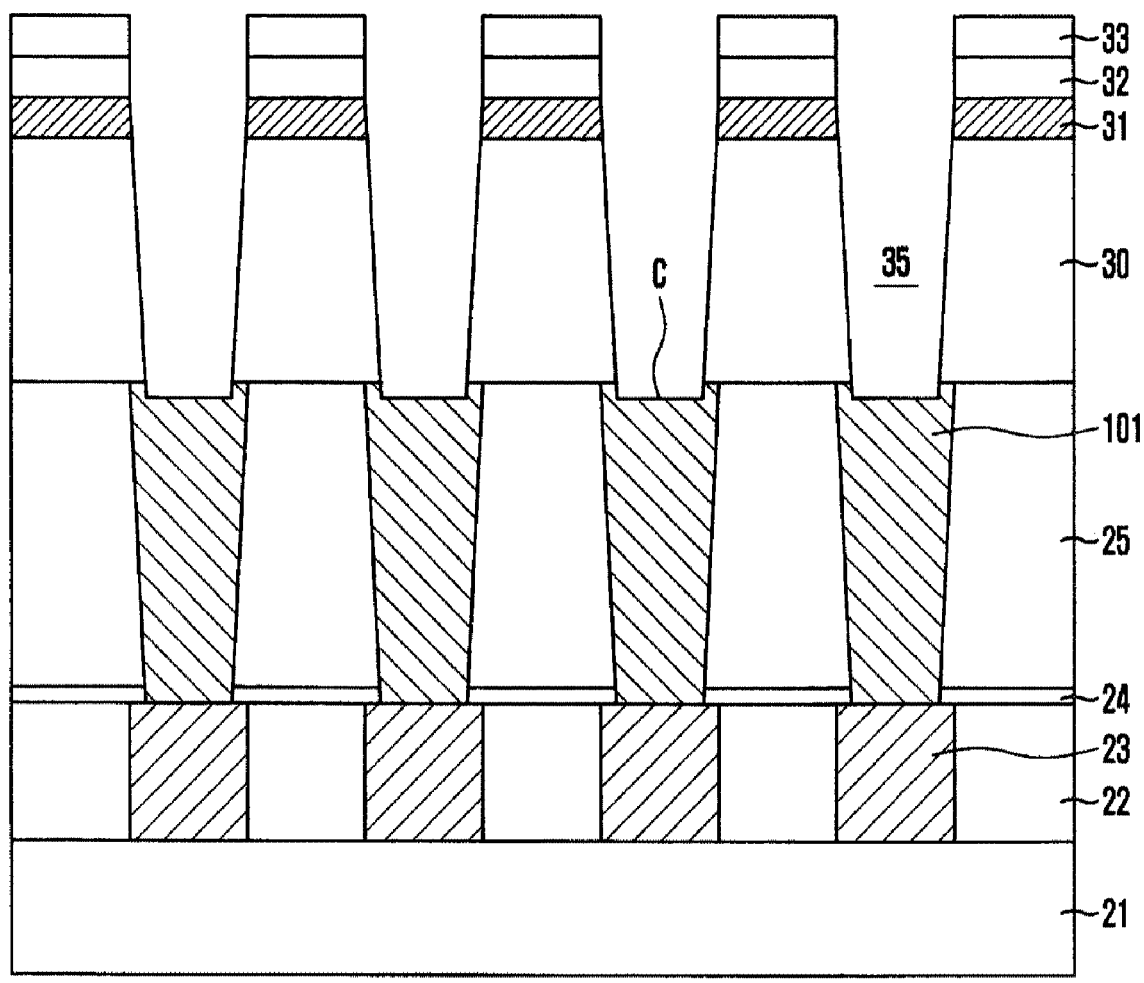

Referring to FIG. 7F, after removing the second photoresist pattern 34, the first sacrificial layer 32, the support layer 31, and the second mold layer 30 are etched using the second hard mask layer 33 as an etch barrier. As a result, a plurality of second open regions 35 are formed. Then, a top surface of the first storage node 101 is exposed by the second open regions 35. The second open regions 35 may have substantially the same size and shape as those of the first open regions 28.

The second open regions 35 are hole shaped regions where the second storage node is to be buried thus, they are referred to as a storage node holes. In case of dry-etching the second mold layer 30, a sidewall of the second open region 35 may have a slope of 89° to 89.9°. Therefore, the second open region 35 has a bottom CD that is smaller than a top CD. When performing a dry-etching process to form the second open regions, the first storage node 101 is over-etched to form a groove C in a top surface thereof.

Figure 7G:
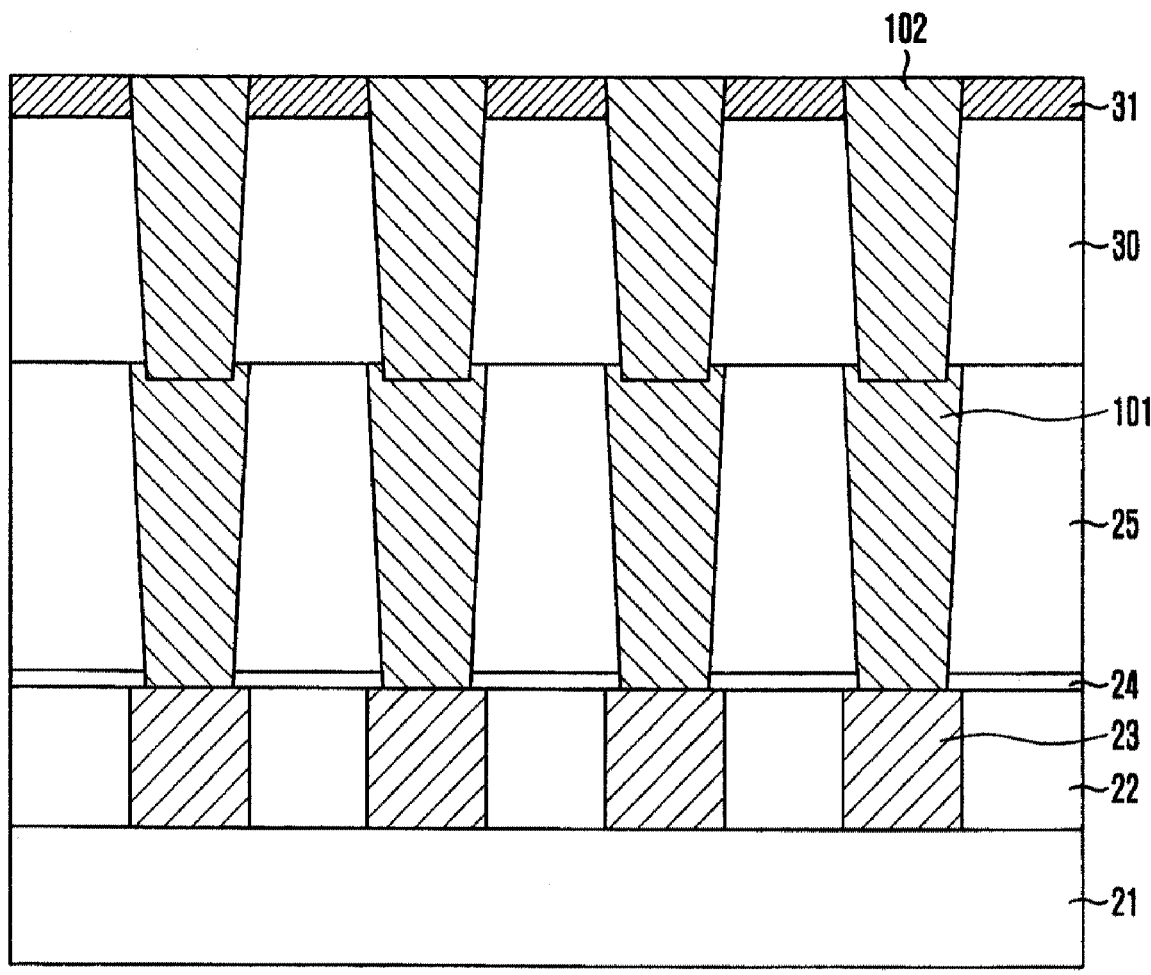

Referring to FIG. 7G, after removing the second hard mask layer 33, a second conductive layer to be used as a storage node is deposited on a whole surface of a resultant structure where the second hard mask layer 33 is removed until filling the second open regions 35. Then, there is formed a pillar type second storage node 102 buried in the second open region 35 by performing a second storage node isolation process. The second conductive layer to be the second storage node 102 includes one of a metallic nitride layer, a metal layer and a combination thereof. For instance, the second conductive layer includes one of TiN, Ru, TaN, WN, Pt, Ir, and a combination thereof. The second conductive layer is deposited using a CVD method or an ALD method to have, for example, a thickness of 200 Å to 900 Å and fills up the second open region 35 without an empty space. In the second storage node isolation process, the second conductive layer is etched using a dry etch-back or CMP process until the first sacrificial layer 32 is removed. The first sacrificial layer 32 serves to protect the support layer 31.

Since the second storage node 102 has a shape filling the inside of the second open region 35, the second storage node 102 is formed as a pillar structure. Second storage nodes adjacent to each other are insulated and isolated by the second mold layer 30. Since the second open region 35 has a slope of a bottom CD being smaller than a top CD, the shape of the second open region 35 is transferred into the second storage node 102. Thus, the second storage node 102 has a shape of a bottom CD being smaller than a top CD. Since a lower portion of the second storage node 102 is disposed on the groove C formed in the top surface of the first storage node 101, the first storage node 101 and the second storage node 102 are firmly in contact with each other.

As described above, referring to a result of the second storage node 102 being formed, a storage node having a two-layered pillar structure is formed by stacking the first storage node 101 and the second storage node 102.

Figure 7H:
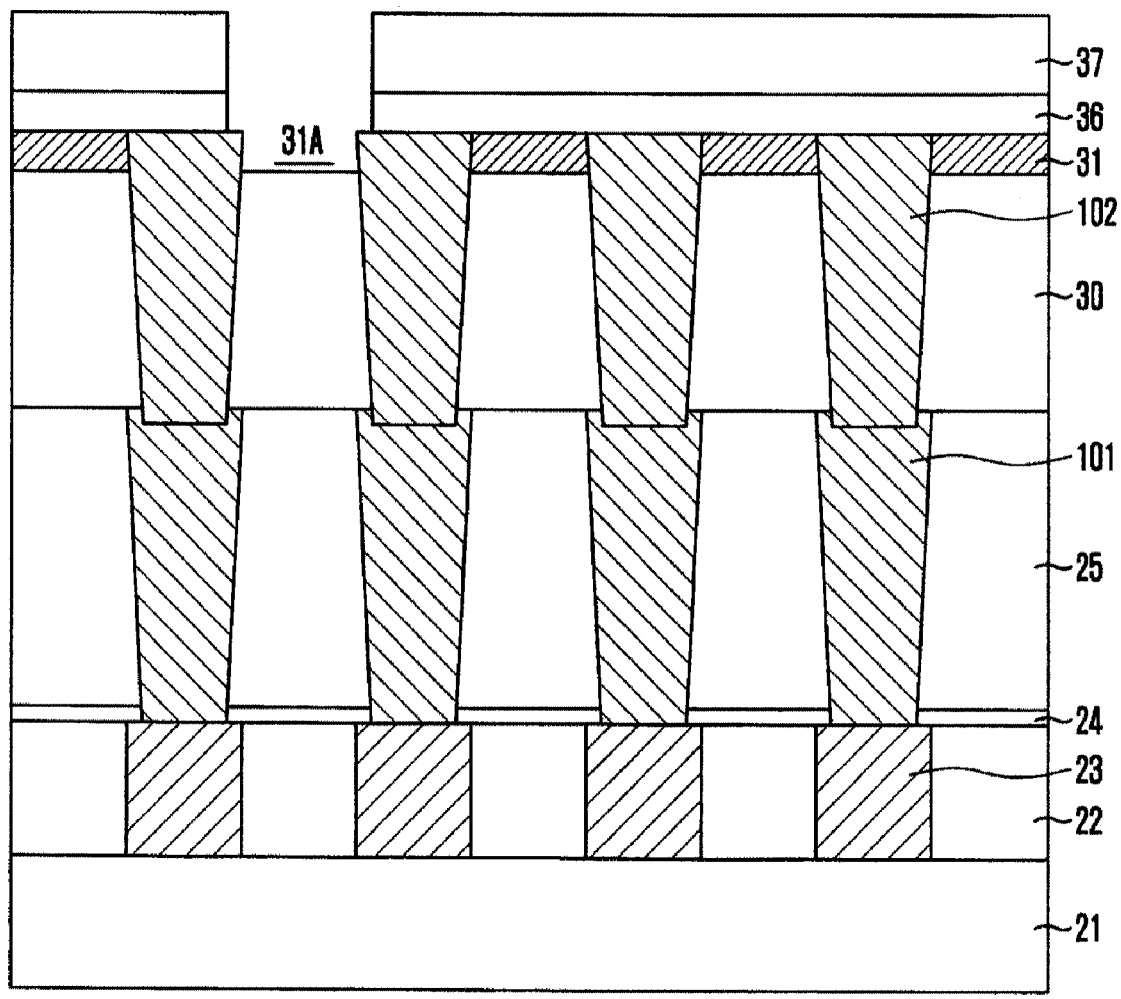

Referring to FIG. 7H, after forming a second sacrificial layer 36 on a whole surface of a resultant structure formed as a result of processes illustrated in FIG. 7G, a third photoresist pattern 37 is formed. The second sacrificial layer 36 is etched using the third photoresist pattern 37 as an etch barrier and, sequentially, the support layer 31 is partially etched. When partially etching the support layer 31, a portion of a top surface of the second storage node 102 may be exposed.

As described above, an opening 31A is formed by partially etching the support layer 31, wherein a wet etch solution may infiltrate into the resultant structure through the opening 31A in a subsequent wet dip out process. The opening 31A formed in the support layer 31 may have a shape illustrated in FIG. 4B. The opening 31A is arranged in a regular and repeating pattern. The opening 31A has a structure that allows a wet chemical solution to infiltrate when performing the wet dip out process and provides a path through which a reaction gas and a source gas for the deposition of a thin film are diffused while performing a subsequent process of depositing a dielectric layer. Like this, the opening 31A provides benefits associated with the step coverage of the dielectric layer.

When etching a portion of the support layer 31, the support layer 31 is etched enough to form the minimum opening 31A, thereby maintaining the supporting performance of the support layer 31. If the number or size of the opening 31A exceeds the desired number or size, the supporting performance of the support layer 31 may be deteriorated.

Figure 7I:
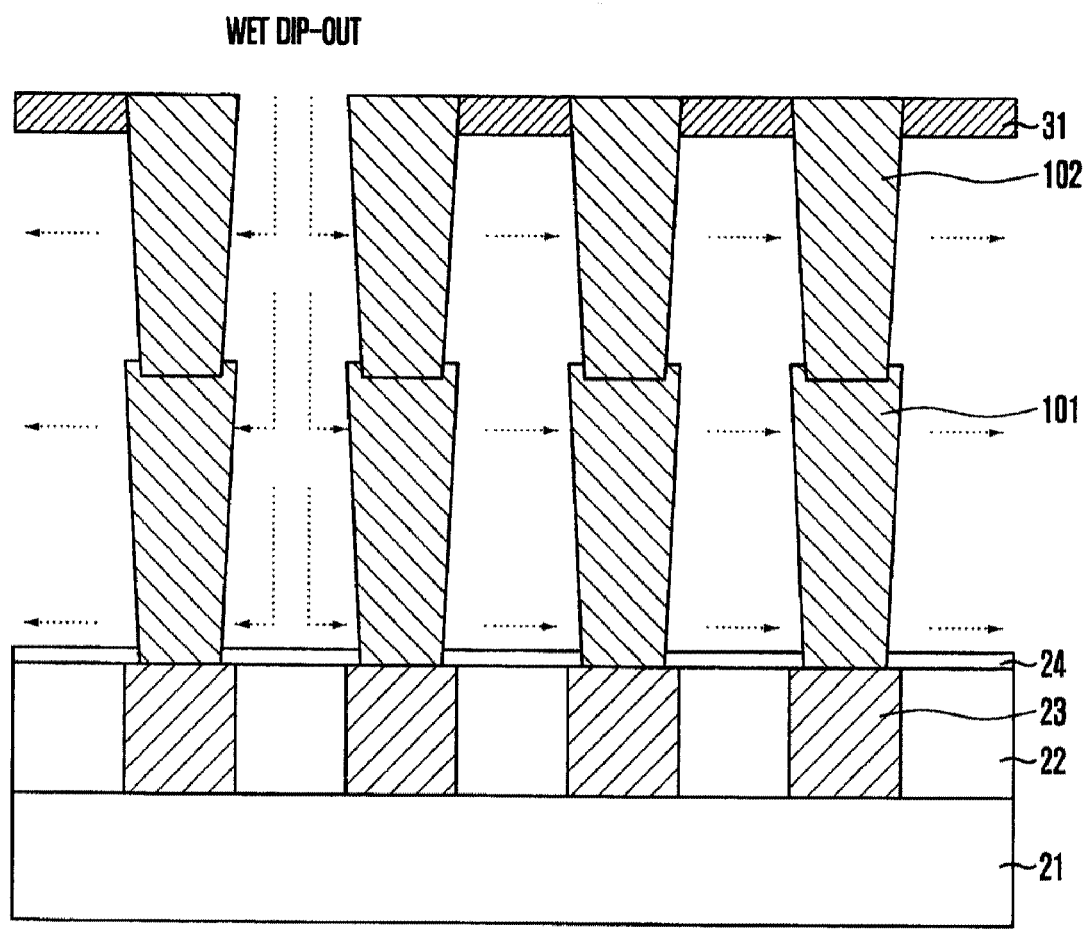

Referring to FIG. 7I, all of the mold layers are removed by performing a wet dip out process. Since the first and the second mold layers 25 and 30 are formed of an oxide layer, the wet dip out process may be performed using a wet chemical such as a hafnium (HF) or buffed oxide etchant (BOE) solution. The wet chemical infiltrates into the structure including the first and the second storage nodes 101 and 102 through the opening 31A and etches the mold layers.

When performing the wet dip out process, the support layer 31 is not etched and remains to firmly fix the multi-layered storage node, so that the multi-layered storage node does not lean. Moreover, since the storage node has a multi-layered, pillar structure, the storage node does not lean in the wet dip out process. The wet chemical does not infiltrate into a structure under the storage node since the etch stop layer 24 blocks the flow of the wet chemical.

Figure 7J:
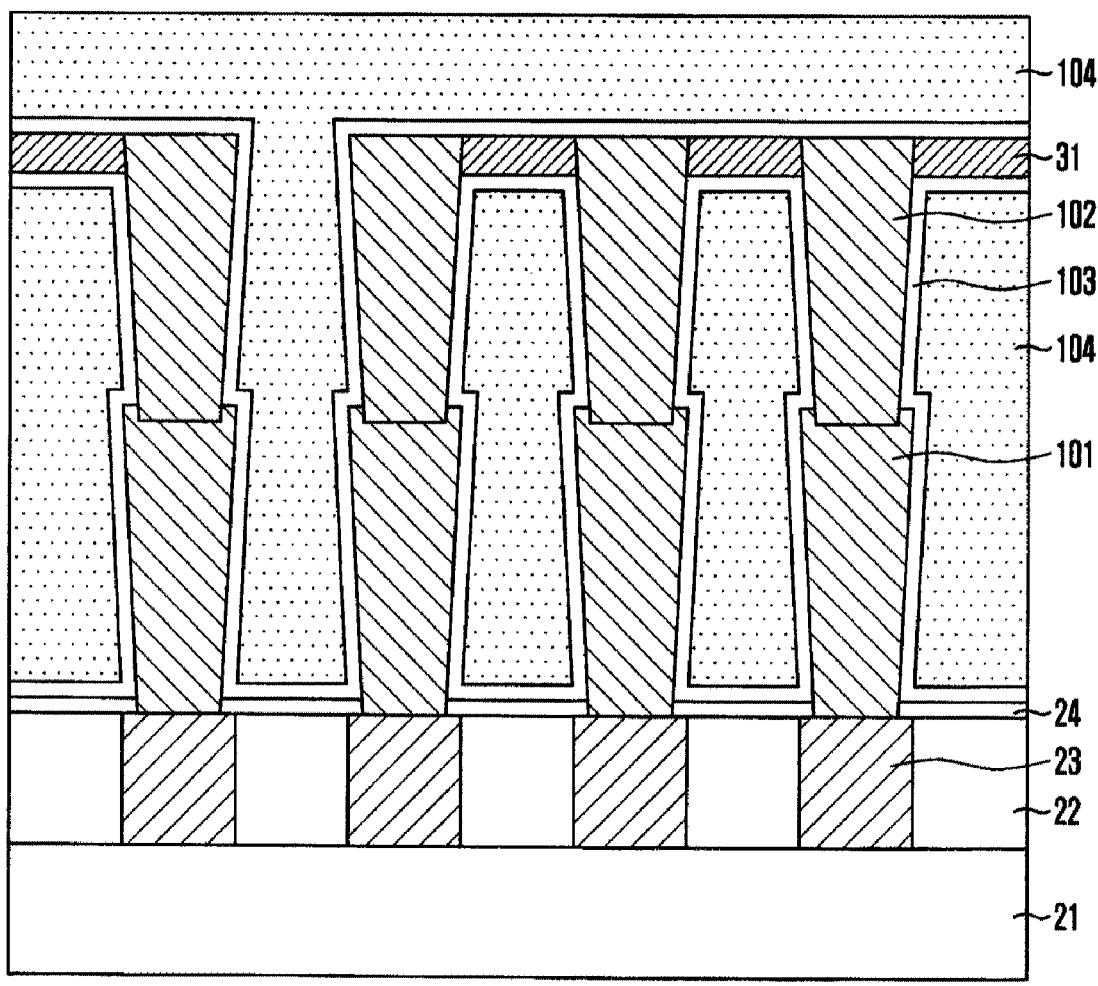

Referring to FIG. 7J, a dielectric layer 103 and a plate electrode 104 are formed. Since it is possible to sufficiently supply a source gas and a reaction gas through the opening provided by the support layer 31, the dielectric layer 103 and the plate electrode 104 may be more easily formed.

FIGS. 8A to 8J are cross-sectional views of a method of fabricating a semiconductor device in accordance with one or more embodiments.

Figure 8A:
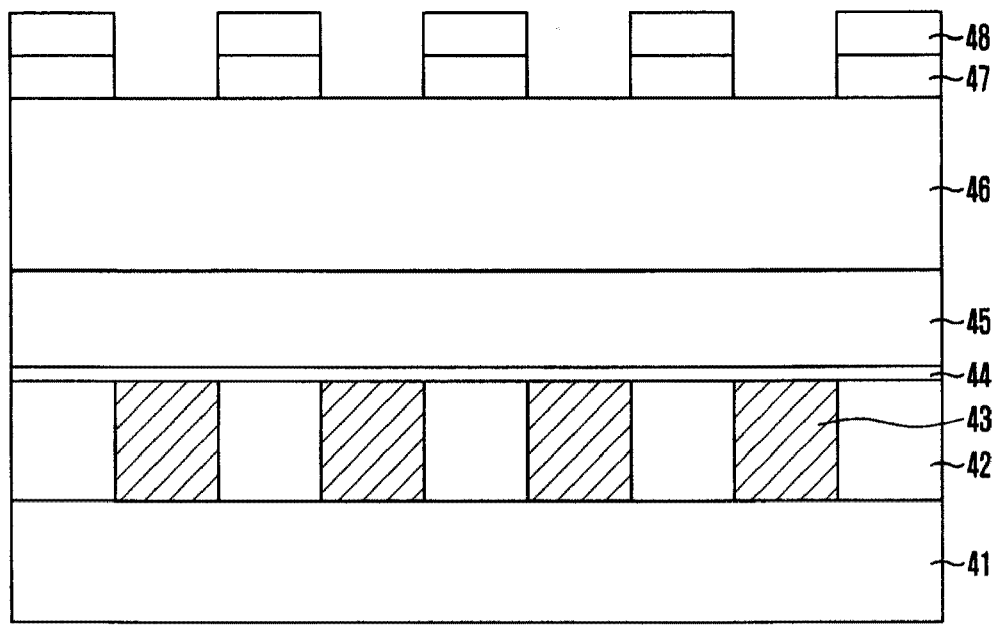
FIGS. 8A to 8J are cross-sectional views illustrating stages in a method of fabricating a semiconductor device in accordance with one or more embodiments.

Referring to FIG. 8A, after an inter-insulation layer 42 is formed over a substrate 41, a storage node contact hole penetrating the inter-insulation layer 42 is formed. Then, a storage node contact plug 43 filling up the storage node contact hole is formed. Although it is not shown, in general, bit lines and transistors including word lines are already formed before forming the inter-insulation layer 42. The inter-insulation layer 42 is formed of an oxide layer. The storage node contact plug 43 is formed by depositing a polysilicon layer or a metallic conductive layer and then performing an etch-back process on the deposited layer. Although it is not shown, a barrier metal may be formed on the storage node contact plug 43 and the barrier metal includes Ti or Ti/TiN.

Subsequently, an etch stop layer 44 is formed on the inter-insulation layer 42 including the storage node contact plug 43 therein. Herein, the etch stop layer 44 is used as an etch stop layer when etching a subsequent mold layer and may be formed of a silicon nitride ($Si_3N_4$) layer.

Then, a first and a second mold layer 45 and 46 are formed on the etch stop layer 44. A total thickness of the first and the second mold layers 45 and 46 may be in a range of 2,000 Å to 20,000 Å.

The first and the second mold layers 45 and 46 are formed of an insulation layer. The second mold layer 46 may have a thickness that is substantially the same as that of the first mold layer 45, or larger than or smaller than that of the first mold layer 45. The first mold layer 45 and the second mold layer 46 may be formed of materials having different etch rates against the same wet etch solution. For instance, the first mold layer 45 is formed of a material having a high wet etch rate and the second mold layer 46 is formed of a material having a wet etch rate that is lower than that of the first mold layer 45. The material having the high wet etch rate includes BPSG, SOD or PSG, and the material having the low wet etch rate includes LPTEOS or PETEOS. Therefore, the first mold layer 45 includes BPSG, SOD, or PSG and the second mold layer 46 includes LPTEOS or PETEOS. The high and low of the wet etch rate depends on an oxide etch solution. For example, the oxide etch solution includes a HF or BOE solution.

After forming the second mold layer 46, a planarization process may be performed so that a subsequent photo process is readily performed.

A first photoresist pattern 48 is formed by coating photoresist on the second mold layer 46 and patterning the photoresist through an exposure and development process. Herein, the first photoresist pattern 48 is a storage node mask where an open region is defined, wherein a storage node is formed in the open region. Prior to forming the first photoresist pattern 48, a first hard mask layer 47 may be formed of an amorphous carbon layer or a polysilicon layer on the second mold layer 46 and an anti-reflective coating layer (not shown) may be formed on the first hard mask layer 47.

Subsequently, the first hard mask layer 47 is etched using the first photoresist pattern 48 as an etch barrier.

Figure 8B:
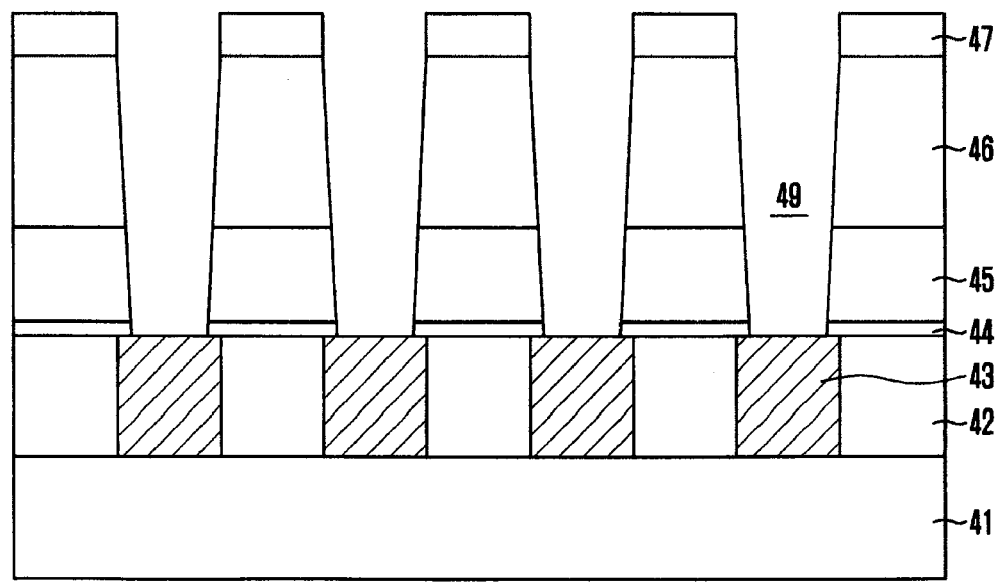

Referring to FIG. 8B, after removing the first photoresist pattern 48, the second mold layer 46 and the first mold layer 45 are etched using the first hard mask layer 47 as an etch barrier. As a result, a plurality of first open regions 49 are formed. Then, a top surface of the storage node contact plug 43 is exposed by etching the etch stop layer 44 below the first open regions 49.

The first open regions 49 are hole shape regions where a storage node is to be buried and, thus, they are referred to as storage node holes. In case of dry-etching the first mold layer 45 and the second mold layer 46, a sidewall of the first open region 49 may have a slope of 89° to 89.9°. Therefore, the first open regions 49 have a bottom CD that is smaller than a top CD thereof.

Figure 8C:
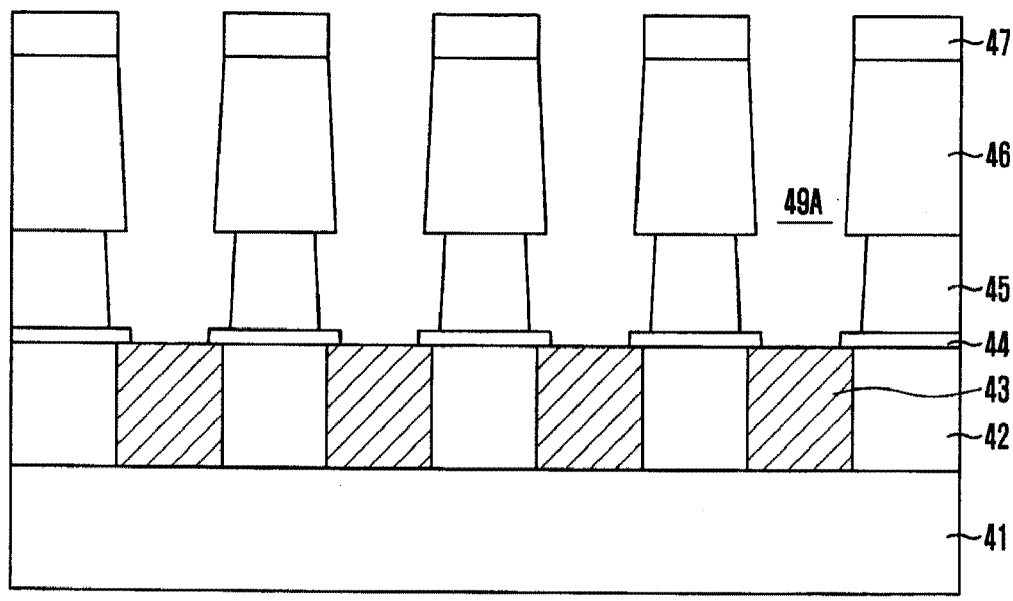

Referring to FIG. 8C, after removing the first hard mask layer 47, a wet etch process is performed. As a result, the first open region 49 is widened. Since the first and the second mold layers 45 and 46 are made of oxide materials, the wet etch process is performed using an oxide etch solution. Thus, the first and the second mold layers 45 and 46 are etched, and the first mold layer 45 having a high wet etch rate is etched relatively faster than the second mold layer 46 having a low wet etch rate. The widened first open region is represented by a reference numeral '49A'.

Figure 8D:
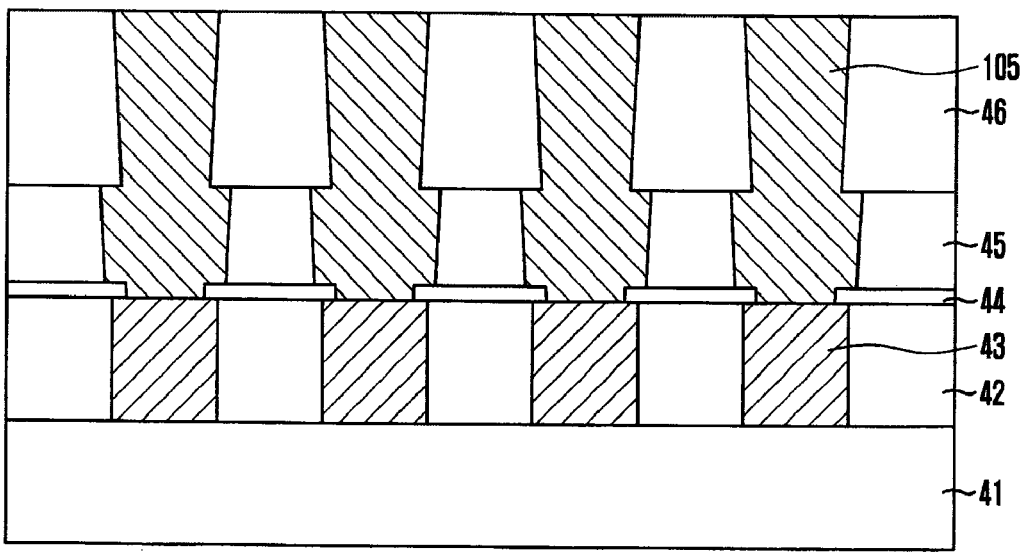

Referring to FIG. 8D, after depositing a first conductive layer to be used as a storage node on the second mold layer 46 until the first open region 49A is filled, a first storage node isolation process is performed. The first conductive layer includes one of a metallic nitride layer, a metal layer, and a combination thereof. For instance, the first conductive layer includes one of TiN, Ru, TaN, WN, Pt, Ir, and a combination thereof. Preferably, the first conductive layer is deposited using a CVD method or an ALD method to have a thickness of 200 Å to 900 Å and fills the first open region 49A without an empty space.

As described above, after depositing the first conductive layer, the first storage node isolation process is performed using a dry etch-back or CMP process. The first storage node isolation process is performed until a top surface of the second mold layer 46 is exposed, so that a first storage node 105 is formed to have a pillar shape buried in the first open region 49A. That is, through the CMP or dry etch-back process, there is removed the first conductive layer on the second mold layer 46 separated from the first open region 49A and thus the first storage node 105 is formed to fill the inside of the first open region 49A.

Since the first storage node 105 has a shape filling the inside of the first open region 49A, the first storage node 105 is formed as a pillar structure. Moreover, since the first open region 49A has a widened shape, the first storage node 105 has a step index structure whose lower portion is wider than an upper portion, so that a supporting force of the first storage node 105 is increased. First storage nodes adjacent to each other are insulated by the first and the second mold layers 45 and 46. The first storage node 105 may have an upper portion whose slope is larger than that of a lower portion.

Figure 8E:
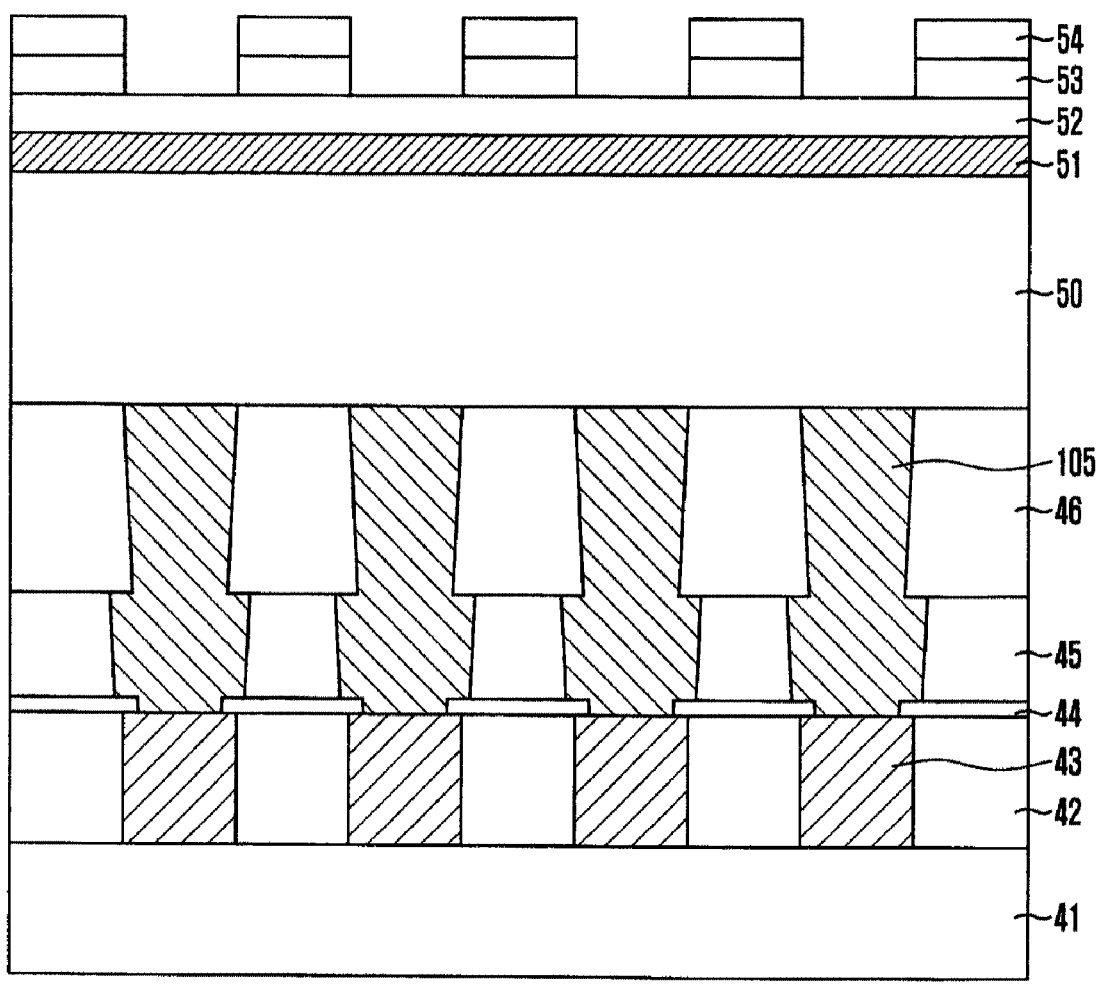

Referring to FIG. 8E, a third mold layer 50 is formed on the second mold layer 46 and the first storage node 105. The third mold layer 50 may include an insulation layer and, preferably, include an oxide layer. The third mold layer 50 may include an oxide layer such as BPSG, SOD, PSG, LPTEOS, or PETEOS. A thickness of the third mold layer 50 may be in a range of 2,000 Å to 20,000 Å. In one or more embodiments, the third mold layer 50 may have a thickness that is substantially the same as that of the second mold layer 46, or larger than or smaller than that of the second mold layer 46.

Then, a support layer 51 is formed on the third mold layer 50. The support layer 51 is formed to prevent the storage node from leaning in a subsequent wet dip out process and includes a nitride layer. The support layer 51 may have a thickness of 200 Å to 1,000 Å and may be formed of an undoped polysilicon layer.

A first sacrificial layer 52 is formed on the support layer 51. Herein, the first sacrificial layer 52 may include an oxide layer such as TEOS, BPSG, PSG, USG, SOD, or HDP. A thickness of the first sacrificial layer 52 may be in a range of 500 Å to 2,000 Å.

A second photoresist pattern 54 is formed by coating photoresist on the first sacrificial layer 52 and patterning the photoresist through an exposure and development process. Herein, the second photoresist pattern 54 defines an open region where a second storage node is to be formed. Prior to forming the second photoresist pattern 54, a second hard mask layer 53 may be formed of an amorphous carbon layer or a polysilicon layer on the first sacrificial layer 52 and an anti-reflective coating layer (not shown) may be formed on the second hard mask layer 53.

Subsequently, the second hard mask layer 53 is etched using the second photoresist pattern 54 as an etch barrier.

Figure 8F:
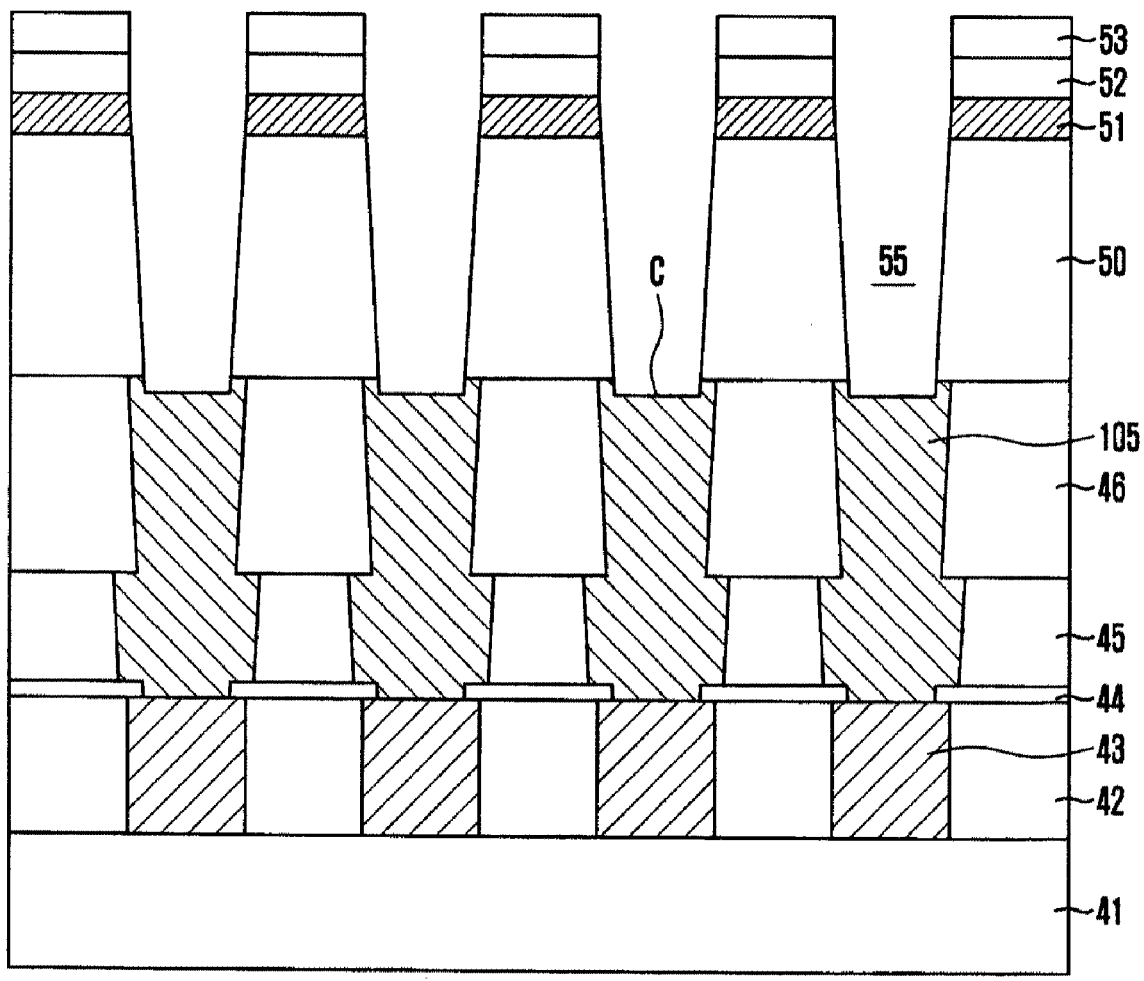

Referring to FIG. 8F, after removing the second photoresist pattern 54, the first sacrificial layer 52, the support layer 51, and the third mold layer 50 are etched using the second hard mask layer 53 as an etch barrier. As a result, a plurality of second open regions 55 are formed. Then, a top surface of the first storage node 105 is exposed by the second open regions 55. The second open regions 55 may have a top CD that is larger than a bottom CD and the bottom CD of the second open regions 55 are smaller than a top CD of the first open regions 49A.

The second open regions 55 are hole shape regions where the second storage node is to be buried and, thus, they are referred to as storage node holes. In case of dry-etching the third mold layer 50, a sidewall of the second open region 55 may have a slope of 89° to 89.9°. Thus, the second open region 55 has the top CD that is larger than the bottom CD. In the meantime, when performing an etch process to form the second open region 55, a top surface of the first storage node 105 is partially etched to form a groove C.

Figure 8G:
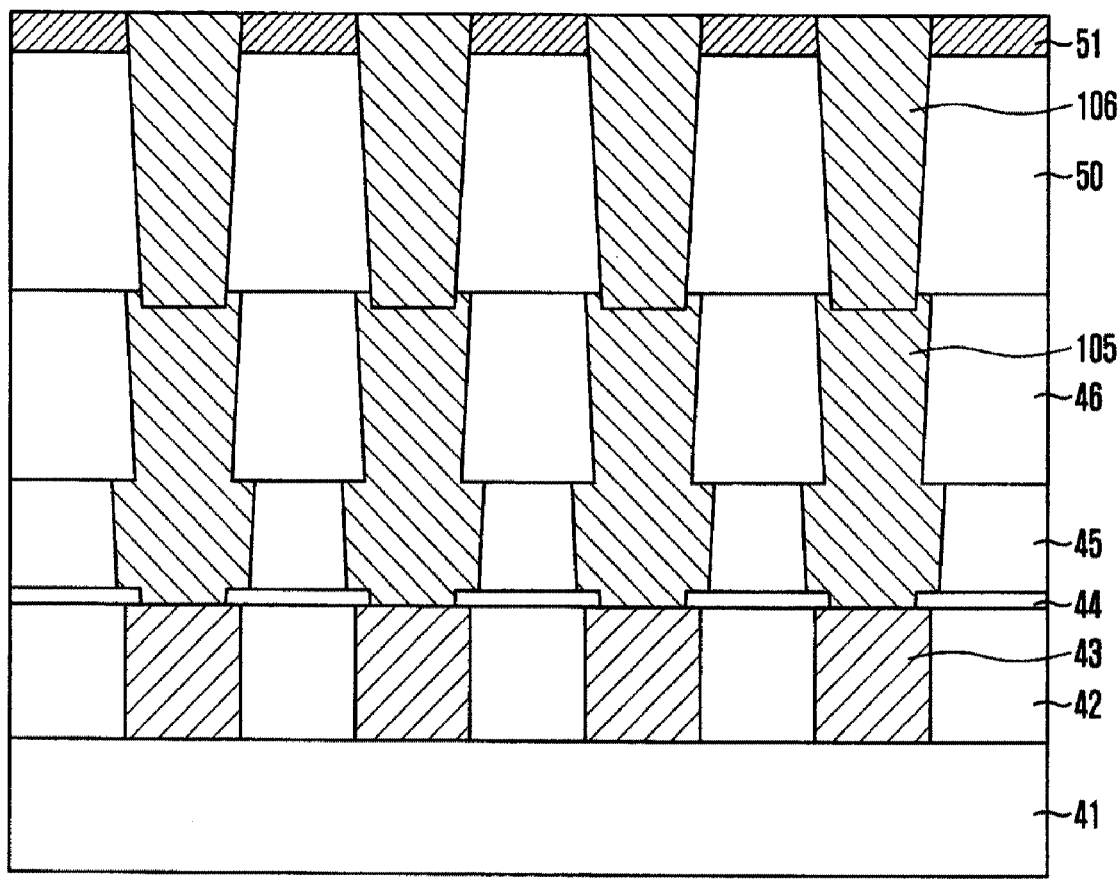

Referring to FIG. 8G, after removing the second hard mask layer 53, a second conductive layer to be used as a storage node is deposited on a whole surface of a resultant structure obtained by removing the second hard mask layer 53 until the second open region 55 is filled. Then, there is formed a pillar type second storage node 106 buried in the second open region 55 by performing a second storage node isolation process. The second conductive layer to be the second storage node 106 includes one of a metallic nitride layer, a metal layer and a combination thereof. For instance, the second conductive layer includes one of TiN, Ru, TaN, WN, Pt, Ir, and a combination thereof. The second conductive layer is deposited using a CVD method or an ALD method to have, for example, a thickness of 200 Å to 900 Å and fills the second open region 55 without an empty space. In the second storage node isolation process, the second conductive layer is etched using a dry etch-back or CMP process until the first sacrificial layer 52 is removed. The first sacrificial layer 52 serves to protect the support layer 51.

Since the second storage node 106 has a shape buried in the second open region 55, the second storage node 106 is formed as a pillar structure. Second storage nodes adjacent to each other are insulated by the third mold layer 50. Since the second open region 55 has a slope of a bottom CD being smaller than a top CD, the shape of the second open region 55 is transferred into the second storage node 106. Thus, the second storage node 106 has a shape of a bottom CD being smaller than a top CD. Since a lower portion of the second storage node 106 is disposed in the groove C formed in a top surface of the first storage node 105, the first storage node 105 and the second storage node 106 are firmly in contact with each other.

As described above, referring to a result of the second storage node 106 being formed, a storage node having a two-layered pillar structure is formed by stacking the first storage node 105 and the second storage node 106.

Figure 8H:
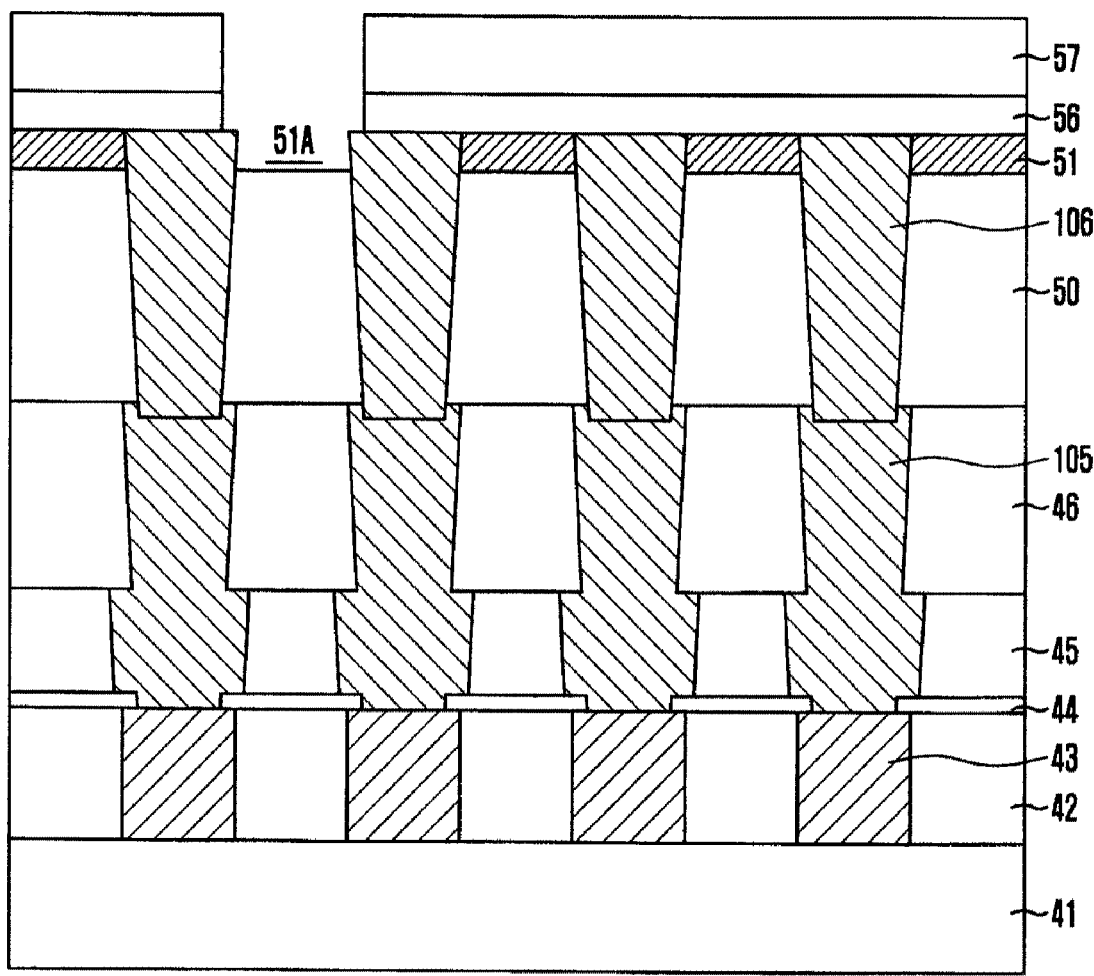

Referring to FIG. 8H, after forming a second sacrificial layer 56 on a whole surface of a resultant structure obtained as a result of processes illustrated in FIG. 8G, a third photoresist pattern 57 is formed on the second sacrificial layer 56. The second sacrificial layer 56 is etched using the third photoresist pattern 57 as an etch barrier and, sequentially, the support layer 51 is partially etched. When partially etching the support layer 51, a top surface of the second storage node 106 may be partially exposed.

As described above, an opening 51A is formed by partially etching the support layer 51, wherein a wet etch solution may infiltrate into the resultant structure through the opening 51A in a subsequent wet dip out process. The opening 51A formed in the support layer 51 may have a shape illustrated in FIG. 4B.

The opening 51A has a structure that allows a wet chemical solution to flow in when performing the wet dip out process and provides a path through which a reaction gas and a source gas for the deposition of a thin film are diffused while performing a subsequent process of depositing a dielectric layer. Thus, the opening 51A provides related to the step coverage of the dielectric layer.

When etching a portion of the support layer 51, the support layer 51 is etched to form the minimum opening 51A, thereby maintaining the supporting performance of the support layer 51. If the number or size of the opening 51A exceeds the desired number or size, the supporting performance of the support layer 51 may be deteriorated.

Figure 8I:
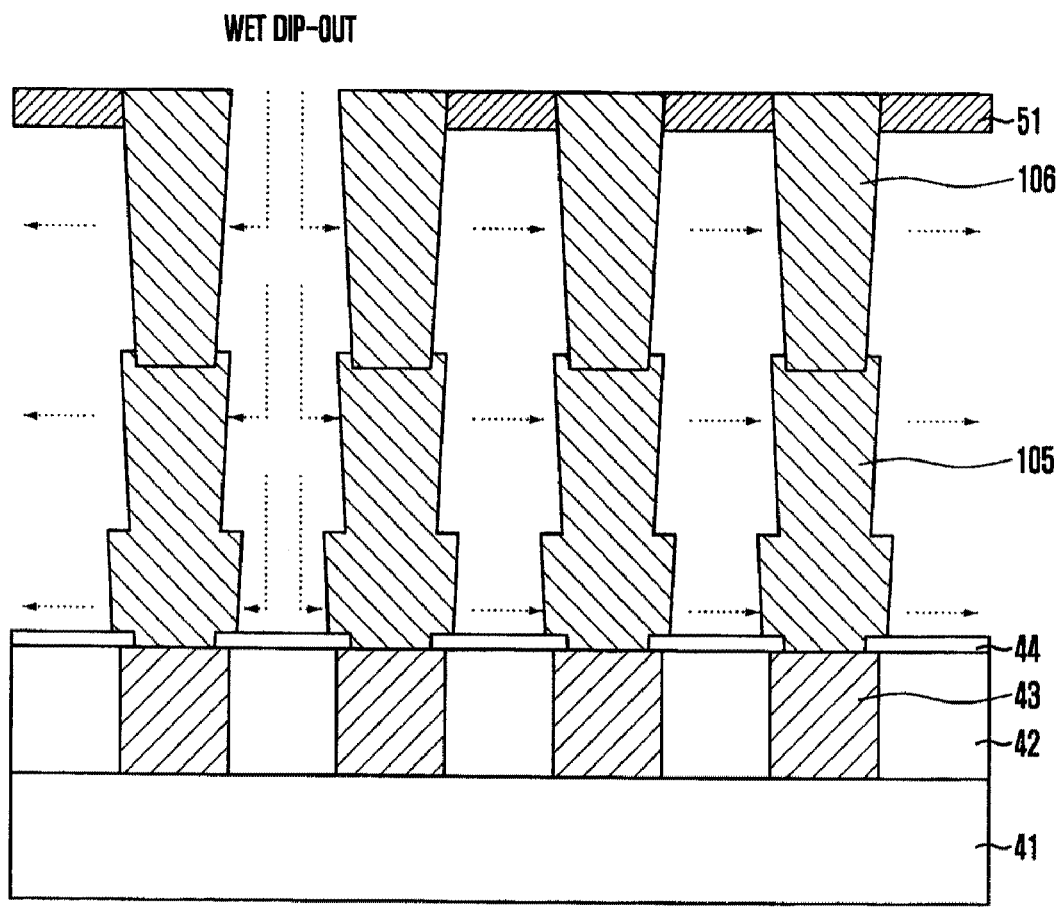

Referring to FIG. 8I, all of the mold layers are removed by performing a wet dip out process. Since the first to the third mold layers are formed of an oxide layer, the wet dip out process may be performed using a HF or BOE solution.

When performing the wet dip out process, the support layer 51 is not etched and remains to firmly connected to the multi-layered storage node, so that the multi-layered storage node does not lean. Moreover, since a shape of the storage node has a multi-layered, pillar structure, the storage node does not lean in the wet dip out process. The wet chemical does not infiltrate into a structure under the storage node since the etch stop layer 44 blocks the flow of the wet chemical.

Figure 8J:
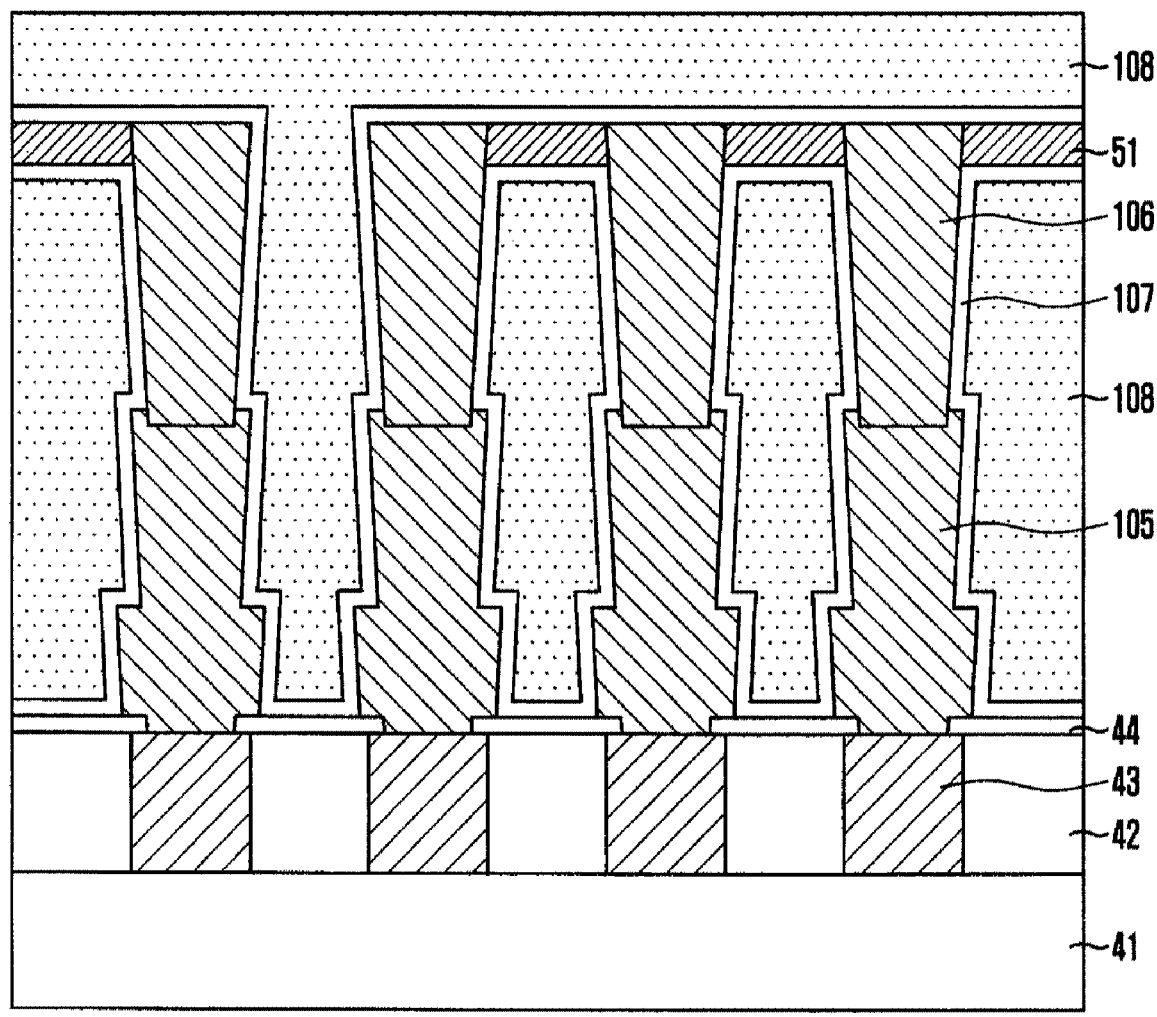

Referring to FIG. 8J, a dielectric layer 107 and a plate electrode 108 are formed. Since it is possible to sufficiently supply a source gas and a reaction gas through the opening provided by the support layer 51, the dielectric layer 107 and the plate electrode 108 may be more easily formed.

In one or more embodiments described above, methods for fabricating two-layered pillar type storage nodes are described. However, it is possible to form a 3 or more-layered pillar type storage node structure by repeatedly performing the deposition and etch process of the mold layer several times.

FIGS. 9A to 9K are cross-sectional views of a method of fabricating a semiconductor device in accordance with one or more embodiments.

Figure 9A:
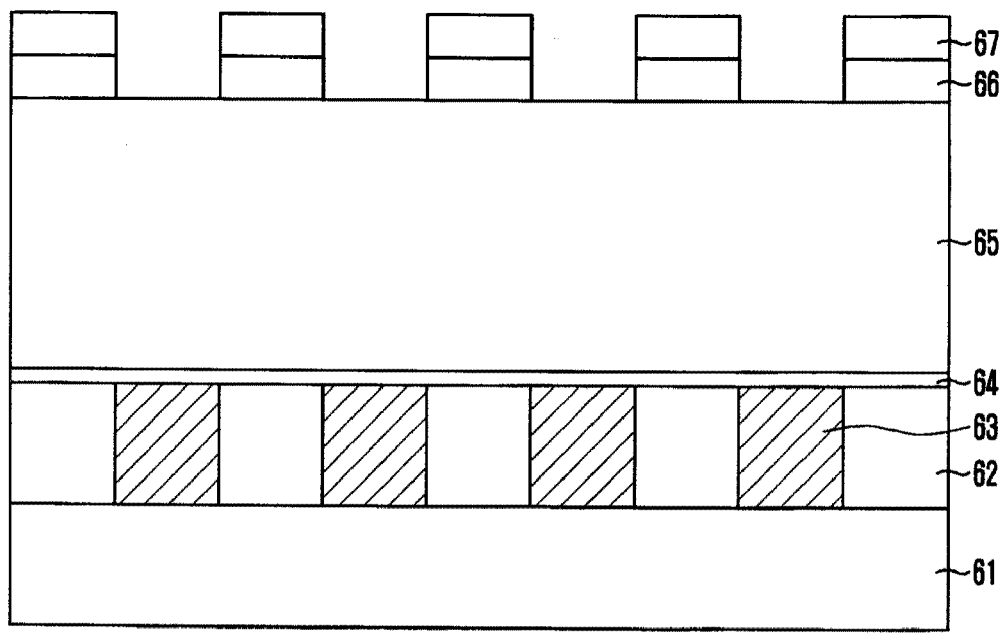
FIGS. 9A to 9K are cross-sectional views illustrating stages in a method of fabricating a semiconductor device in accordance with one or more embodiments.

Referring to FIG. 9A, after an inter-insulation layer 62 is formed over a substrate 61, there is formed a storage node contact hole penetrating the inter-insulation layer 62. Then, there is formed a storage node contact plug 63 buried in the storage node contact hole. Although it is not shown, in general, bit lines and transistors including word lines are already formed before forming the inter-insulation layer 62. The inter-insulation layer 62 is formed of an oxide layer. The storage node contact plug 63 is formed by depositing a polysilicon layer or a metallic conductive layer and then performing an etch-back process on the deposited layer. Although it is not shown, a barrier metal may be formed on the storage node contact plug 63 and the barrier metal includes Ti or Ti/TiN.

Subsequently, an etch stop layer 64 is formed on the inter-insulation layer 62 including the storage node contact plug 63. Herein, the etch stop layer 64 is used as an etch stop layer when etching a subsequent mold layer and may be formed of a silicon nitride ($Si_3N_4$) layer. Herein, although it is not shown, a buffer oxide layer may be further formed on the etch stop layer 64.

Then, a first mold layer 65 is formed on the etch stop layer 64. The first mold layer 65 is formed of an insulation layer. Specially, the first mold layer 65 is formed by depositing an oxide layer to have a thickness capable of securing an area required in achieving the desired charge capacitance. The first mold layer 65 may include an oxide layer such as BPSG, SOD, PSG, LPTEOS or PETEOS, and may have a thickness of 2,000 Å to 20,000 Å.

After forming the first mold layer 65, a planarization process may be performed so that a subsequent photo process is more easily performed.

A first photoresist pattern 67 is formed by coating photoresist on the first mold layer 65 and patterning the photoresist through an exposure and development process. Herein, the first photoresist pattern 67 is a storage node mask where an open region is defined, wherein a storage node is to be formed in the open region. Prior to forming the first photoresist pattern 67, a first hard mask layer 66 may be formed of an amorphous carbon layer or a polysilicon layer on the first mold layer 65 and an anti-reflective coating layer (not shown) may be formed on the first hard mask layer 66.

Subsequently, the first hard mask layer 66 is etched using the first photoresist pattern 67 as an etch barrier.

Figure 9B:
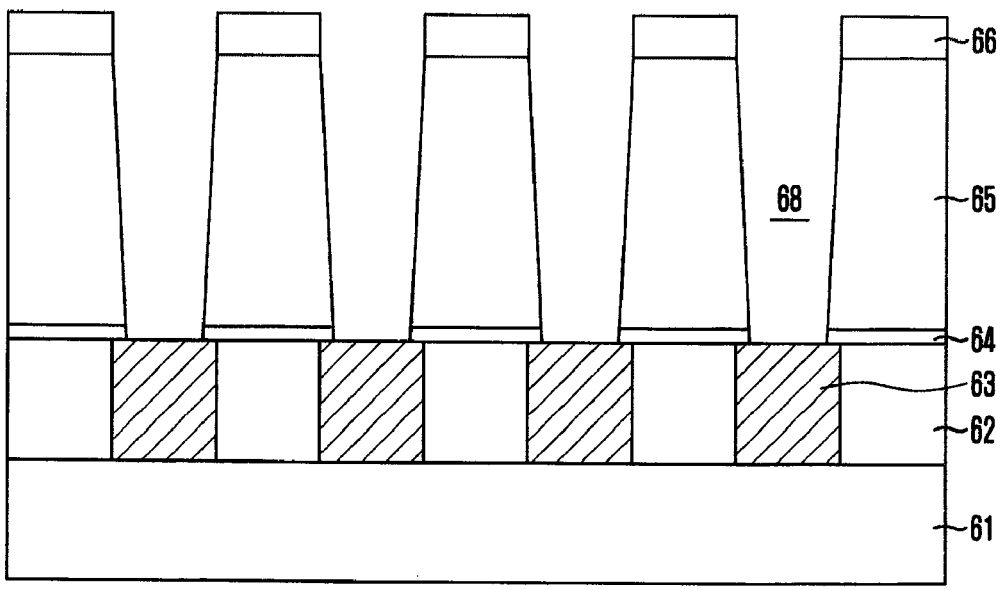

Referring to FIG. 9B, after removing the first photoresist pattern 67, the first mold layer 65 is etched using the first hard mask layer 66 as an etch barrier. As a result, a plurality of first open regions 68 are formed. Then, a top surface of the storage node contact plug 63 is exposed by etching the etch stop layer 64 below the first open regions 68.

The first open regions 68 are hole shaped regions where a storage node is to be buried and, thus, they are referred to as storage node holes. In case of dry-etching the first mold layer 65, a sidewall of the first open region 68 may have a slope of 89° to 89.9°. Thus, the first open region 68 has a bottom CD that is smaller than a top CD thereof.

Figure 9C:
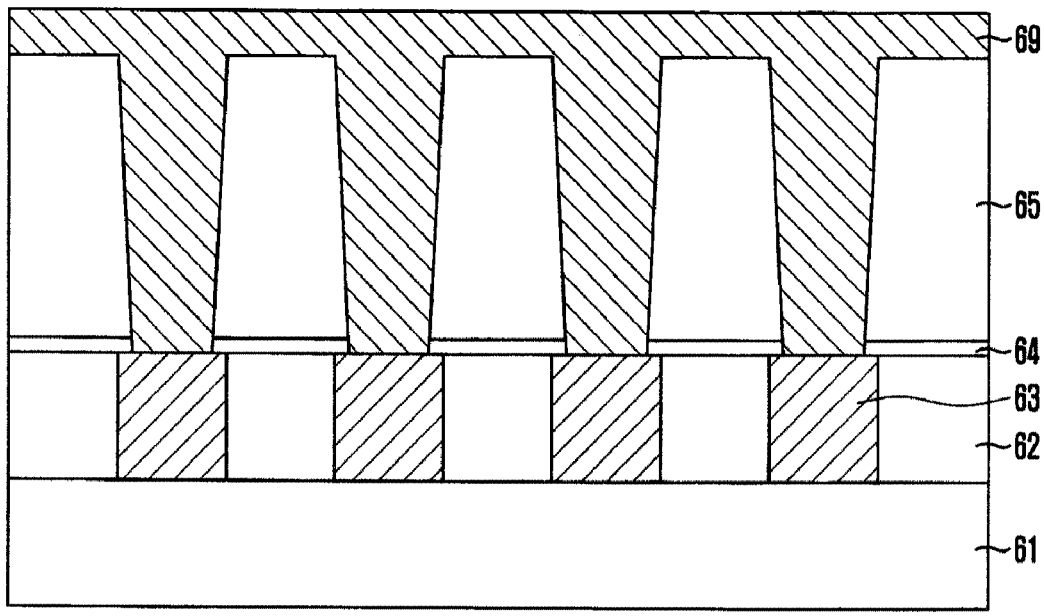

Referring to FIG. 9C, after removing the first hard mask layer 66, a first conductive layer 69 to be used as a storage node is deposited on the first mold layer 65 until the first open region 68 is filled. The first conductive layer 69 includes one of a metallic nitride layer, a metal layer and a combination thereof. For instance, the first conductive layer 69 includes one of TiN, Ru, TaN, WN, Pt, Ir, and a combination thereof.

Preferably, the first conductive layer 69 is deposited using a CVD method or an ALD method to have a thickness of 200 Å to 900 Å and fills the first open region 68 without an empty space.

Figure 9D:
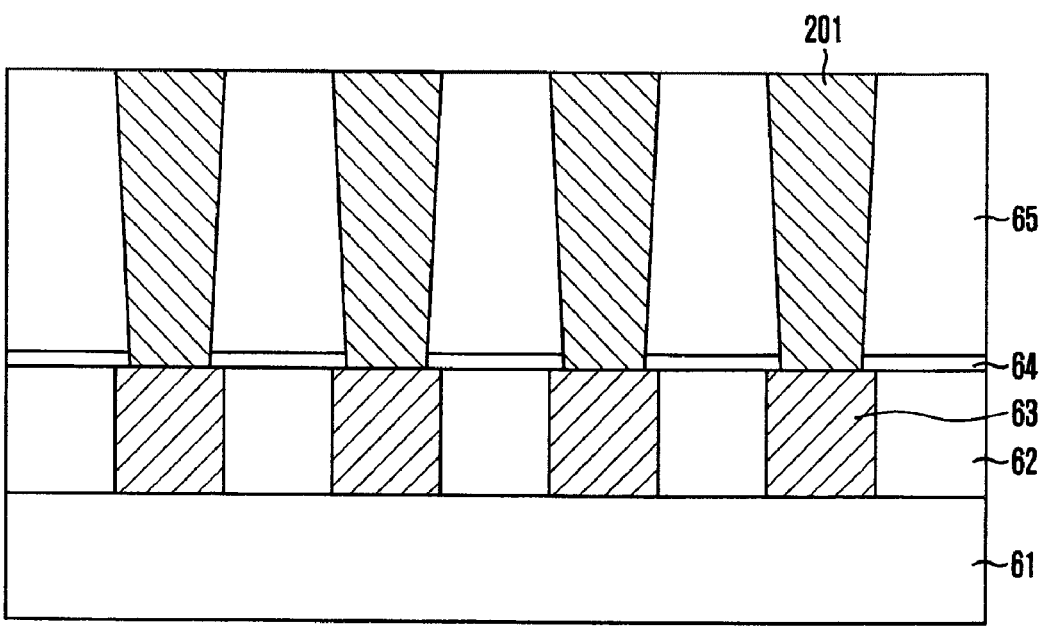

As described above, after depositing the first conductive layer 69, a first storage node isolation process is performed as illustrated in FIG. 9D.

Referring to FIG. 9D, in the first storage node isolation process, the first conductive layer 69 is etched using a dry etch-back or CMP process. The first storage node isolation process is performed until a top surface of the first mold layer 65 is exposed, so that a first storage node 201 is formed to have a pillar shape buried in the first open region 68. Through the CMP or dry etch-back process, the first conductive layer 69 on the first mold layer 65 separated from the first open region 68 is removed and thus the first storage node 201 is formed to fill the inside of the first open region 68.

Since the first storage node 201 has a shape filling the inside of the first open region 68, the first storage node 201 is formed as a pillar structure. First storage nodes adjacent to each other are insulated by the first mold layer 65.

Since the first open region 68 has a slope of a bottom CD being smaller than a top CD, the shape of the first open region 68 is transferred into the first storage node 201. Thus, the first storage node 201 has a shape with a bottom CD smaller than a top CD.

Figure 9E:
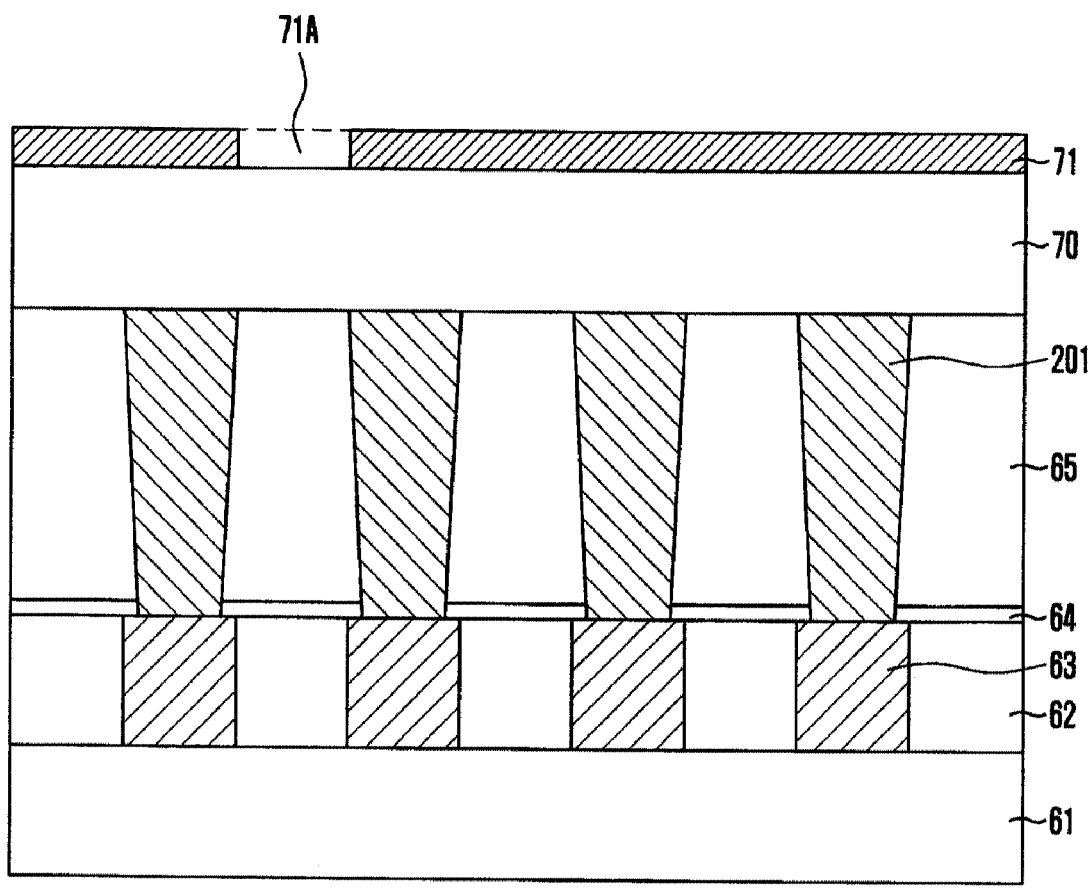

Referring to FIG. 9E, a second mold layer 70 is formed on the first mold layer 65 including the first storage node 201. The second mold layer 70 may include an insulation layer and, preferably, include an oxide layer. The second mold layer 70 may include an oxide layer such as BPSG, SOD, PSG, LPTEOS or PETEOS. In one or more embodiments, a thickness of the second mold layer 70 is in a range of 2,000 Å to 20,000 Å. Herein, the second mold layer 70 may have a thickness that is smaller than that of the first mold layer 65.

Then, a support layer 71 is formed on the second mold layer 70. The support layer 71 is formed to prevent the storage node from leaning in a subsequent wet dip out process and includes a nitride layer. The support layer 71 may have a thickness of 200 Å to 1,000 Å and may be formed of an undoped polysilicon layer.

An opening 71A is formed by partially etching the support layer 71, wherein the opening 71A becomes a path through which a wet chemical infiltrates. The opening 71A corresponds to a component described as an opening in the above-described embodiments.

Figure 9F:
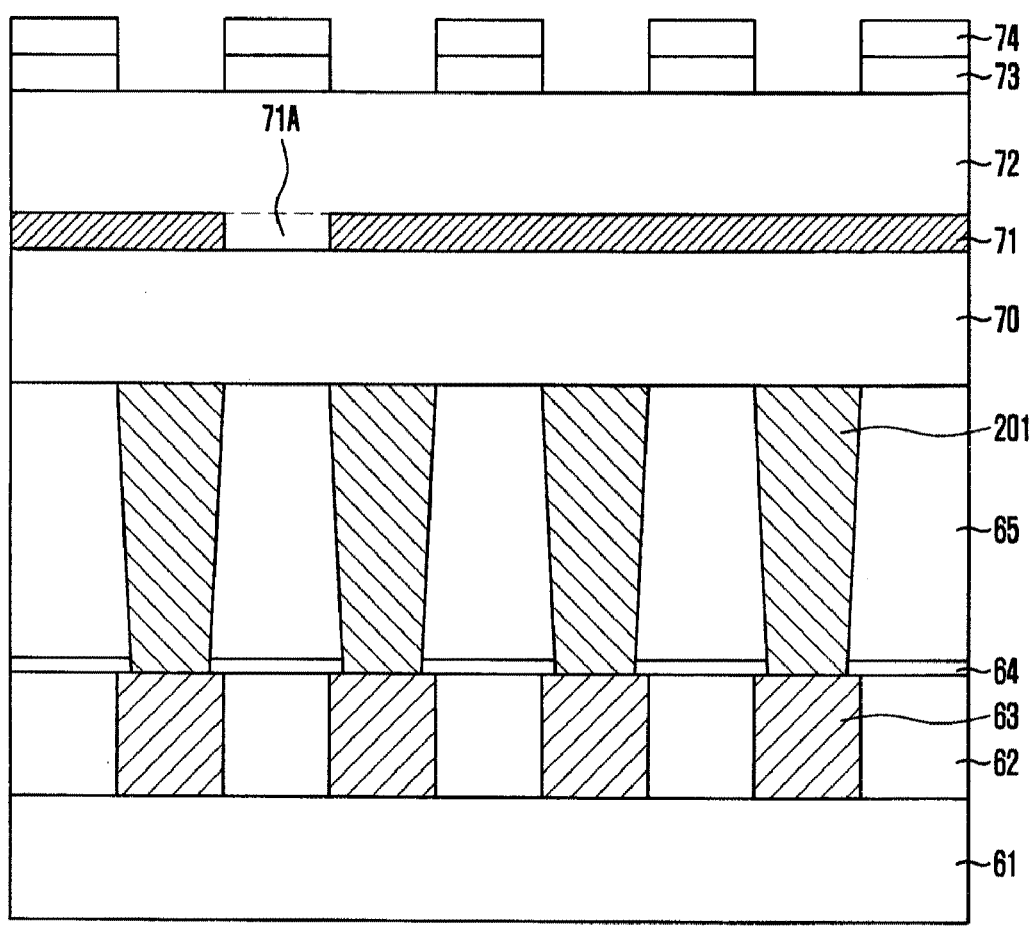

Referring to FIG. 9F, a third mold layer 72 is formed on the support layer 71 where the opening 71A is formed. The third mold layer 72 may include an oxide layer such as TEOS, BPSG, PSG, USG, SOD, or HDP.

Then, a second photoresist pattern 74 is formed by coating photoresist on the third mold layer 72 and patterning the photoresist through an exposure and development process. Herein, the second photoresist pattern 74 defines an open region where a second storage node is to be formed. Prior to forming the second photoresist pattern 74, a second hard mask layer 73 may be formed of an amorphous carbon layer or a polysilicon layer on the third mold layer 72 and an anti-reflective coating layer (not shown) may be formed on the second hard mask layer 73.

Subsequently, the second hard mask layer 73 is etched using the second photoresist pattern 74 as an etch barrier.

Figure 9G:
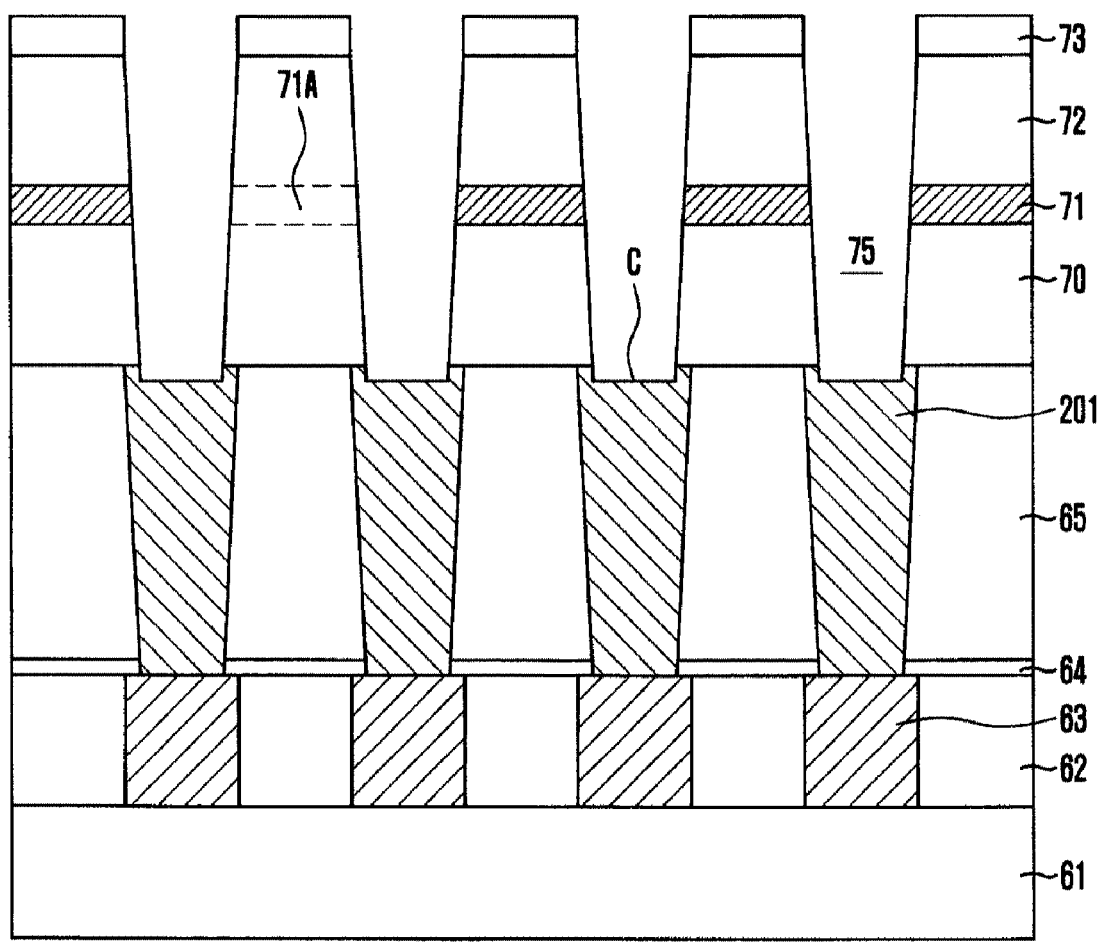

Referring to FIG. 9G, after removing the second photoresist pattern 74, the third mold layer 72, the support layer 71, and the second mold layer 70 are etched using the second hard mask layer 73 as an etch barrier. As a result, a plurality of second open regions 75 are formed. Then, a top surface of the first storage node 201 is exposed by the second open regions 75. The second open regions 75 may have substantially the same size and shape as those of the first open regions 68.

The second open regions 75 are hole shaped regions where the second storage node is to be buried; thus, they are referred to as a storage node holes. In case of dry-etching the second and the third mold layers 70, 72, the support layer 71, and a sidewall of the second open region 75 may have a slope of 89° to 89.9°. Thus, the second open region 75 has a bottom CD that is smaller than a top CD thereof. When performing a dry-etching process to form the second open region 75, the first storage node 201 is over-etched to form a groove C in a top surface thereof.

Meanwhile, since the support layer does not exist in the opening 71A, formed in the support layer 71, the etching process is not performed on the opening 71A. In a region separated from the opening 71A, the support layer 71 is etched and the second mold layer 70 disposed under the support layer 71.

Figure 9H:
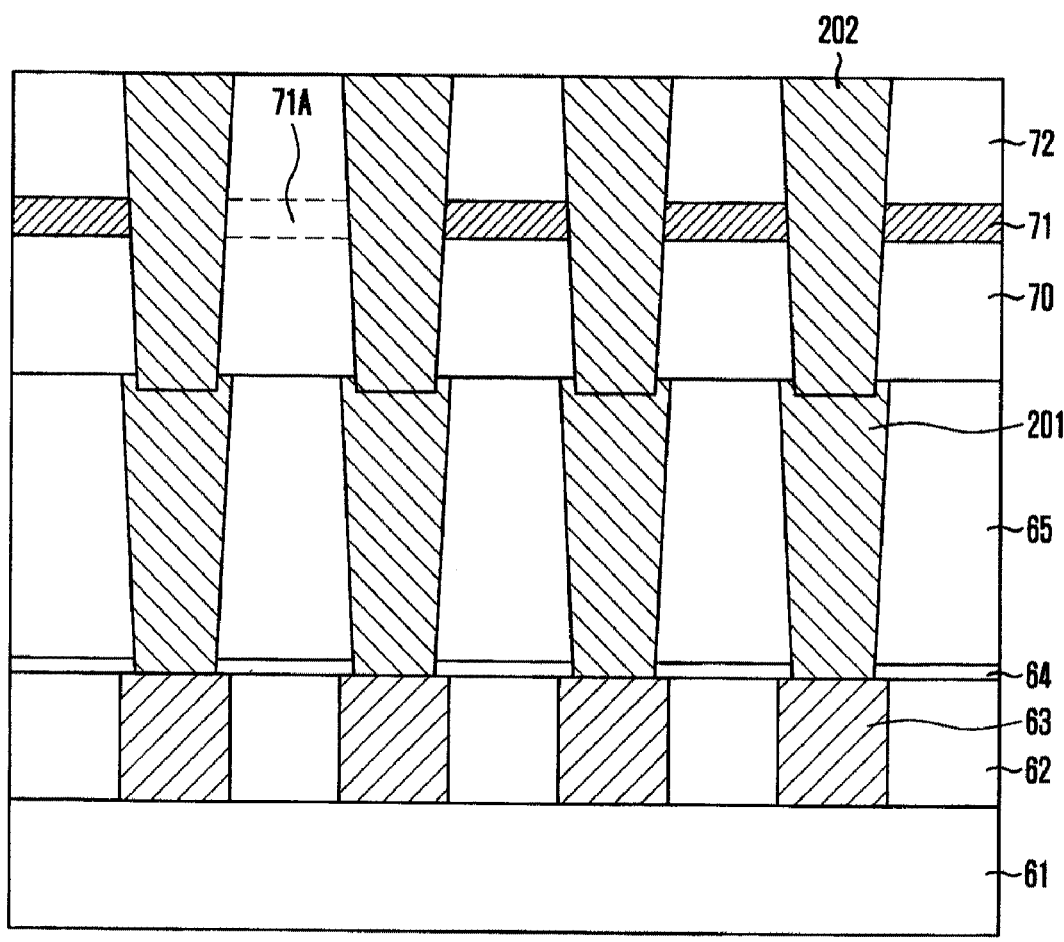

Referring to FIG. 9H, after removing the second hard mask layer 73, a second conductive layer to be used as a storage node is deposited on a whole surface of a resultant structure where the second hard mask layer 73 is removed until the second open region 75 is filled. Then, there is formed a pillar type second storage node 202 buried in the second open region 75 by performing a second storage node isolation process. The second conductive layer to be the second storage node 202 includes one of a metallic nitride layer, a metal layer and a combination thereof. For instance, the second conductive layer includes one of TiN, Ru, TaN, WN, Pt, Ir, and a combination thereof. The second conductive layer is deposited using a CVD method or an ALD method, may have a thickness of 200 Å to 900 Å and fills the second open region 75 without an empty space. In the second storage node isolation process, a dry etch-back or CMP process is used.

Since the second storage node 202 has a shape buried in the second open region 75, the second storage node 202 is formed as a pillar structure. Second storage nodes adjacent to each other are insulated by the second and the third mold layers 70 and 72. Since the second open region 75 has a slope of a bottom CD being smaller than a top CD, the shape of the second open region 75 is transferred into the second storage node 202. Thus, the second storage node 202 has a shape of a bottom CD being smaller than a top CD. Since a lower portion of the second storage node 202 is disposed in the groove C formed in the top surface of the first storage node 201, the first storage node 201 and the second storage node 202 are in firm contact with each other.

As described above, referring to a result of the second storage node 202 being formed, a storage node having a two-layered pillar structure is formed by stacking the first storage node 201 and the second storage node 202.

Figure 9I:
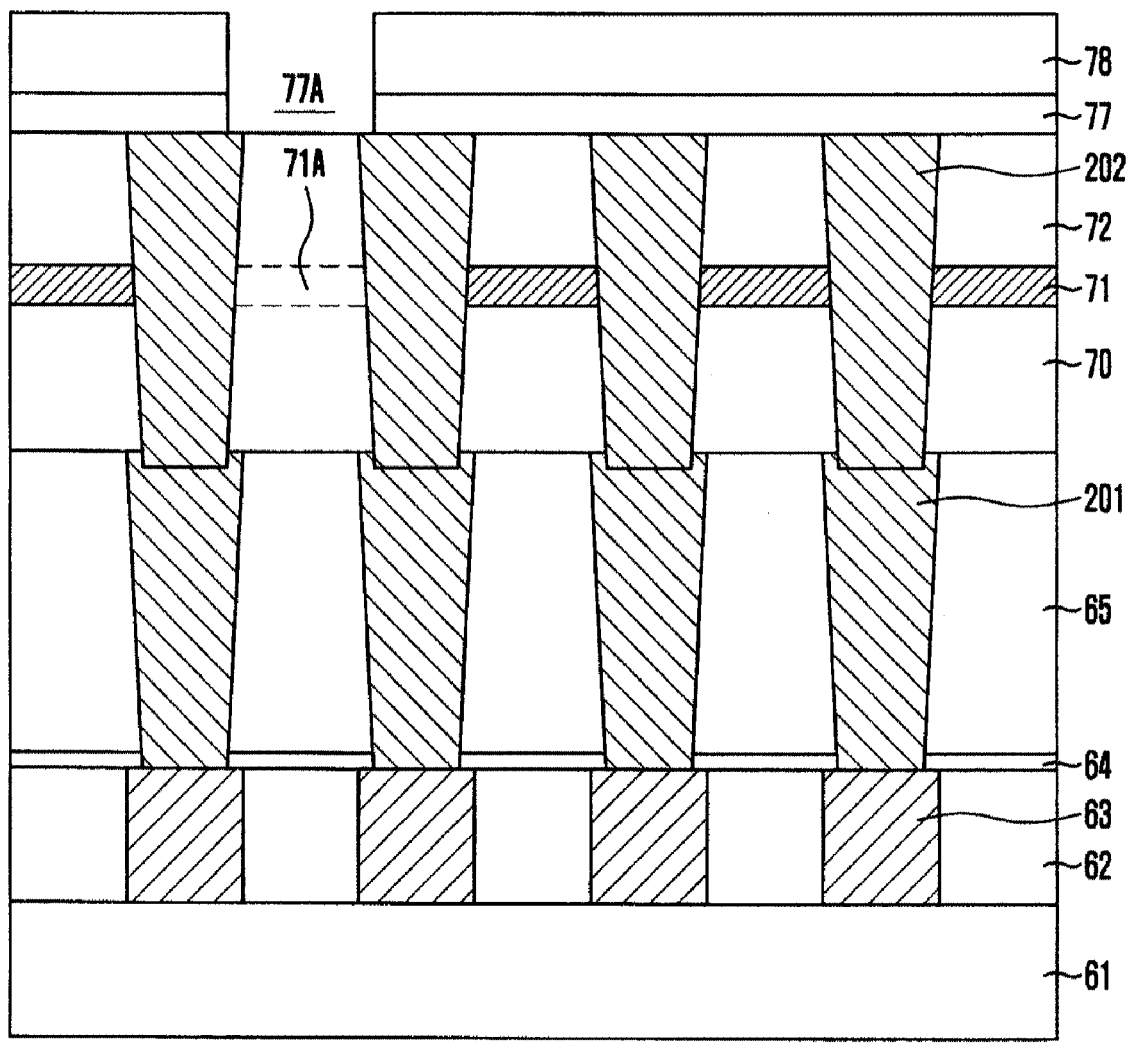

Referring to FIG. 9I, after forming a sacrificial layer 77 on a whole surface of a resultant structure formed as a result of processes illustrated in FIG. 9H, a third photoresist pattern 78 is formed. The sacrificial layer 77 may include an oxide layer.

A portion of the sacrificial layer 77 is etched using the third photoresist pattern 78 as an etch barrier. As described above, by etching the portion of the sacrificial layer 77, a path 77A is formed, through which a wet etch solution infiltrates when performing a subsequent wet dip out process. The path 77A formed in the sacrificial layer 77 has a shape corresponding to the opening 71A formed in the support layer 71.

In one or more embodiments, the forming of the sacrificial layer 77 and the third photoresist pattern 78 may be omitted. That is, the wet dip out process is directly performed to etch the mold layers without forming the sacrificial layer 77 and the third photoresist pattern 78.

Figure 9J:
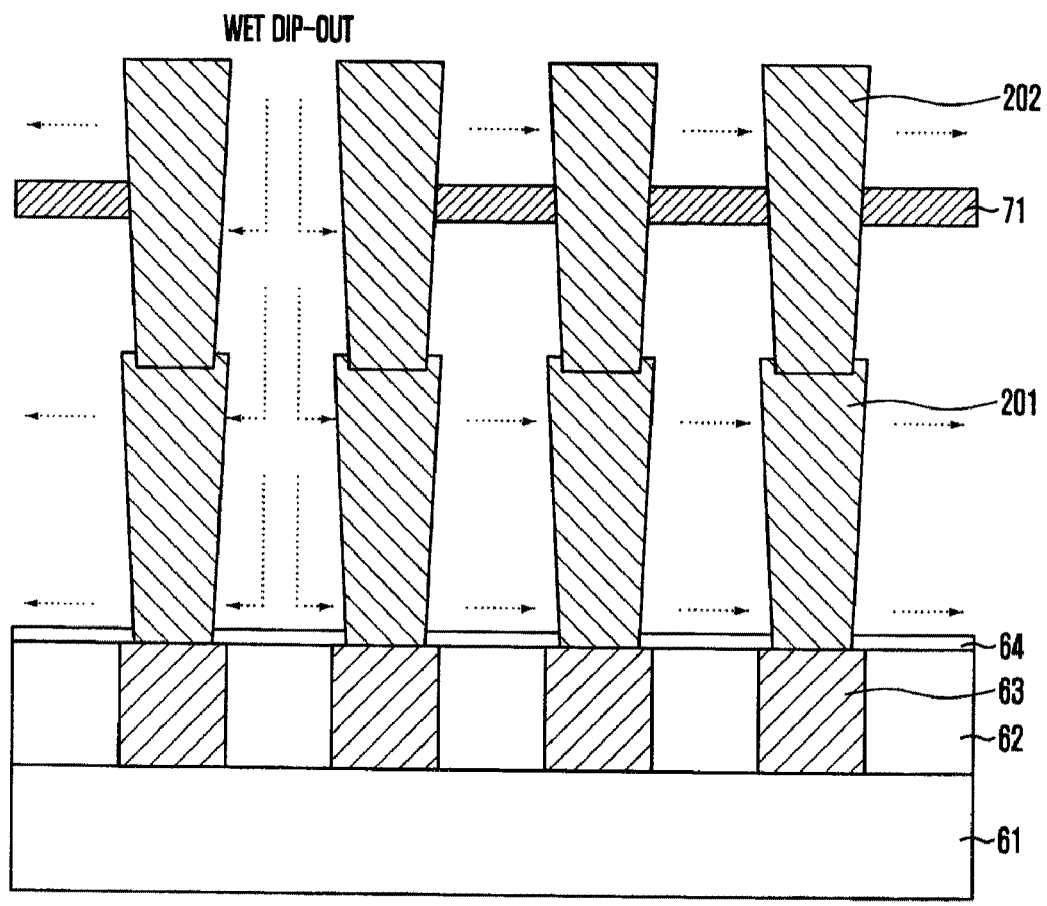

Referring to FIG. 9J, all of the mold layers are removed by performing the wet dip out process. Since the first to the third mold layers 65, 70, and 72 are each formed of an oxide layer, the wet dip out process may be performed using a wet chemical such as a HF or BOE solution. The wet chemical infiltrates through the path 77A formed in the sacrificial layer 77 and etches the third mold layer 72. Then, the wet chemical infiltrates through the opening 71A of the support layer 71 and etches the first and the second mold layers 65 and 70.

When performing the wet dip out process, the support layer 71 is not etched and remains to firmly fixed to the multi-layered storage node, so that the multi-layered storage node does not lean. Moreover, since a shape of the storage node has a multi-layered, pillar structure, the storage node does not lean in the wet dip out process. The wet chemical does not infiltrate into a structure under the storage node since the etch stop layer 64 blocks the flow of the wet chemical.

Figure 9K:
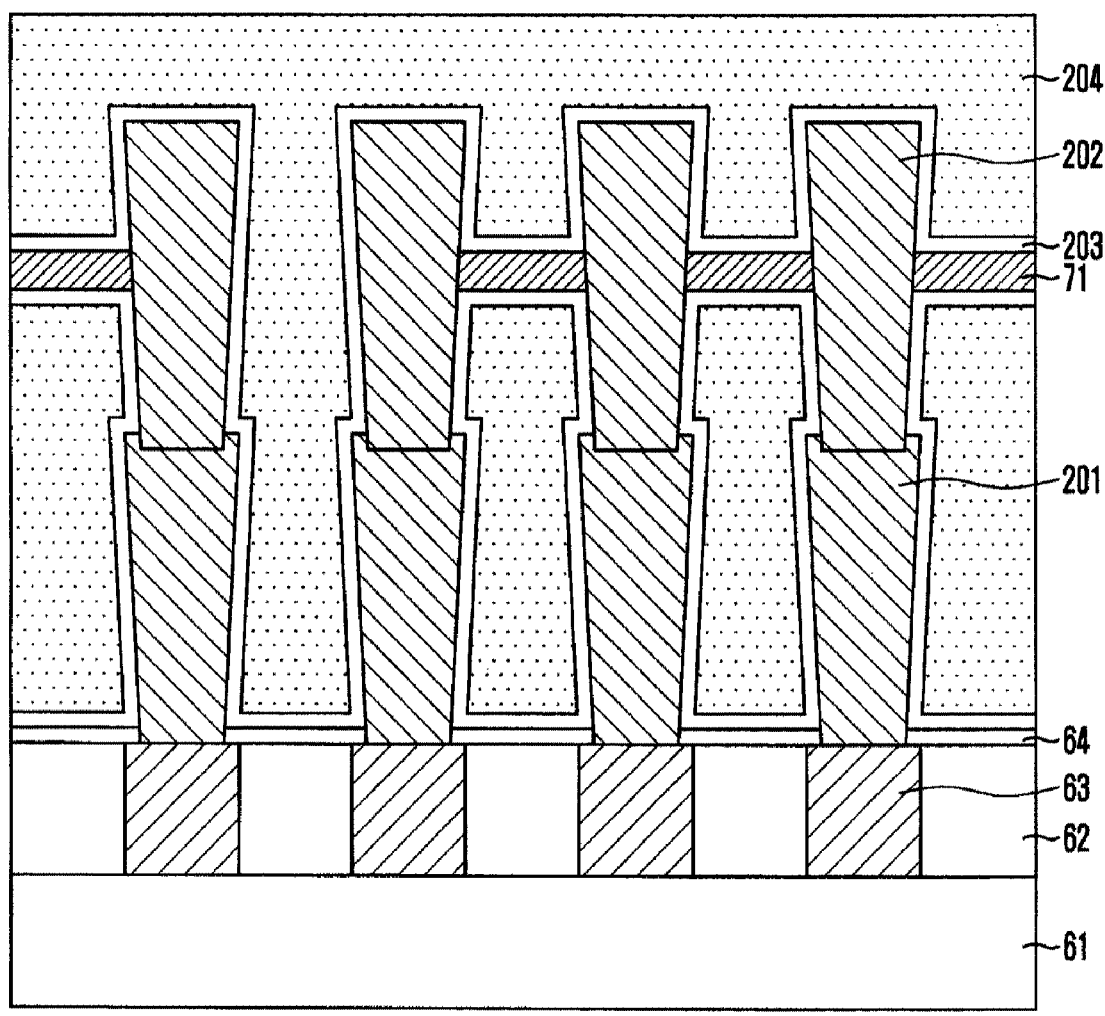

Referring to FIG. 9K, a dielectric layer 203 and a plate electrode 204 are formed. Since it is possible to sufficiently supply a source gas and a reaction gas through the opening 71A provided by the support layer 71, the dielectric layer 203 and the plate electrode 204 may be more easily formed. Moreover, since the support layer 71 is formed in a middle portion of the second storage node 202, it is possible to uniformly deposit the dielectric layer 203 and the plate electrode 204 without voids.

FIGS. 10A to 10K are cross-sectional views of a method of fabricating a semiconductor device in accordance with one or more embodiments.

Figure 10A:
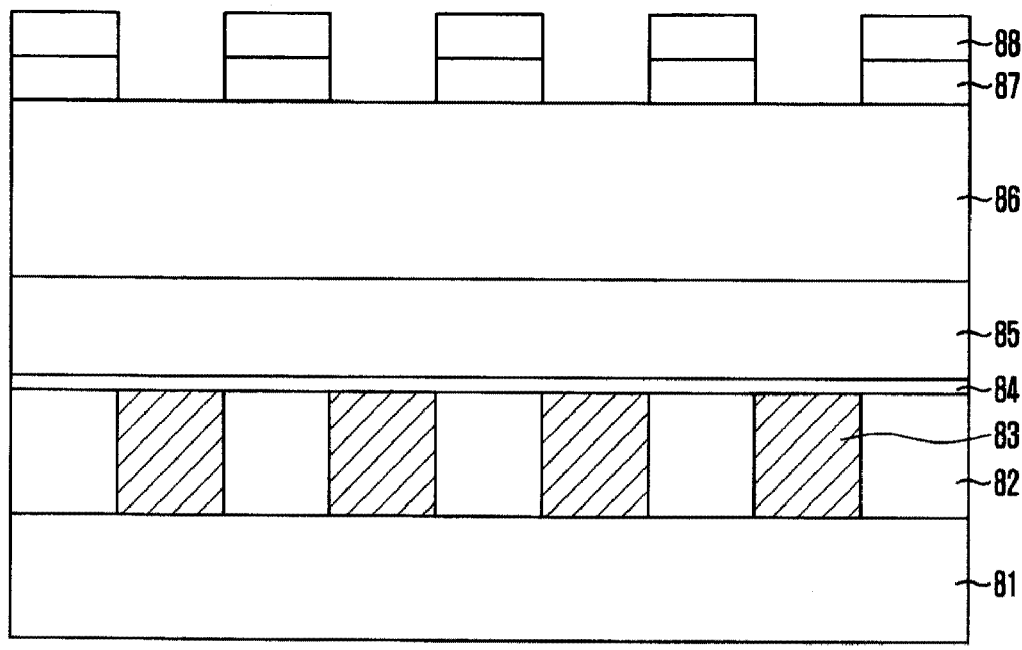
FIGS. 10A to 10K are cross-sectional views illustrating stages in a method of fabricating a semiconductor device in accordance with one or more embodiments.

Referring to FIG. 10A, after an inter-insulation layer 82 is formed over a substrate 81, a storage node contact hole penetrating the inter-insulation layer 82 is formed. Then, a storage node contact plug 83 filling up the storage node contact hole is formed. Although it is not shown, in general, bit lines and transistors including word lines are already formed before forming the inter-insulation layer 82. The inter-insulation layer 82 is formed of an oxide layer. The storage node contact plug 83 is formed by depositing a polysilicon layer or a metallic conductive layer and then performing an etch-back process on the deposited layer. Although it is not shown, a barrier metal may be formed on the storage node contact plug 83 and the barrier metal includes Ti or Ti/TiN.

Subsequently, an etch stop layer 84 is formed on the inter-insulation layer 82 and the storage node contact plug 83. Herein, the etch stop layer 84 is used as an etch stop layer when etching a subsequent mold layer and may be formed of a silicon nitride ($Si_3N_4$) layer.

Then, a first and a second mold layer 85 and 86 are formed on the etch stop layer 84. A total thickness of the first and the second mold layers 85 and 86 may be in a range of 2,000 to 20,000 Angstroms.

The first and the second mold layers 85 and 86 are formed with an insulation layer. The second mold layer 86 may have a thickness that is substantially the same as that of the first mold layer 85, or larger than or smaller than that of the first mold layer 85. The first mold layer 85 and the second mold layer 86 may be formed of materials having different wet etch rates against the same wet etch solution. For instance, in one or more embodiments, the first mold layer 85 is formed of a material having a high wet etch rate and the second mold layer 86 is formed of a material having a wet etch rate that is lower than that of the first mold layer 85. The material having the high wet etch rate includes BPSG, SOD or PSG, and the material having the low wet etch rate includes LPTEOS or PETEOS. Therefore, the first mold layer 85 includes BPSG, SOD or PSG and the second mold layer 86 includes LPTEOS or PETEOS. The high and low of the wet etch rate depends on an oxide etch solution, which includes HF or BOE etch solution.

After forming the second mold layer 86, a planarization process may be performed so that a subsequent photo process is more easily performed.

A first photoresist pattern 88 is formed by coating photoresist on the second mold layer 86 and patterning the photoresist through an exposure and development process. Herein, the first photoresist pattern 88 is a storage node mask where an open region is defined, wherein a storage node is to be formed in the open region. Prior to forming the first photoresist pattern 88, a first hard mask layer 87 may be formed of an amorphous carbon layer or a polysilicon layer on the second mold layer 86 and an anti-reflective coating layer (not shown) may be formed on the first hard mask layer 87.

Subsequently, the first hard mask layer 87 is etched using the first photoresist pattern 88 as an etch barrier.

Figure 10B:
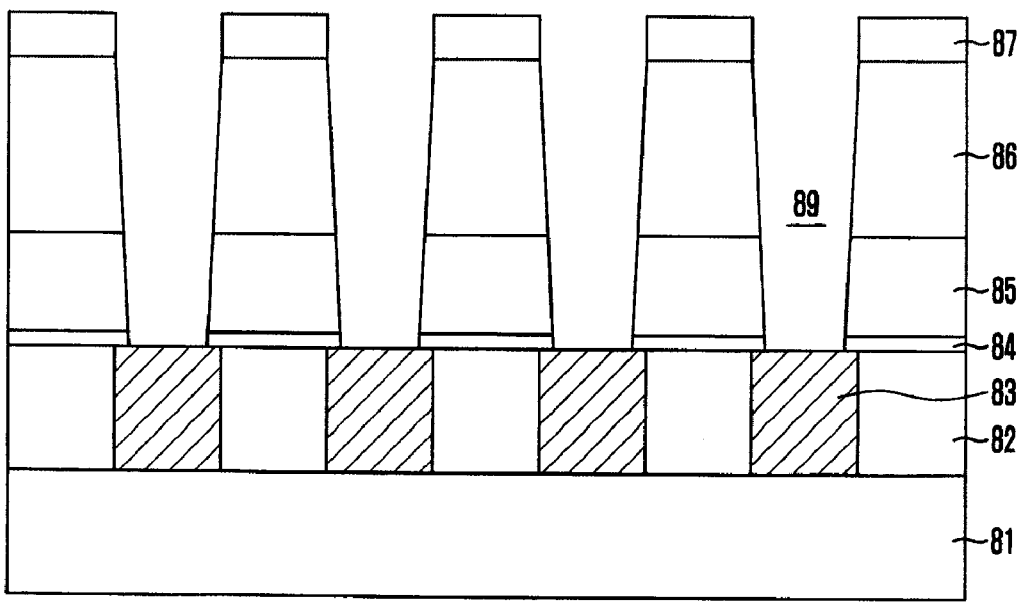

Referring to FIG. 10B, after removing the first photoresist pattern 88, the second mold layer 86 and the first mold layer 85 are etched using the first hard mask layer 87 as an etch barrier. As a result, a plurality of first open regions 89 are formed. Then, a top surface of the storage node contact plug 83 is exposed by etching the etch stop layer 84 below the first open regions 89.

The first open regions 89 are hole shape regions where a storage node is buried. Thus, they are referred to as storage node holes. In case of dry-etching the first mold layer 85 and the second mold layer 86, a sidewall of the first open region 89 may have a slope of 89° to 89.9°. Therefore, the first open region 89 has a bottom CD that is smaller than a top CD thereof.

Figure 10C:
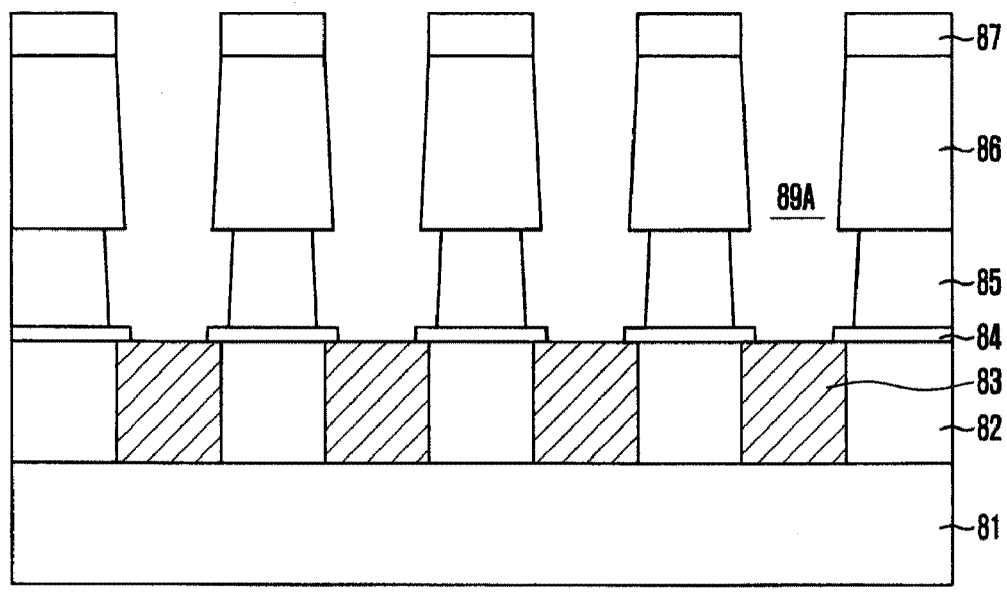

Referring to FIG. 10C, after removing the first hard mask layer 87, a wet etch process is performed. As a result, the first open region 89 is widened. Since the first and the second mold layers 85 and 86 are made of oxide materials, the wet etch process is performed using an oxide etch solution. Thus, the first and the second mold layers 85 and 86 are etched, and the first mold layer 85 having a high wet etch rate is etched relatively faster than the second mold layer 86 having a low wet etch rate. The widened first open region is represented by a reference numeral '89A'.

Figure 10D:
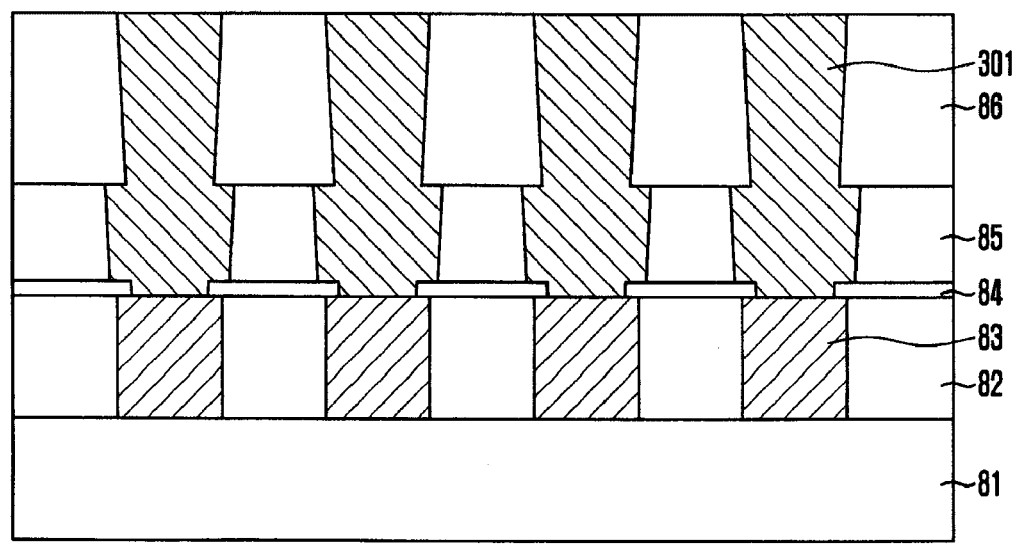

Referring to FIG. 10D, after depositing a first conductive layer to be used as a storage node on the second mold layer 86 until the first open region 89A is filled, a first storage node isolation process is performed. The first conductive layer includes one of a metallic nitride layer, a metal layer, and a combination thereof. For instance, the first conductive layer includes one of TiN, Ru, TaN, WN, Pt, Ir, and a combination thereof. Preferably, the first conductive layer is deposited using a CVD method or an ALD method to have a thickness of 200 Å to 900 Å and fills up the first open region 89A without an empty space.

As described above, after depositing the first conductive layer, the first storage node isolation process is performed using a dry etch-back or CMP process. The first storage node isolation process is performed until a top surface of the second mold layer 86 is exposed, so that a first storage node 301 is formed to have a pillar shape buried in the first open region 89A. That is, through the CMP or dry etch-back process, there is removed the first conductive layer on the second mold layer 86 deviated from the first open region 89A. Thus, the first storage node 301 is formed to fill the inside of the first open region 89A.

Since the first storage node 301 has a shape filling the inside of the first open region 89A, the first storage node 301 is formed as a pillar structure. First storage nodes adjacent to each other are insulated by the first and the second mold layers 85 and 86. The first storage node 301 may have an upper portion whose slope is larger than that of a lower portion.

Figure 10E:
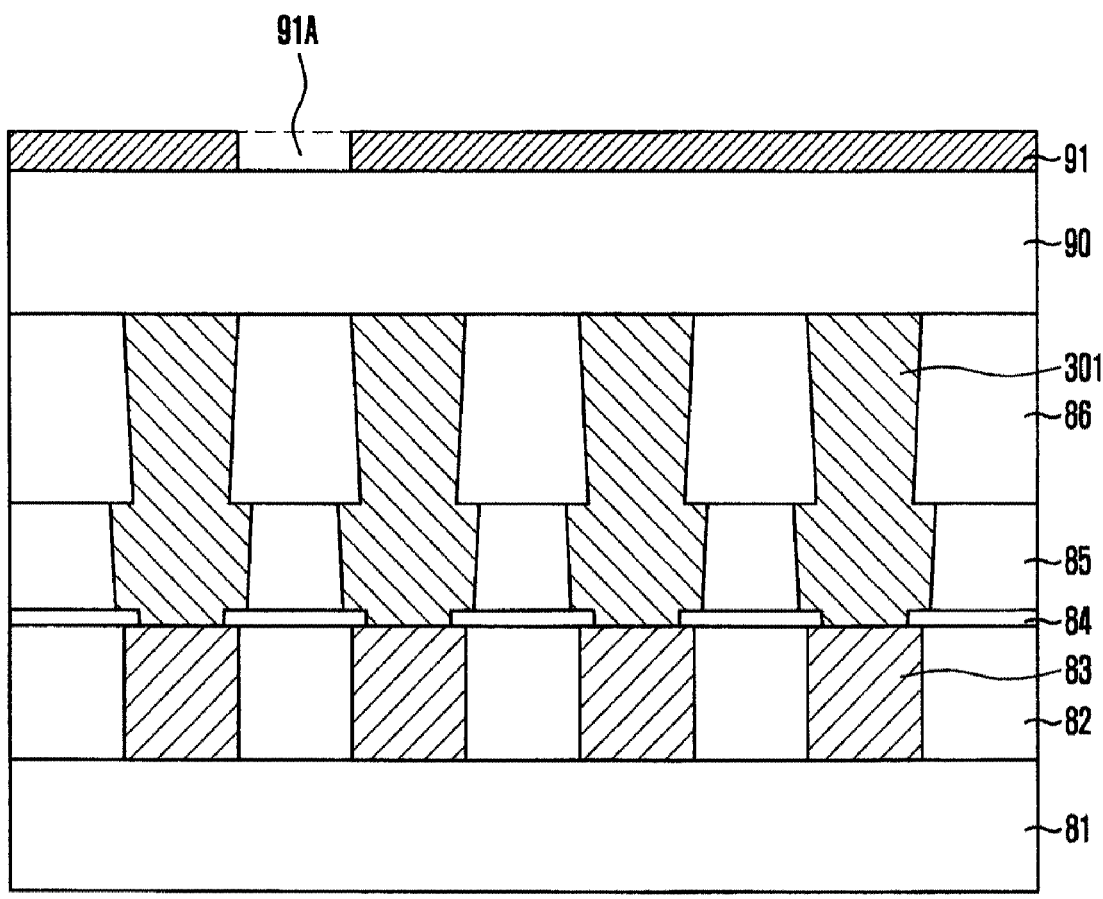

Referring to FIG. 10E, a third mold layer 90 is formed on the second mold layer 86 and the first storage node 301. The third mold layer 90 may include an insulation layer and, preferably, include an oxide layer. The third mold layer 90 may include an oxide layer such as BPSG, SOD, PSG, LPTEOS or PETEOS. A thickness of the third mold layer 90 may be in a range of 2,000 Å to 20,000 Å. Herein, the third mold layer 90 may have a thickness that is substantially the same as that of the second mold layer 86, or larger than or smaller than that of the second mold layer 86.

Then, a support layer 91 is formed on the third mold layer 90. The support layer 91 is formed to prevent the storage node from being leaned in a subsequent wet dip out process and includes a nitride layer. The support layer 91 may have a thickness of 200 Å to 1,000 Å and may be formed of an undoped polysilicon layer.

An opening 91A is formed by partially etching the support layer 91, wherein the opening 91A becomes a path through which a wet chemical infiltrates. The opening 91A corresponds to a component described as an opening in the above-described embodiments.

Figure 10F:
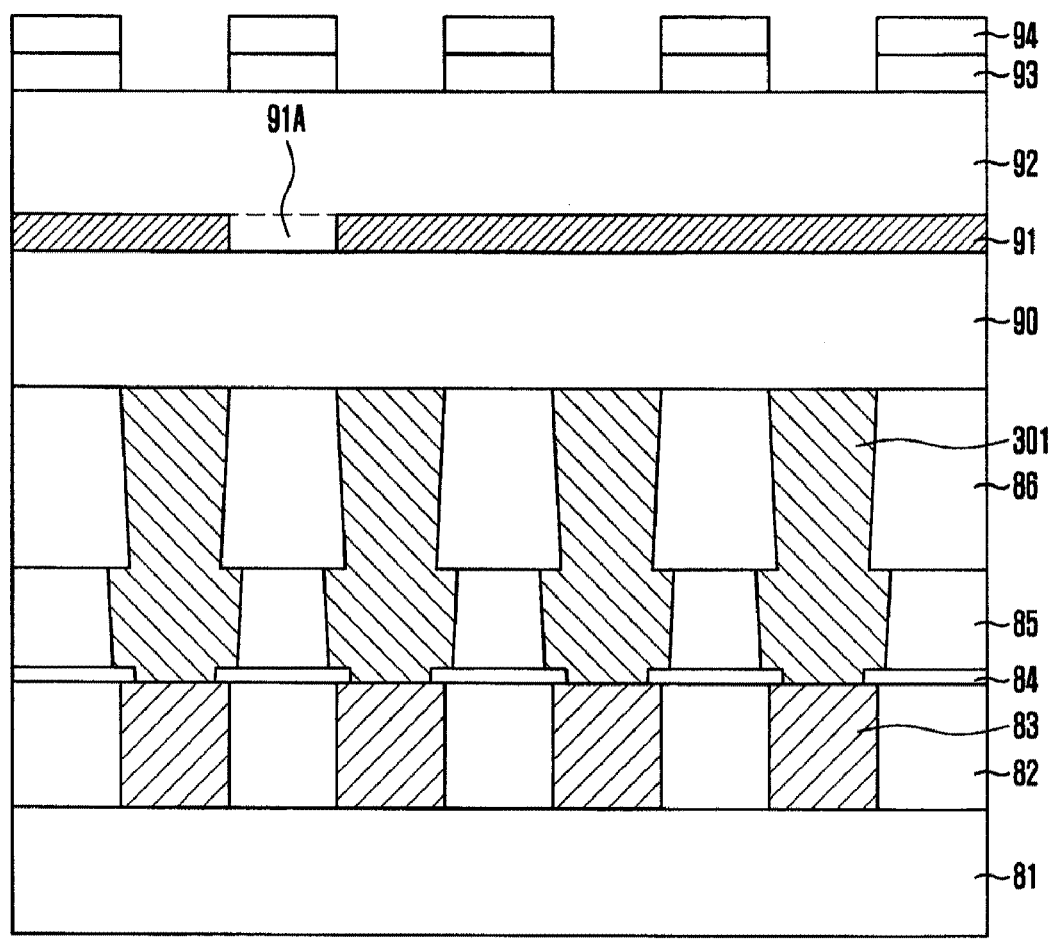

Referring to FIG. 10F, a fourth mold layer 92 is formed on the support layer 91 where the opening 91A is formed. The fourth mold layer 92 may include an oxide layer such as TEOS, BPSG, PSG, USG, SOD, or HDP.

Then, a second photoresist pattern 94 is formed by coating photoresist on the fourth mold layer 92 and patterning the photoresist through an exposure and development process. Herein, the second photoresist pattern 94 defines an open region where a second storage node is to be formed. Prior to forming the second photoresist pattern 94, a second hard mask layer 93 may be formed of an amorphous carbon layer or a polysilicon layer on the fourth mold layer 92 and an anti-reflective coating layer (not shown) may be formed on the second hard mask layer 93.

Subsequently, the second hard mask layer 93 is etched using the second photoresist pattern 94 as an etch barrier.

Figure 10G:
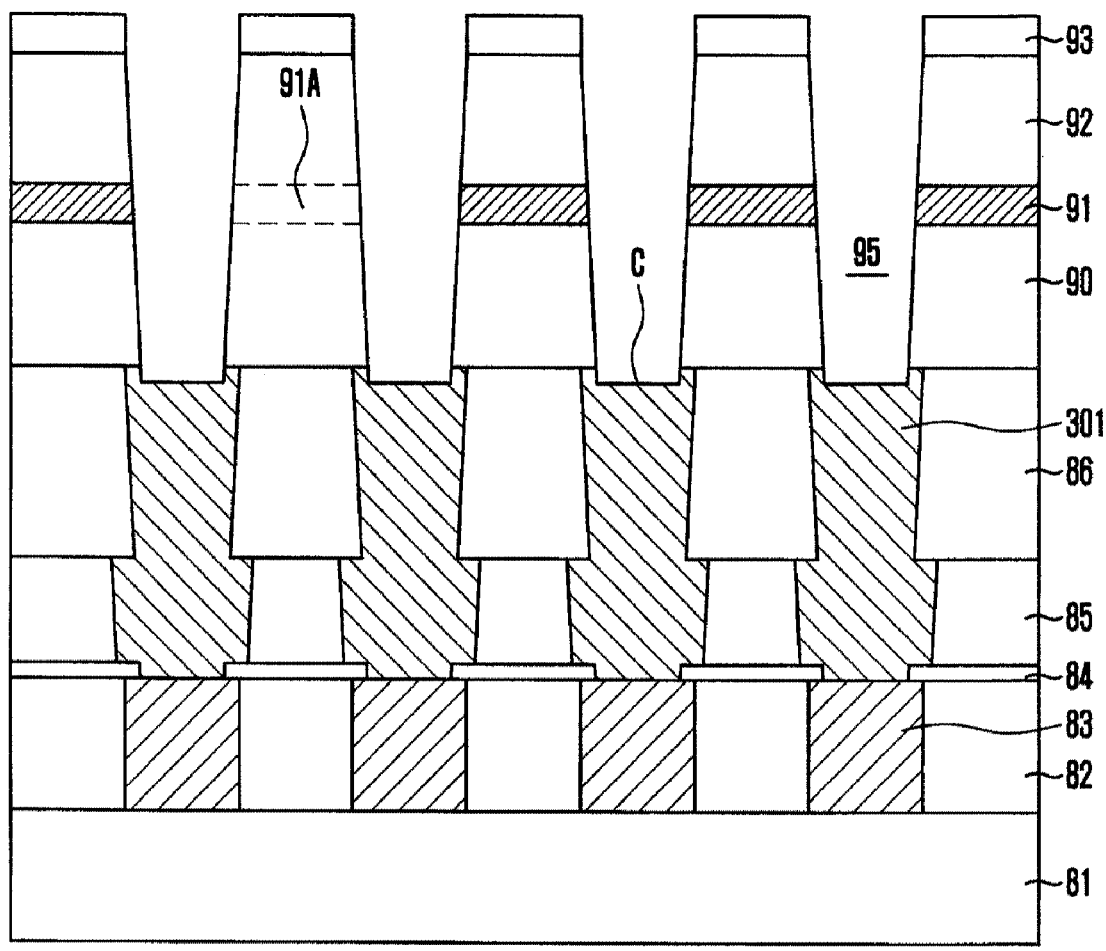

Referring to FIG. 10G, after removing the second photoresist pattern 94, the fourth mold layer 92, the support layer 91 and the third mold layer 90 are etched using the second hard mask layer 93 as an etch barrier. As a result, a plurality of second open regions 95 are formed. Then, a top surface of the first storage node 301 is exposed by the second open regions 95. The second open regions 95 may have substantially the same size and shape as those of the first open regions 89.

The second open regions 95 are hole shaped regions where the second storage node is to be buried. Thus, they are referred to as storage node holes. In case of dry-etching the third and the fourth mold layers 90, 92, the support layer 91, and a sidewall of the second open region 95 may have a slope of 89° to 89.9°. Thus, the second open region 95 has a bottom CD that is smaller than a top CD thereof. When performing a dry-etching process to form the second open region 95, the first storage node 301 is over-etched to form a groove C in a top surface thereof.

Meanwhile, since the support layer does not exist in the opening 91A formed in the support layer 91, the etching process is not performed on the opening 91A. In a region separated from the opening 91A, the support layer 91 is etched and the third mold layer 90 disposed under the support layer 91 is etched.

Figure 10H:
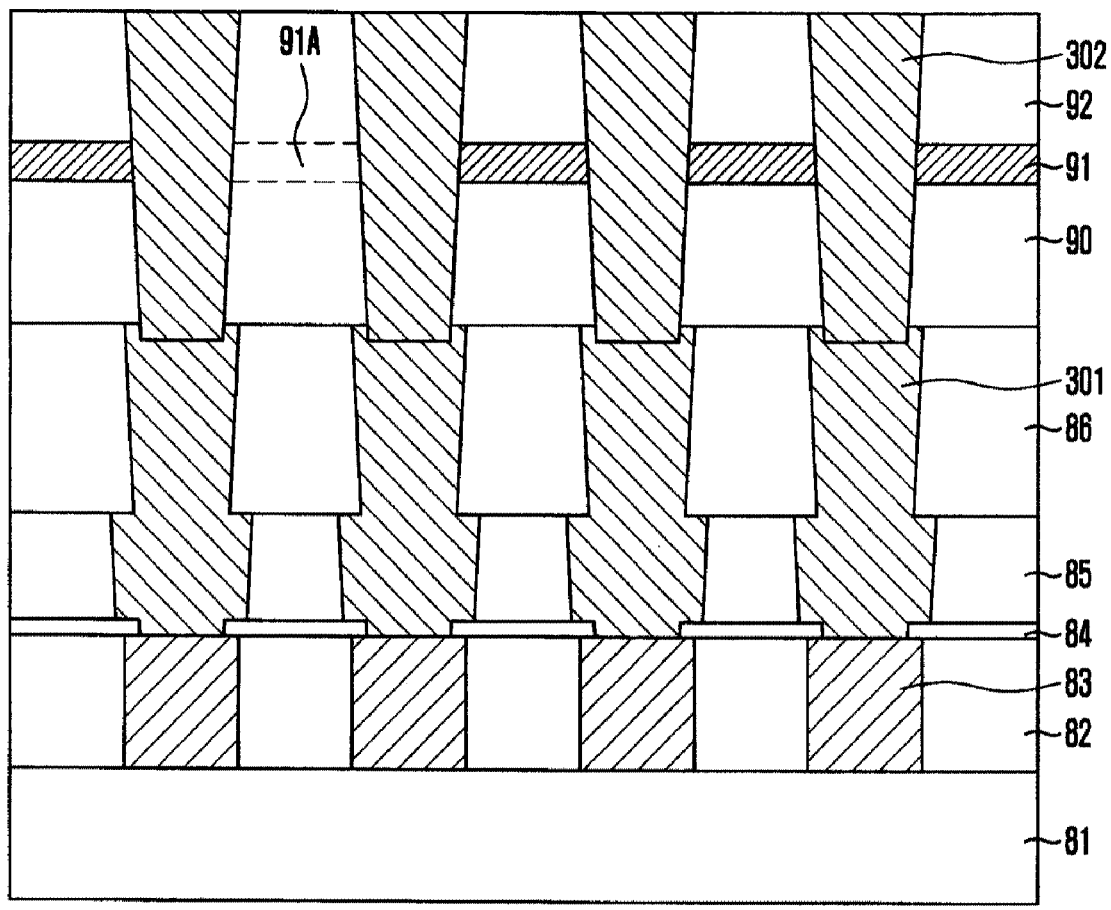

Referring to FIG. 10H, after removing the second hard mask layer 93, a second conductive layer to be used as a storage node is deposited on a whole surface of a resultant structure where the second hard mask layer 93 is removed until the second open region 95 is filled. Then, a pillar type second storage node 302 filling the second open region 95 is formed by performing a second storage node isolation process. The second conductive layer to be the second storage node 302 includes one of a metallic nitride layer, a metal layer, and a combination thereof. For instance, the second conductive layer includes one of TiN, Ru, TaN, WN, Pt, Ir, and a combination thereof. The second conductive layer is deposited using a CVD method or an ALD method to have, for example, a thickness of 200 Å to 900 Å and fills up the second open region 95 without an empty space. In the second storage node isolation process, a dry etch-back or CMP process is used.

Since the second storage node 302 has a shape filling the inside of the second open region 95, the second storage node 302 is formed as a pillar structure. Second storage nodes adjacent to each other are insulated by the third and the fourth mold layers 90 and 92. Since the second open region 95 has a slope of a bottom CD being smaller than a top CD, the shape of the second open region 95 is transferred into the second storage node 302. Thus, the second storage node 302 has a shape of a bottom CD smaller than a top CD. Since a lower portion of the second storage node 302 is disposed on the groove C formed in a top surface of the first storage node 301, the first storage node 301 and the second storage node 302 are in firm contact with each other.

As described above, referring to a result of the second storage node 302 being formed, a storage node having a two-layered pillar structure is formed by stacking the first storage node 301 and the second storage node 302.

Figure 10I:
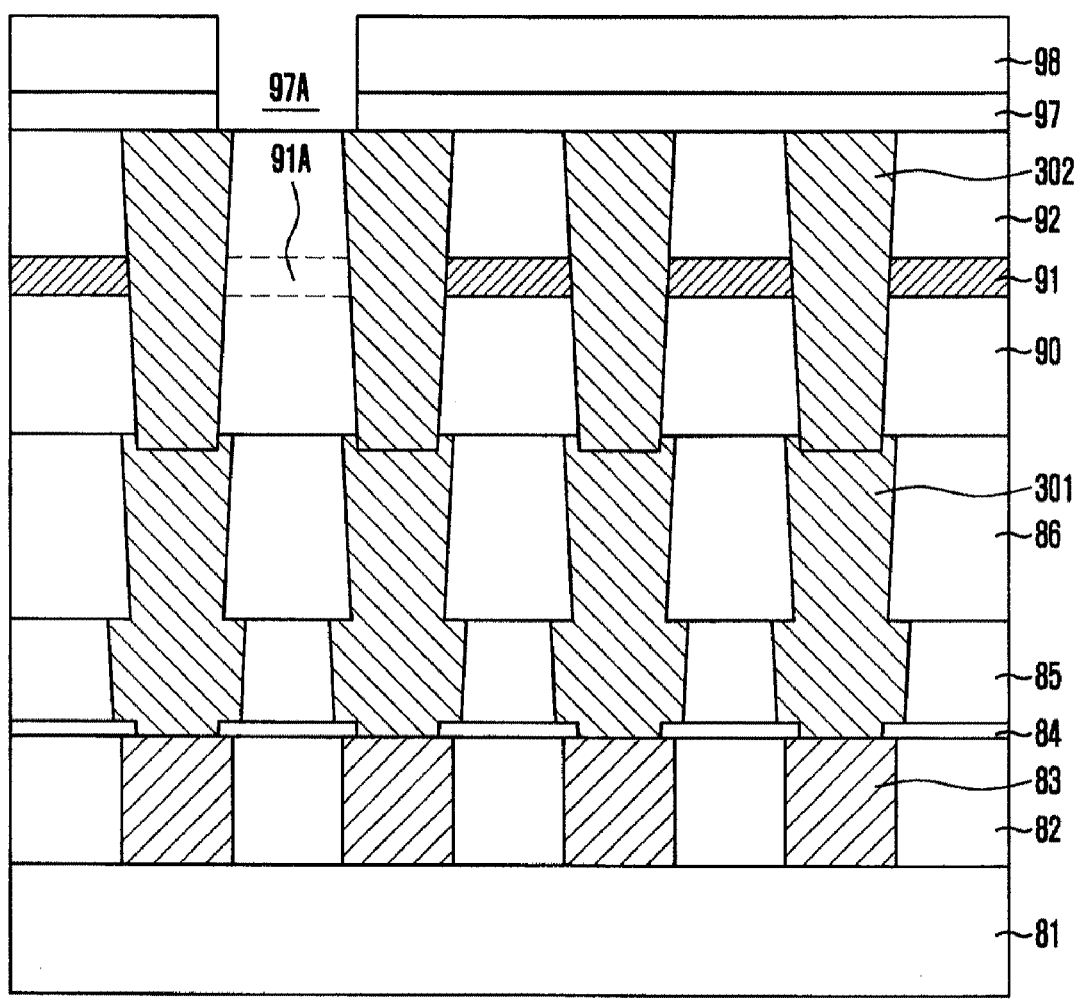

Referring to FIG. 10I, after forming a sacrificial layer 97 on a whole surface of a resultant structure formed as a result of processes illustrated in FIG. 10H, a third photoresist pattern 98 is formed. The sacrificial layer 97 may include an oxide layer.

A portion of the sacrificial layer 97 is etched using the third photoresist pattern 98 as an etch barrier. As described above, by etching the portion of the sacrificial layer 97, a path 97A through which a wet etch solution infiltrates is formed when performing a subsequent wet dip out process. The path 97A formed in the sacrificial layer 97 has a shape corresponding to the opening 91A formed in the support layer 91.

The forming of the sacrificial layer 97 and the third photoresist pattern 98 may be omitted. That is, in one or more embodiments, the wet dip out process is directly performed to etch the mold layers without employing the sacrificial layer 97 and the third photoresist pattern 98.

Figure 10J:
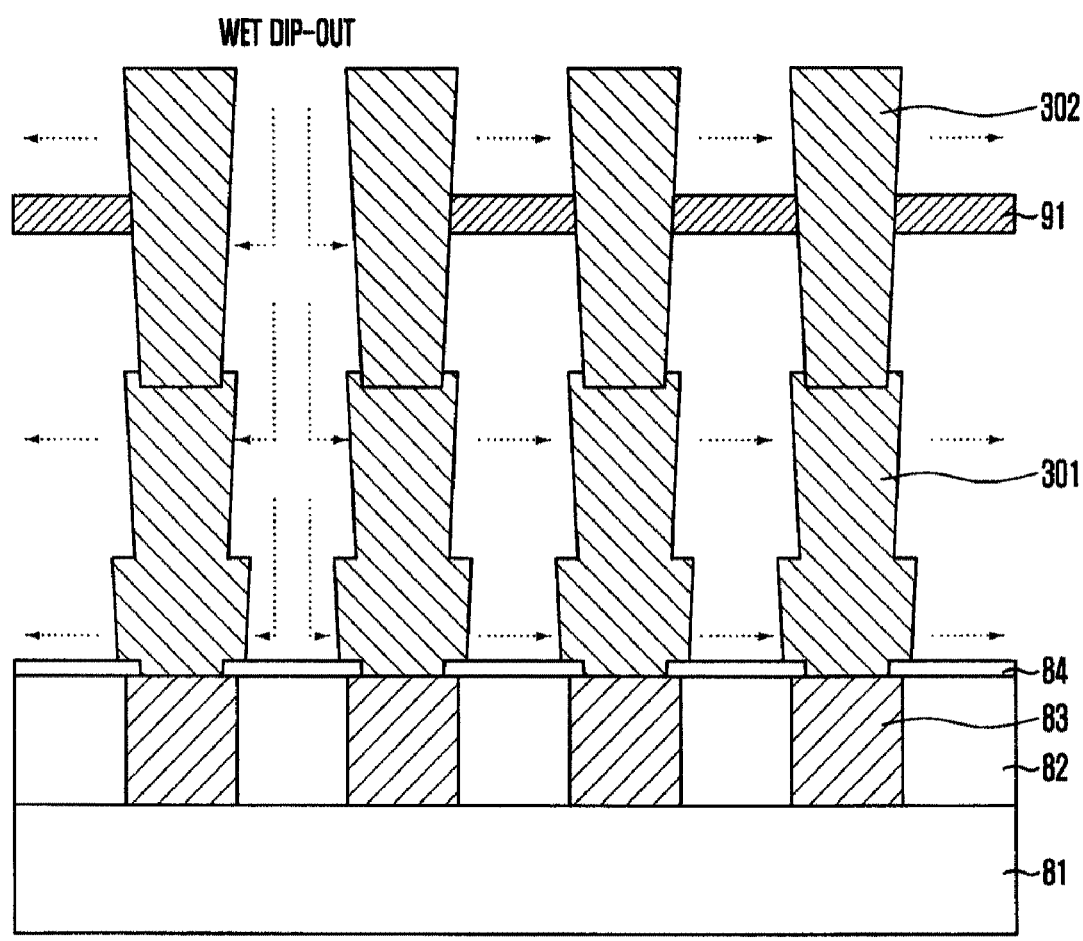

Referring to FIG. 10J, all of the mold layers are removed by performing the wet dip out process. Since the first to the fourth mold layers 85, 86, 90, and 92 are formed of an oxide layer, the wet dip out process may be performed using a wet chemical such as a HF or BOE solution. The wet chemical infiltrates through the path 97A formed in the sacrificial layer 97 and etches the fourth mold layer 92. Then, the wet chemical infiltrates through the opening 91A of the support layer 91 and etches the first to the third mold layers 85, 86, and 90.

When performing the wet dip out process, the support layer 91 is not etched and remains to firmly fix the multi-layered storage node, so that the multi-layered storage node does not lean. Moreover, since a shape of the storage node has a multi-layered, pillar structure, the storage node does not lean in the wet dip out process. The wet chemical does not infiltrate into a structure under the storage node since the etch stop layer 84 blocks the flow of the wet chemical.

Figure 10K:
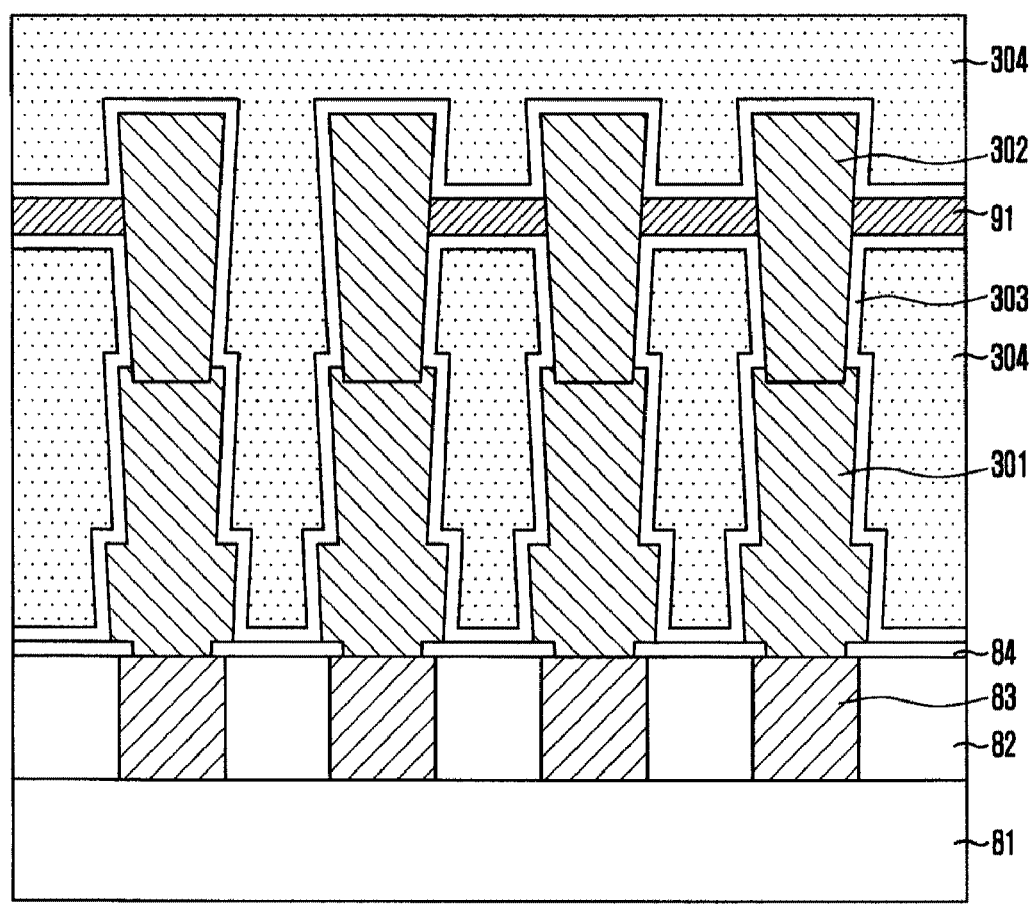

Referring to FIG. 10K, a dielectric layer 303 and a plate electrode 304 are formed. Since it is possible to sufficiently supply a source gas and a reaction gas through the opening 91A provided by the support layer 91, the dielectric layer 303 and the plate electrode 304 may be more easily formed. Moreover, since the support layer 91 is formed in a middle portion of the second storage node 302, it is possible to uniformly deposit the dielectric layer 303 and the plate electrode 304 without voids.

Figure 11:
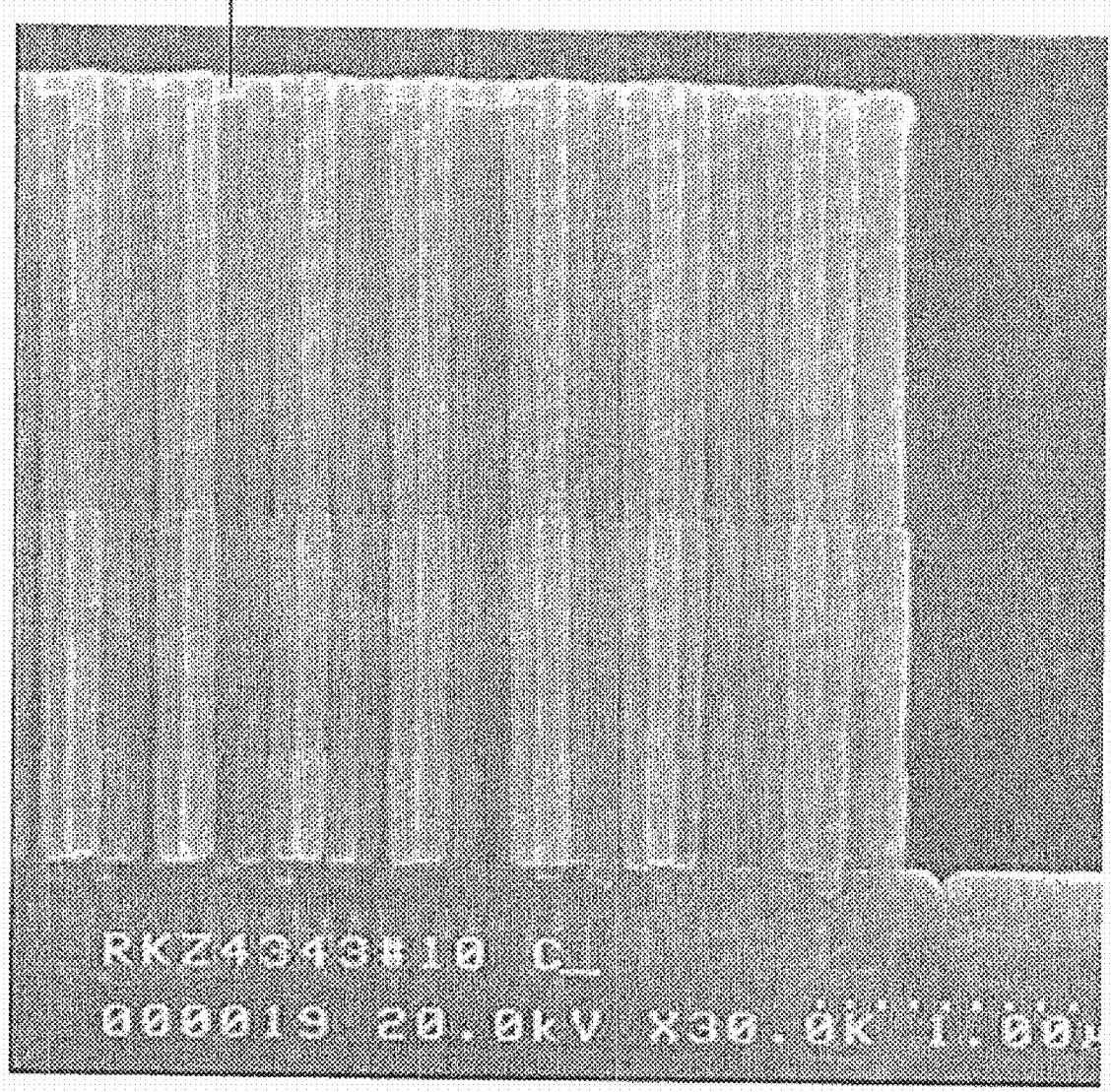
FIG. 11 is an image of a multi-layered, pillar type storage node in accordance with one or more embodiments.

FIG. 11 is an image of a multi-layered, pillar type storage node in accordance with one or more embodiments. The storage nodes are not caused to lean by the support layer 51 supporting the storage nodes after the wet dip out process is performed.

In the above-described embodiments, there are described methods for fabricating two-layered pillar type storage nodes. However, it is possible to form a 3 or more-layered pillar type storage node structure by repeatedly performing the deposition and etch process of the mold layer.

In accordance with one or more embodiments, since the pillar type storage node is formed in a multi-layered structure by performing the deposition and the etch processes of the mold layer 2 or more times, it is possible to sufficiently secure the desired capacitance and to prevent adjacent storage nodes from leaning.

Therefore, in a giga class DRAM product line employing a miniaturized metal line process having a design rule of less than 50 nm, it is possible to prevent the leaning of the storage node having a circular or elliptical shape and to secure a charge capacitance of more than 25 fF/cell. As a result, the refresh performance required in the operation of associated products is accomplished in a stable manner and thus the reliability and yield of the products may be enhanced.

While embodiments have been described, it will be apparent to those skilled in the art that various changes and modifications may be made.

What is claimed is:

1. A method of fabricating a semiconductor device, the method comprising: forming a plurality of multi-layered pillar type storage nodes each of which is buried in a plurality of mold layers, wherein uppermost layers of the multi-layered pillar type storage nodes are fixed by a support layer; etching a portion of the support layer to form an opening; and supplying an etch solution through the opening to remove the plurality of mold layers, wherein each multi-layered pillar type storage node is formed of at least two stacked pillars.

2. The method of claim 1, wherein the plurality of multi-layered pillar type storage nodes are formed by:
   forming a first mold layer;
   etching the first mold layer to form a first open region;
   forming a first pillar type storage node buried in the first open region;
   forming a second mold layer and a support layer over the first mold layer;
   etching the support layer and the second mold layer to form a second open region; and
   forming a second pillar type storage node buried in the second open region and connected with the first storage node.

3. The method of claim 2, wherein, when forming the second open region, a groove is formed in a top surface of the first pillar type storage node.

4. The method of claim 2, wherein a bottom line width of the second open region is smaller than a top line width of the first pillar type storage node.

5. The method of claim 2, wherein the first and the second pillar type storage nodes are formed by filling up the first and the second open regions with conductive layers and performing a planarization process on the conductive layers.

6. The method of claim 5, wherein the conductive layer comprises a metallic nitride layer or a metal layer.

7. The method of claim 1, wherein the plurality of multi-layered pillar type storage nodes are formed by:
   forming a first mold layer;
   forming a second mold layer over the first mold layer, wherein a wet etch rate of the second mold layer is lower than a wet etch rate of the first mold layer;
   etching the first mold layer and the second mold layer to form a first open region;
   widening the first open region through a wet-etch process;
   forming a first pillar type storage node buried in the widened first open region;
   forming a third mold layer and a support layer over the first pillar type storage node;
   etching the support layer and the third mold layer to form a second open region; and
   forming a second pillar type storage node buried in the second open region and connected with the first storage node.

8. The method of claim 7, wherein the first mold layer comprises one of boro phosphorous silicate glass (BPSG), spin on dielectric (SOD) and phosphorous silicate glass (PSG), and the second mold layer comprises low pressure tetra ethyl ortho silicate (LPTEOS) or plasma enhanced tetra ethyl ortho silicate (PETEOS).

9. The method of claim 1, wherein the opening is formed by:
   forming a sacrificial layer over a whole surface of a resultant structure including the second pillar type storage node;
   forming a photoresist pattern where an opening is defined over the sacrificial layer; and
   etching the sacrificial layer and the support layer using the photoresist pattern as an etch barrier.

10. The method of claim 1, wherein the mold layers comprise an oxide layer and the support layer comprises a nitride layer or an undoped polysilicon layer.

11. The method of claim 1, wherein removing the mold layers includes a wet dip out process.

12. The method of claim 1, wherein the plurality of multi-layered pillar type storage nodes are formed by:
    forming an insulation layer;
    etching the insulation layer to form an open region;
    forming a pillar type storage node buried in the open region;
    repeatedly forming the insulation layer, the open region, and the pillar type storage node 2 or more times, thereby forming the multi-layered pillar type storage node.

13. A method of fabricating a semiconductor device, the method comprising:
    forming a first mold layer over a substrate;
    etching the first mold layer to form a first open region;
    forming a first pillar type storage node buried in the first open region;
    forming a support layer including an opening over the first mold layer and the first pillar type storage node, wherein the opening acts as a path through which an etch solution infiltrates;
    forming a second mold layer over the support layer;
    etching the second mold layer and the support layer to form a second open region exposing a top surface of the first pillar type storage node;
    forming a second pillar type storage node buried in the second open region; and
    supplying an etch solution to remove the first and the second mold layers.

14. The method of claim 13, before forming the support layer, further comprising:
    forming an additional mold layer over the first mold layer where the first pillar type storage node is formed.

15. The method of claim 13, wherein the first open region is formed by:
    forming a first oxide layer;

forming a second oxide layer over the first oxide layer, wherein an wet etch rate of the second oxide layer is lower than a wet etch rate of the first oxide layer;

etching the first and the second oxide layers to form a first open region; and widening the first open region through a wet etch process.

16. The method of claim 15, wherein the first oxide layer comprises one of BPSG, SOD, and PSG, and the second oxide layer comprises one of LPTEOS and PETEOS.

17. The method of claim 13, wherein, when forming the second open region, a groove is formed in a top surface of the first pillar type storage node.

18. The method of claim 13, wherein a bottom line width of the second open region is smaller than a top line width of the first pillar type storage node.

19. The method of claim 13, wherein the first and the second mold layers comprise an oxide layer and the support layer comprises a nitride layer.

20. The method of claim 13, wherein the first and the second mold layers comprise an oxide layer and the support layer comprises an undoped polysilicon layer.

21. The method of claim 13, wherein removing the first and the second mold layers includes a wet dip out process.

22. The method of claim 13, wherein the opening is formed by etching the support layer using a photoresist pattern where the opening is defined as an etch barrier.

23. The method of claim 13, wherein the first and the second pillar type storage nodes are formed by filling up the first and the second open regions with conductive layers and performing a planarization process on the conductive layers.

24. The method of claim 23, wherein the conductive layer comprises a metallic nitride layer or a metal layer.

25. A semiconductor device, comprising: a plurality of multi-layered pillar type storage nodes; a support layer supporting each of the plurality of storage nodes and partially providing openings to regions between the plurality of storage nodes, wherein the support layer has an integral structure; a dielectric layer covering the plurality of storage nodes and the support layer; and a plate electrode formed over the dielectric layer, wherein each multi-layered pillar type storage node is formed of at least two stacked pillars.

26. The semiconductor device of claim 25, wherein the support layer comprises an insulation layer.

27. The semiconductor device of claim 25, wherein the support layer comprises a nitride layer or an undoped polysilicon layer.

28. The semiconductor device of claim 25, wherein the plurality of multi-layered pillar type storage nodes form a zigzag array.

29. The semiconductor device of claim 25, wherein, in the multi-layered structure of the pillar type storage node, a top line width of a lower layer of the pillar type storage node is larger than a bottom line width of an upper layer of the pillar type storage node.

30. The semiconductor device of claim 29, wherein a groove is formed in a top surface of the lower layer of the pillar type storage node and a lower portion of the upper layer of the pillar type storage node is disposed on the groove.

31. The semiconductor device of claim 25, wherein the support layer supports uppermost layers of the multi-layered pillar type storage nodes.

32. The semiconductor device of claim 31, wherein the support layer supports the upper portions or middle portions of the uppermost layers of the multi-layered pillar type storage nodes.

33. A semiconductor device, comprising: a plurality of multi-layered pillar type storage nodes, the plurality of multi-layered pillar type storage nodes including uppermost layers; and a support layer having an integral structure, the support layer providing support to the uppermost layers of the plurality of multi-layered pillar type storage nodes, the support layer having an opening to regions between the plurality of multi-layered pillar type storage nodes, wherein each multi-layered pillar type storage node is formed of at least two stacked pillars.

34. The semiconductor device of claim 33, wherein the support layer supports an upper portion of the uppermost layers of the plurality of multi-layered pillar type storage nodes.

35. The semiconductor device of claim 34, wherein an upper surface of the support layer and an upper surface of the uppermost layers of the plurality of multi-layered pillar type storage nodes form a plane.

36. The semiconductor device of claim 33, wherein the support layer supports a middle portion of the uppermost layers of the plurality of multi-layered pillar type storage nodes.

* * * * *